(12) United States Patent
Lefebvre et al.

(10) Patent No.: US 12,114,515 B2
(45) Date of Patent: Oct. 8, 2024

(54) THIN FILM TRANSISTORS COMPRISING CARBON NANOTUBE NETWORKS ENCAPSULATED BY A POLYMERIC LAYER AND METHODS FOR THE MANUFACTURE THEREOF

(71) Applicant: National Research Council of Canada, Ottawa (CA)

(72) Inventors: Jacques Lefebvre, Stoneham-et-Tewkesbury (CA); Francois Lapointe, Gatineau (CA); Zhao Li, Ottawa (CA); Jianfu Ding, Ottawa (CA); Patrick Roland Lucien Malenfant, Ottawa (CA)

(73) Assignee: National Research Council of Canada, Ottawa (CA)

( * ) Notice: Subject to any disclaimer, the term of this patent is extended or adjusted under 35 U.S.C. 154(b) by 461 days.

(21) Appl. No.: 17/312,678

(22) PCT Filed: Dec. 17, 2019

(86) PCT No.: PCT/CA2019/051838
§ 371 (c)(1),
(2) Date: Jun. 10, 2021

(87) PCT Pub. No.: WO2020/124225
PCT Pub. Date: Jun. 25, 2020

(65) Prior Publication Data
US 2022/0069243 A1    Mar. 3, 2022

Related U.S. Application Data

(60) Provisional application No. 62/783,627, filed on Dec. 21, 2018, provisional application No. 62/891,672, (Continued)

(51) Int. Cl.
H10K 10/46     (2023.01)
H10K 71/12     (2023.01)
H10K 85/20     (2023.01)

(52) U.S. Cl.
CPC .......... *H10K 10/484* (2023.02); *H10K 71/12* (2023.02); *H10K 85/221* (2023.02)

(58) Field of Classification Search
CPC ..... H10K 10/484; H10K 85/221; H10K 71/12
See application file for complete search history.

(56) References Cited

U.S. PATENT DOCUMENTS 7,956,525 B2   6/2011   Armitage
9,620,728 B2   4/2017   Du et al.
(Continued)

FOREIGN PATENT DOCUMENTS

CN   101415715 A   4/2009
CN   102177598 B   5/2014
(Continued)

OTHER PUBLICATIONS

Avouris, P. Molecular Electronics with Carbon Nanotubes. Acc. Chem. Res. 2002, 35, 1026.
(Continued)

*Primary Examiner* — Marc Anthony Armand
(74) *Attorney, Agent, or Firm* — BERESKIN & PARR LLP/S.E.N.C.R.L., s.r.l.; Michael Fenwick

(57) ABSTRACT

The present application relates to thin film transistors having a semiconducting channel comprising a network of carbon nanotubes that are electrically coupled to a source electrode and a drain electrode and electrically insulated from, but capacitively coupled to, a gate electrode, wherein a polymeric layer encapsulates the carbon nanotubes. The polymeric layer can comprise a first monomeric unit and optionally a second monomeric unit, wherein the first monomeric (Continued)

unit, the second monomeric unit and the relative amounts thereof are optionally selected to provide at least one target electrical property of the thin film transistor. The present application also relates to methods for manufacturing such thin film transistors as well as a methods of selecting a polymeric layer to provide a desired threshold voltage for such thin film transistors.

23 Claims, 25 Drawing Sheets

Related U.S. Application Data filed on Aug. 26, 2019, provisional application No. 62/892,019, filed on Aug. 27, 2019.

(56) References Cited

U.S. PATENT DOCUMENTS

| | | | |
|---|---|---|---|
| 10,046,970 B2 | 8/2018 | Ding et al. | |
| 2005/0129573 A1 | 6/2005 | Gabriel et al. | |
| 2006/0214192 A1 | 9/2006 | Nanai | |
| 2007/0102747 A1 | 5/2007 | Chen et al. | |
| 2008/0099842 A1* | 5/2008 | Gyoujin | H01L 29/0665 977/750 |
| 2011/0240980 A1 | 10/2011 | Wei et al. | |
| 2011/0248267 A1 | 10/2011 | Wei et al. | |
| 2015/0214496 A1* | 7/2015 | Du | H10K 85/221 257/29 |
| 2018/0309074 A1 | 10/2018 | Mao | |

FOREIGN PATENT DOCUMENTS

| | | | |
|---|---|---|---|
| CN | 111788527 | * 10/2020 | G03F 7/028 |
| JP | 2009064953 | 3/2009 | |
| TW | 201239989 A | 10/2012 | |
| WO | WO2017/117646 A1 | 7/2017 | |

OTHER PUBLICATIONS

Cao, Q. Rogers, J. A. Ultrathin Films of Single-Walled Carbon Nanotubes for Electronics and Sensors: A Review of Fundamental and Applied Aspects. Adv. Mater. 2009, 21, 29.

Hu, L. Hecht, D. S. Gruner, G. Carbon Nanotube Thin Films: Fabrication, Properties, and Applications. Chem. Rev. 2010, 110, 5790.

Noorden, R. V. The Trials of New Carbon. Nature 2011, 469, 14.

Wang, C. Takei, K. Takahashi, T. Javey, A. Carbon Nanotube Electronics—Moving Forward. Chem. Soc. Rev. 2013, 42, 2592.

De Voider, M. F. L. Tawfick, S. H. Baughman,R. H. Hart, A. J. Carbon Nanotubes: Present and Future Commercial Applications. Science 2013, 339, 535.

Zhang, Q. Huang, J.-Q. Qian, W.-Z. Zhang, Y.-Y. Wei, F. The Road for Nanomaterials Industry: A Review of Carbon Nanotube Production, Post-Treatment, and Bulk Applications for Composites and Energy Storage. Small 2013, 9, 1237.

Peng, L.-M. Zhang, Z. Wang, S. Carbon Nanotube Electronics: Recent Advances. Mater. Today, 2014, 17, 434.

Zhang, H. Wu, B. Hu, W. Liu, Y. Separation and/or Selective Enrichment of Single-Walled Carbon Nanotubes Based on Their Electronic Properties. Chem. Soc. Rev., 2011,40,1324.

Lu, F. Meziani, M. J. Cao, L. Sun, Y.-P. Separated Metallic and Semiconducting Single-Walled Carbon Nanotubes: Opportunities in Transparent Electrodes and Beyond. Langmuir 2011, 27, 4339.

Fujigaya, T. Nakashima, N. Non-convalent Polymer Wrapping of Carbon Nanotubes and the Role of Wrapped Polymers as Functional Dispersants. Sci. Technol. Adv. Mater. 2015, 16, 024802.

Wang, H, Bao, Z. Conjugated Polymer Sorting of Semiconducting Carbon Nanotubes and Their Electronic Applications. Nano Today, 2015, 10, 737.

Lefebvre, J. Ding, J. Li, Z. Finnie, P. Lopinski, G. Malenfant, P. R. L. High-Purity Semiconducting Single-Walled Carbon Nanotubes: A Key Enable Material in Emerging Electronics. Acc. Chem. Res. 2017, 50, 2479.

Tulevski, G. S. Franklin, A. D. Frank, D. Lobez, J. M. Cao, Q. Park, H. Afzali, Han, A. S.-J. Hannon, J. B. Haensch, W. Toward High-Performance Digital Logic Technology with Carbon Nanotubes. ACS Nano, 2014, 8, 8730.

Shulaker, M. M. Hills, G. Patil, N. Wei, H. Chen, H.-Y. Wong, H.-S. P. Mitra, S. Carbon Nanotube Computer. Nature 2013, 501, 526.

Sun, D.-M. Liu, C. Ren, W.-C. Cheng, H.-M. A Review of Carbon Nanotube- and Graphene-Based Flexible Thin-Film Transistors. Small 2013, 9, 1188.

Qiu, S. Wu, K. Gao, B. Li, L. Jin, H. Li, Q. Solution-Processing of High-Purity Semiconducting Single-Walled Carbon Nanotubes for Electronic Devices. Adv. Mater. 2018, 1800750.

Cao, Y. Cong, S. Cao, X. Wu, F. Liu, Q. Amer, M. R. Zhou, C. Review of Electronics Based on Single-Walled Carbon Nanotubes. Top. Curr. Chem (Z), 2017, 375, 75.

Zaumseil, J. Single-Walled Carbon Nanotube Networks for Flexible and Printed Electronics. Semicond. Sci. Technol. 2015, 30, 074001.

Jianfu Ding, Zhao Li, Jacques Lefebvre, Fuyong Cheng, Girjesh Dubey, Shan Zou, Paul Finnie, Amy Hrdina, Ludmila Socles, Gregory P. Lopinski, Christopher T. Kingston, Benoit Simard, Patrick R. L. Malenfant, "Enrichment of large-diameter semiconducting SWCNTs by polyfluorene extraction for high network density thin film transistors", Nanoscale, 2014, 6, 2328-2339.

Jianfu Ding, Zhao Li, Jacques Lefebvre, Fuyong Cheng, Jeffrey L. Dunford, Patrick R. L. Malenfant, Jefford Humes, Jens Kroeger, "A hybrid enrichment process combining conjugated polymer extraction and silica gel adsorption for high purity semiconducting single-walled carbon nanotubes (SWCNT)", Nanoscale, 2015, 7, 15741.

Kim, K. K. Kim, S. M. Lee, Y. H. Chemically Conjugated Carbon Nanotubes and Graphene for Carrier Modulation. Acc. Chem. Res. 2016, 49, 390.

Kim, W. Javey, A. Vermesh, O. Wang, Q. Li, Y. Dai, H. Hysteresis Caused by Water Molecules in Carbon Nanotube Field-Effect Transistors. Nano letters, 2003, 3, 2, 193.

Heinze, S. et al. Carbon Nanotubes as Schottky Barrier Transistors. Phys. Rev. Lett. 89, 106801 (2002).

Moriyama, N., Ohno, Y., Kitamura, T., Kishimoto, S. & Mizutani, T. Change in carrier type in high-k gate carbon nanotube field-effect transistors by interface fixed charges. Nanotechnology 21, 165201 (2010).

Aguirre, C. M. et al. The Role of the Oxygen/Water Redox Couple in Suppressing Electron Conduction in Field-Effect Transistors. Adv. Mater. 21, 3087-3091 (2009).

Ha, T.-J. et al. Highly Uniform and Stable n-Type Carbon Nanotube Transistors by Using Positively Charged Silicon Nitride Thin Films. Nano Lett. 15, 392-397 (2015).

Kobayashi, S. et al. Control of carrier density by self-assembled monolayers in organic field-effect transistors. Nat. Mater. 3, 317-322 (2004).

Lefebvre, J. et al. Hysteresis free carbon nanotube thin film transistors comprising hydrophobic dielectrics. Appl. Phys. Lett. 107, 243301 (2015).

Lee, S.-H et al. Effect of Polymer Gate Dielectrics on Charge Transport in Carbon Nanotube Network Transistors: Low-k Insulator for Favorable Active Interface. ACS Appl. Mater. Interfaces 8, 32421-32431 (2016).

Ha, T. J., Kiriya, D., Chen, K. & Javey, A. Highly stable hysteresis-free carbon nanotube thin-film transistors by fluorocarbon polymer encapsulation. ACS Appl. Mater. Interfaces 6, 8441-8446 (2014).

Selvarasah, S., Li, X., Busnaina, A. & Dokmeci, M. R. Parylene-C passivated carbon nanotube flexible transistors. Appl. Rhys. Lett. 97, 15-18(2010).

Mingxing Piaoa,Junhong Naa,Jaewan Choia,Jaesung Kima,GaryP. Kennedya, Gyutae Kima,Siegmar Rotha, UrszulaDettlaff-Weglikowska. Increasing the thermoelectric power generated by composite films using chemically functionalized single-walled carbon nanotubes. Carbon 62:430-437, 2013.

(56) References Cited

OTHER PUBLICATIONS

Zhou, Y. etal. p-Channel, n-channel thin film transistors and p-n diodes based on single wall carbon nanotube networks. Nano Lett. 4, 2031-2035 (2004).
Shim, M., Javey, A., Kam, N. W. S. & Dai, H. Polymer functionalization for air-stable n-type carbon nanotube field-effect transistors. J. Am. Chem. Soc. 123, 11512-11513 (2001).
Yuki Nakashima, Naotoshi Nakashima*, Tsuyohiko Fujigaya. Development of air-stable n-type single-walled carbon nanotubes by doping with 2-(2-methoxyphenyl)-1,3-dimethyl-2,3-dihydro-1Hbenzo[d]imidazole and their thermoelectric properties. Synthetic Metals 225 (2017) 76-80.
Dongyoon Khim, Eul-Yong Shin, Yong Xu, Won-Tae Park, Sung-Ho Jin, and Yong-Young Noh.Control of Threshold Voltage for Top-Gated Ambipolar Field-Effect Transistor by Gate Buffer Layer. ACS Appl. Mater. Interfaces 2016, 8, 17416-17420.
Lee, S. W., Suh, D., Lee, S. Y. & Lee, Y. H. Passivation effect on gate-bias stress instability of carbon nanotube thin film transistors. Appl. Phys. Lett. 104, (2014).
Zhang, J., Wang, C., Fu, Y., Che, Y. & Zhou, C. Air-stable conversion of separated carbon nanotube thin-film transistors from p-type to n-type using atomic layer deposition of high-K oxide and its application in CMOS logic circuits. ACS Nano 5, 3284-3292 (2011).
I. N. Hulea1, S. Fratini2, H. Xie1, C. L. Mulder1, N. N. Iossad1, G. Rastelli, S. Ciuchi3 and A. F. Morpurgo. Tunable Frohl ich polarons in organic single-crystal transistors. Nature Materials. 5:983-986, 2006.
Yudan Zhao, Qunqing Li, Xiaoyang Xiao, Guanhong Li, Yuanhao Jin, Kaili Jiang, Jiaping Wang, and Shoushan Fan, "Three-Dimensional Flexible Complementary Metal-Oxide-Semiconductor Logic Circuits Based On Two-Layer Stacks of Single-Walled Carbon Nanotube Networks", ACS Nano, 2016, 10, 2193-2202.
Jana Zaumseil. Semiconducting Single-Walled Carbon Nanotubes or Very Rigid Conjugated Polymers: A Comparison. Adv. Electron. Mater. 2019, 5, 1800514.
Jianshi Tang, Qing Cao, George Tulevski, Keith A. Jenkins, Luca Nela, Damon B. Farmer and Shu-Jen Han, "Flexible CMOS integrated circuits based on carbon nanotubes with sub-10 ns stage delays", Nat. Electro. 2018, 1, 191-196.
Guanhong Li, Qunqing Li, Yuanhao Jin, Yudan Zhao, Xiaoyang Xiao, Kaili Jiang, Jiaping Wang and Shoushan Fan, "Fabrication of air-stable n-type carbon nanotube thin-film transistors on flexible substrates using bilayer dielectrics", Nanoscale, 2015, 7, 17693.
Soo Min Kim, Jin Ho Jang, Ki Kang Kim, Hyeon Ki Park, Jung Jun Bae, Woo Jong Yu, Il Ha Lee, Gunn Kim, Duong Dinh Loo, Un Jeong Kim, Eun-Hong Lee, Hyeon-Jin Shin, Jae-Young Choi, and Young Hee Lee, "Reduction-Controlled Viologen in Bisolvent as an Environmentally Stable n-Type Dopant for Carbon Nanotubes", J. Am. Chem. Soc., 2009, 131,327-331.
Si Young Lee, Sang Won Lee, Soo Min Kim, Woo Jong Yu, Young Woo Jo, and Young Hee Lee, "Scalable Complementary Logic Gates with Chemically Doped Semiconducting Carbon Nanotube Transistors", ACS Nano, 2011,5,2369-2375.
Stefan P. Schießl, Nils Fröhlich, Martin Held, Florentina Gannott, Manuel Schweiger, Michael Forster, Ullrich Scherf, and Jana Zaumseil. Polymer-Sorted Semiconducting Carbon Nanotube Networks for High-Performance Ambipolar Field-Effect Transistors. ACS Appl. Mater. Interfaces 2015, 7, 682-689.
Fowkes, F. M. Quantitative Characterization of the Acid-Base Properties of Solvents, Polymers, and Inorganic Surfaces. J. Adhes. Sci. Technol. 1990, 4 (1), 669-691.
Cataldo, F. A Revision of the Gutmann Donor Numbers of a Series of Phosphoramides Including Tepa. Eur. Chem. Bull 2015, 4 (2), 92-97.
Office Action for Taiwan Application No. 108147066 dated Dec. 15, 2023.
Huiliang Wang, Peng Wei, Yaoxuan Li, Jeff Han, Hye Ryoung Lee, Benjamin D. Naab, Nan Liu, Chenggong Wang, EricAdijanto, Benjamin C.-K. Tee, Satoshi Morishitab, Qiaochu Li, Yongli Gao, Yi Cui, and Zhenan Bao, "Tuning the threshold voltage of carbon nanotube transistors by n-type molecular doping for robust and flexible complementary circuits", PNAS, 2014, 111, 4776-4781.
Hartmann, M. et al. Polymer-based doping control for performance enhancement of wet-processed short-channel CNTFETs. Nanotechnology Jan. 19, 2018;29(3):035203.
Schneider, S. Brohmann, M. Lorenz, R. Hofstetter, Y. J. Rother, M. Sauter, E. Zharnikov, M. Vaynzof, Y. Himmel, H.-J. Zaumseil, J. Efficient n-Doping and Hole Blocking in Single-Walled Carbon Nanotube Transistors with 1,2,4,5-Tetrakis (tetramethylguanidino)benzene. ACS Nano 2018, 12, 5895.
Michael L. Geier, Karttikay Moudgil, Stephen Barlow, Seth R. Marder, and Mark C. Hersam, "Controlled n-Type Doping of Carbon Nanotube Transistors by an Organorhodium Dimer", Nano Lett. 2016, 16, 4329-4334.
Qiqi Xu, Jianwen Zhao, Vincenzo Pecunia, Wenya Xu, Chunshan Zhou, Junyan Dou, Weibing Gu, Jian Lin, Lixin Mo, Yanfei Zhao, and Zheng Cui, "Selective Conversion from p-Type to n-Type of Printed Bottom-Gate Carbon Nanotube Thin-Film Transistors and Application in Complementary Metal-Oxide-Semiconductor Inverters", ACS Appl. Mater Interfaces 2017, 9, 12750-12758.
Jian-Long Xu, Rui-Xuan Dai, Yan Xin, Yi-Lin Sun, Xian Li, Yang-Xin Yu, Lan Xiang, Dan Xie, Sui-Dong Wang & Tian-Ling Ren, "Efficient and Reversible Electron Doping of Semiconductor-Enriched Single-Walled Carbon Nanotubes by Using Decamethylcobaltocene", Sci, Rep. 2017, 7, 6751.
Michael L. Geier, Julian J. McMorrow, WeichaoXu, JianZhu, Chris H. Kim, Tobin J. Marks and Mark C. Hersam, "Solution-processed carbon nanotube thin-film complementary static random access memory", Nat. Nanotech. 2015, 10, 944-949.
Tomohiro Yasunishi, Shigeru Kishimoto, Esko I. Kauppinen, and Yutaka Ohno, "Fabrication of high-mobility n-type carbon nanotube thin-film transistors on plastic film", Rhys. Status Solidi C, 2013, 1-4.
Tomohiro Yasunishi, Shigeru Kishimoto, and Yutaka Ohno, "Effect of ambient air on n-type carbon nanotube thin-film transistors chemically doped with polyethylene imine)", Jpn. J. Appl. Rhys. 2014, 53, 05FD01.
Giles P. Siddons, David Merchin, Ju Hee Back, Jae Kyeong Jeong, and Moonsub Shim, "Highly Efficient Gating and Doping of Carbon Nanotubes with Polymer Electrolytes", Nano Lett. 2004, 4, 927-931.
Chenguang Lu, Qiang Fu, Shaoming Huang, and Jie Liu, "Polymer Electrolyte-Gated Carbon Nanotube Field-Effect Transistor", Nano Lett. 2004, 4, 623-627.
Aikawa, S. Einarsson, E. Thurakitseree, T. Chiashi, S. Nishikawa, E. Maruyama, S. Deformable Transparent All-Carbon-Nanotube Transistors. Appl. Rhys. Lett. 2012, 100, 063502.
Li, Z. Ding, J. Lefebvre, J. Malenfant, P. R. L. Surface Effects on Network Formation of Conjugated Polymer Wrapped Semiconducting Single Walled Carbon Nanotubes and Thin Film Transistor Performance. Org. Electron. 2015, 26, 15.
Davies, D. K. The Examination of the Electrical Properties of Insulators by Surface Charge Measurement. J. Sci. Instrum. 1967, 44, 521.
Li, Z. Ding, J. Finnie, P. Lefebvre, J. Cheng, F. Kingston, C. T. Malenfant, P. R. L. Raman Microscopy Mapping for the Purity Assessment of Chirality Enriched Carbon Nanotube Networks in Thin-Film Transistors. Nano Res. 2015, 8, 2179.
Yasunishi, T. Kishimoto, S. Ohno, Y. Effectof Ambient Air on n-Type Carbon Nanotube Thin-Film Transistors Chemically Doped With Polyethylene imine). Jpn. J. Appl. Phys. 2014, 53, 05FD01.
Li, Z. Ding, J. Guo, C. Lefebvre, J. Malenfant, P. R. L. Decomposable s-Tetrazine Copolymer Enables Single-Walled Carbon Nanotube Thin Film Transistors and Sensors with Improved Sensitivity. Adv. Funct. Mater, 2018, 1705568.
Li, Z. Ding, J. Lefebvre, J. Malenfant, P. R. L. Dopant-Modulated Conjugated Polymer Enrichment of Semiconducting SWCNTs. ACS Omega, 2018, 3, 3413.
Kadaji, V. G. Betageri, G. V. Water Soluble Polymers for Pharmaceutical Applications. Polymers, 2011, 3, 1972.
Gomulya, W. Costanzo, G. D. Carvalho, E. J. F. Bisri, S. Z. Derenskyi, V. Fritsch, M. Frdhlich, N. Allard, S. Gordiichuk, P.

(56) References Cited

OTHER PUBLICATIONS

Herrmann, A. Marrink, S. J. Santos, M. C. Scherf, U. Loi, M. A. Semiconducting Single-Walled Carbon Nanotubes on Demand by Polymer Wrapping. Adv. Mater. 2013, 25, 2948.

Biswas, C.; Lee, S. Y.; Ly, T. H.; Ghosh, A.; Dang, Q. N.; Lee, Y. H. Chemically Doped Random Network Carbon Nanotube P-n Junction Diode for Rectifier. ACS Nano 2011, 5 (12), 9817-9823. https://doi.org/10.1021/nn203391h.

Diaz, A. F.; Felix-Navarro, R. M. A Semi-Quantitative Tribo-Electric Series for Polymeric Materials: The Influence of Chemical Structure and Properties. J. Electrostat. 2004, 62, 277-290.

Class 257 Active Solid-State Devices (E.G., Transistors, Solid-State Diodes). 257-1-66, Oct. 2010.

Section H—Electricity, Basic Electric Elements, H01L, p. 1-15 (2018).

\* cited by examiner

THIN FILM TRANSISTORS COMPRISING CARBON NANOTUBE NETWORKS ENCAPSULATED BY A POLYMERIC LAYER AND METHODS FOR THE MANUFACTURE THEREOF

CROSS-REFERENCE TO RELATED APPLICATIONS

The present application is a national phase entry of PCT/CA2019/051838 filed Dec. 17, 2019, which claims the benefit of priority from applications, U.S. provisional application No. 62/783,627, filed Dec. 21, 2018, U.S. provisional application No. 62/891,672, filed Aug. 26, 2019, and U.S. provisional application No. 62/892,019, filed Aug. 27, 2019, the contents of which are incorporated herein by reference in their entirety.

FIELD

The present application relates to thin film transistors comprising a semiconducting channel comprising a network of carbon nanotubes and a polymeric layer encapsulating the carbon nanotubes, methods for the manufacture of such thin film transistors and methods of selecting a polymeric layer to provide a desired threshold voltage for such thin film transistors.

BACKGROUND

Carbon nanotubes (CNTs) are an allotrope of carbon that is in the form of a hollow nanotube in which the walls are made up of six-membered carbon rings connected together in a graphene-like configuration. A CNT can be either metallic or semiconducting depending on its chirality. Semiconducting nanotubes can be used, for example, in single carbon nanotube thin film transistors (CN-TFTs) and carbon nanotube network thin film transistors (CNN-TFTs). Like other TFTs, CN-TFTs and CNN-TFTs comprise three terminals: a source, a drain and a gate. Applying a potential to the gate allows the modulation of the current flowing across source and drains through a channel, the CNTs making up the channel.

Since their discovery, single walled carbon nanotubes (SWCNTs) have attracted extensive research interest due to their specific electrical and optical properties.[1] Numerous methods have been developed to purify, separate and enrich semiconducting (sc) SWCNTs,[2] which have demonstrated potential on both high end applications to replace the existing silicon based semiconducting industry[3], and emerging low end applications like disposable and/or wearable electronics.[4] Unlike conjugated polymers, a single SWCNT has a near perfect crystal structure and demonstrates ballistic charge transport in transistors.[5] For more practical applications, SWCNT network based TFTs are used and the charge transport is limited by the tube-tube junctions and will be affected by the network morphology.[6]

SWCNT network based TFTs have drawn great interest in both academia and industry. Compared with other organic (i.e. polymer or small molecule) based TFTs, they may, for example, demonstrate several advantages. First, SWCNT based TFTs usually show high mobility value, which is about one magnitude higher than that from other organic TFTs. Second, the SWCNT network is intrinsically flexible, which makes it compatible with other components used in flexible electronics. Third, the cost for the production of sc SWCNTs has been dramatically reduced due to the development of various enrichment and purification methods, such as conjugated polymer extraction.[7] Fourth, sc-SWCNTs can also be formulated into a hydrophilic ink, which make them easy to process and compatible with standard printing industry[8]. The electrical performance of CNT-based TFTs can depend on the surrounding environment be it ambient air in bottom gate, non-encapsulated devices, or the dielectric surroundings in encapsulated or top-gated devices. As prepared sc-SWCNT based TFTs usually show p-type behaviour in ambient conditions due to the p-type doping of atmospheric dopants such as moisture and/or oxygen. Thus their TFTs show typical p-type behavior but are not very stable as the threshold voltage will deleteriously shift due to fluctuation of ambient conditions.[9] However, transistors based on electron conduction (n-type) with controlled threshold voltage may be desirable, for example, for the construction of complementary logic circuits, in analogy to complementary metal-oxide-semiconductor (CMOS) circuits, where matching n-type TFTs can substantially lower the power consumption. Moreover, transistors showing both electron and hole conduction (ambipolar) may be desirable, for example, for optical detection and emission. There are limited strategies to select/engineer the transistor type (p, n or ambipolar) and to tune transistor metrics such as threshold voltage. The p-type character of carbon nanotube transistors stems from three causes: the Schottky barrier at the contact injection[10], charges at the dielectric interface and in the dielectric bulk[11], and redox reaction with the $O_2/H_2O$ couple in the channel region[12]. The first cause has been addressed, for example, by selecting a suitable metal for the electrodes (such as but not limited to Pd and Au), and/or by heating and operating the device in vacuum. The metal surface of the electrodes can also be modified using physically or chemically adsorbed molecules to tune or remove the Schottky barrier. However, while preventing the formation of a Schottky barrier is a necessary condition to obtain ambipolar or n-type device, it is not sufficient to ensure ambipolar or n-type character in ambient air, because of the action of the $O_2/H_2O$ redox couple. The second cause has been addressed, for example, by lowering the density of charges and interface states through better processing, and/or by willfully introducing charged impurities in the bulk of the dielectric[13] or at the interface[14]. However, a strict control of the charge impurity density is onerous in energy, time and money, and necessitates passivation of the devices to warrant stability. The third cause has been addressed, for example by: heating and operating the device in vacuum[12]; building the device on a hydrophobic dielectric layer, such as Parylene-C[12], Teflon AF or PVP-pMSSQ[15]; doping of the channel with electron donors such as methyl viologen; and/or encapsulation, passivation or capping of the device with certain polymers[16] or inorganic dielectrics[17]. However, heating and operating the devices in vacuum is generally only realistic in a laboratory context; building devices on top of hydrophobic dielectric bottom layers is more efficient for individual carbon nanotube TFTs, the effect demonstrated on networks is lower[18]; doping of the channel by itself is a short-term measure where the doping effect decays on the timescale of days; devices encapsulated with certain polymers devoid of a doping effect only have shown ambipolar behaviour when the devices are handled in a controlled atmosphere prior to capping, thus adding to the complexity and cost of processing and only a fraction of these polymers, such as poly(methyl methacrylate) (PMMA), have been shown to induce ambipolar or n-type behaviour in devices when properly handled; and capping devices with an inorganic dielectric is expensive and results in a rigid and brittle material which is not compatible with low cost or flexible electronics. The capping layer may also act as an electron donor such as poly(ethylene imine)[19] (PEI) or impose a built-in electric field through a nonstoichiometric composition[20]. However, in these reports of PEI as a capping layer to create n-type CN(N)-TFTs, they all suffered from a lack of stability on timescales longer than hours or a day.

The methods to prepare n-type SWCNT based TFTs can also be classified, for example, by dividing them into four categories. First being coating of the devices by thin layers of inorganic dielectrics, such as $SiN_x$, $Al_2O_3$, MgO, or $HfO_2$, on a SWCNT surface[21]. However, standard methods such as plasma deposition or atom layer deposition (ALD) usually suffer from tedious process conditions and are not compatible with the printing industry. Second being the coating of a thin layer of synthesized n-doping small molecules, such as benzyl viologen and N-DMBI[22]. Third being the deposition of electron donating metal complexes, such as those of Rh (such as organorhodium dimeric complex) or Zr (such as zirconium acetylacetonate)[23]. However, such methods are also not compatible with the printing industry and involve the usage of environmentally unfriendly heavy metals. Fourth being the coating of very thin polymer layers, such as polyvinyl alcohol (PVA) or polyethylenimine (PEI)[24]. However, as mentioned above, the fabricated SWCNT based TFTs from such methods have shown poor stability in ambient air. Additionally, while certain literature reported variation of the threshold voltage or electronic character, such properties were not rationally controlled. Additionally, as noted above, most of these methods are not compatible with a large scale production process therefore new methods remain desirable, for example, for efficient n-type doping of SWCNT TFTs that may, for example, use cost effective and/or commercially available materials which may, for example, be solution processed in ambient conditions.

Finally, Hartmann et al.[25] reported controlling the threshold voltage of CNN-TFTs through in situ polymerization of poly(4-vinyl pyridine). However, the in situ polymerization induces significant damage to the carbon nanotube layer.

SUMMARY

Substantial progress in enrichment of semiconducting single walled carbon nanotubes (sc-SWCNTs) and their device fabrication has been demonstrated in recent years. SWCNT network based thin film transistors (TFTs) not only provide high mobility and good on/off ratio, but also are printable on flexible substrates. In ambient conditions, these TFTs show p-type behavior due to moisture/oxygen doping. For practical applications, such as to build low power consuming complementary circuits, matching n-type TFTs are highly desired. However, existing technologies for n-doping of SWCNT TFTs usually need vacuum deposition and/or show poor ambient air stability. While vacuum deposition may be used in large scale production, it is generally not compatible with printed, soft, and/or flexible electronics. In the examples of the present application, it was demonstrated that the p/n-type charge carrier and transport properties of SWCNT network based TFTs can be effectively tuned by polymer coatings on the SWCNT layer. In contrast to the in situ polymerization of poly(4-vinyl pyridine) that was reported by Hartmann et al., the encapsulation technique used in the present Examples did not create structural defects in the carbon nanotube material. Blends of polymers or co-polymers were used to adjust the transistor electrical properties (such as the threshold voltage) to obtain behaviours ranging from complete p-type to ambipolar and largely n-type. Knowledge of the charge accumulated at the interface directly translated into a threshold voltage according to a "master" relationship, for numerous homopolymers, copolymers and polymer blends. Accordingly, it may be possible to control the density and nature of these dipoles and traps by appropriately selecting the dielectric based on their chemical groups and electronegativity. The encapsulated devices have been shown to have significant stability in ambient air over a timescale of months. Additionally, results for 2VP suggest that hydrophobic dielectrics that effectively set the p-branch threshold voltage to negative values relative to the natural threshold can be an effective encapsulating layer to protect n-type dopants such as 4-(2,3-dihydro-1,3-dimethyl-1H-benzimidazol-2-yl)-N, N-dimethylbenzenamine (N-DMBI) from air oxidation. Coating a thin layer of a blend of PVA/PEI on the channel of SWCNT network based bottom gated TFTs was also shown to effectively turn the original p-type devices to n-type with precisely controlled threshold voltage. Specifically, a polyvinyl alcohol coating will lead to ambipolar behavior whereas addition of a low percentage of polyethylenimine resulted in n-type TFTs with well controlled mobility, threshold voltage and on/off ratio. With the same method, matching p-type TFTs were also realized by coating a polyacrylic acid host layer containing a low percentage of polyvinyl alcohol. The doping mechanism was investigated by surface charge density measurement. Finally, an n-type TFT and a p-type TFT were integrated to fabricate a CMOS inverter, which showed useful voltage transfer characteristics. Considering the low cost, environmental friendly composition and solution processability in ambient conditions, this approach may be advantageous, for example, for low-end printable electronics applications.

Accordingly, the present application includes a thin film transistor comprising:
  a source electrode, a drain electrode and a gate electrode;
  a semiconducting channel comprising a network of carbon nanotubes, the carbon nanotubes electrically coupled to the source electrode and drain electrode and electrically insulated from, but capacitively coupled to, the gate electrode; and
  a polymeric layer encapsulating the carbon nanotubes, the polymeric layer comprising a first monomeric unit and optionally a second monomeric unit, wherein the first monomeric unit, the second monomeric unit and the relative amounts thereof are selected to provide at least one target electrical property of the thin film transistor.

The present application also includes a method of selecting a polymeric layer to provide a desired threshold voltage for a thin film transistor, the thin film transistor comprising:
  a source electrode, a drain electrode and a gate electrode;
  a semiconducting channel comprising a network of carbon nanotubes, the carbon nanotubes electrically coupled to the source electrode and drain electrode and electrically insulated from, but capacitively coupled to, the gate electrode; and
  the polymeric layer coupled to the carbon nanotubes, the method comprising:
  selecting a homopolymer, blend or copolymer for the polymeric layer based on a master curve of threshold voltage as a function of charge density measured after charging at the threshold voltage for a plurality of homopolymers, copolymers and/or blends according to the desired threshold voltage of the thin film transistor.

The present application further includes a method for manufacturing a thin film transistor, the method comprising:

assembling a source electrode, a drain electrode, a gate electrode and a semiconducting channel comprising a network of carbon nanotubes, such that the carbon nanotubes are electrically coupled to the source electrode and drain electrode and electrically insulated from, but capacitively coupled to, the gate electrode; and encapsulating the carbon nanotubes with a polymeric layer, the polymeric layer comprising a first monomeric unit and optionally a second monomeric unit, wherein the first monomeric unit, the second monomeric unit and the relative amounts thereof are selected to provide at least one target electrical property of the thin film transistor.

Other features and advantages of the present application will become apparent from the following detailed description. It should be understood, however, that the detailed description and the specific examples while indicating embodiments of the application are given by way of illustration only, since various changes and modifications within the spirit and scope of the application will become apparent to those skilled in the art from this detailed description.

BRIEF DESCRIPTION OF THE DRAWINGS

The present application will now be described in greater detail with reference to the drawings in which.

DETAILED DESCRIPTION

I. Definitions

Figure 1:
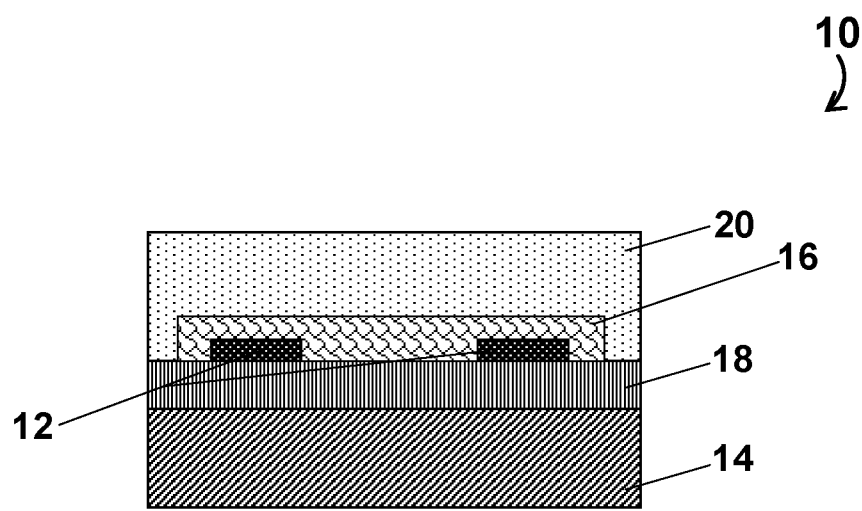
FIG. 1 is a schematic of an exemplary thin film transistor according to an embodiment of the present application.

Unless otherwise indicated, the definitions and embodiments described in this and other sections are intended to be applicable to all embodiments and aspects of the present application herein described for which they are suitable as would be understood by a person skilled in the art.

In understanding the scope of the present application, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. The term "consisting" and its derivatives, as used herein, are intended to be closed terms that specify the presence of the stated features, elements, components, groups, integers, and/or steps, but exclude the presence of other unstated features, elements, components, groups, integers and/or steps. The term "consisting essentially of", as used herein, is intended to specify the presence of the stated features, elements, components, groups, integers, and/or steps as well as those that do not materially affect the basic and novel characteristic(s) of features, elements, components, groups, integers, and/or steps.

Terms of degree such as "substantially", "about" and "approximately" as used herein mean a reasonable amount of deviation of the modified term such that the end result is not significantly changed. These terms of degree should be construed as including a deviation of at least ±5% of the modified term if this deviation would not negate the meaning of the word it modifies.

The term "and/or" as used herein means that the listed items are present, or used, individually or in combination. In effect, this term means that "at least one of" or "one or more" of the listed items is used or present.

As used in this application, the singular forms "a", "an" and "the" include plural references unless the content clearly dictates otherwise.

The term "suitable" as used herein means that the selection of specific reagents or conditions will depend on the reaction being performed and the desired results, but nonetheless, can generally be made by a person skilled in the art once all relevant information is known.

The term "alkyl" as used herein, whether it is used alone or as part of another group, means straight or branched chain, saturated alkyl groups. The number of carbon atoms that are possible in the referenced alkyl group are indicated by the numerical prefix "$C_{n1-n2}$". For example, the term $C_{10-18}$alkyl means an alkyl group having 10, 11, 12, 13, 14, 15, 16, 17 or 18 carbon atoms.

II. Thin Film Transistors and Uses Thereof

Blends of polymers or co-polymers were used to adjust thin film transistor electrical properties (such as the threshold voltage) to obtain behaviours ranging from complete p-type to ambipolar and largely n-type. The encapsulated devices have been shown to have significant stability in ambient air over a timescale of months. Additionally, results for 2VP suggest that hydrophobic dielectrics that effectively set the p-branch threshold voltage to negative values relative to the natural threshold can be an effective encapsulating layer to protect n-type dopants such as 4-(2,3-dihydro-1,3-dimethyl-1H-benzimidazol-2-yl)-N,N-dimethylbenzenamine (N-DMBI) from air oxidation. Coating a thin layer of a blend of PVA/PEI on the channel of SWCNT network based bottom gated TFTs was also shown to effectively turn the original p-type devices to n-type with precisely controlled threshold voltage. With the same method, matching p-type TFTs were also realized by coating a polyacrylic acid host layer containing a low percentage of polyvinyl alcohol. The doping mechanism was investigated by surface charge density measurement. Finally, an n-type TFT and a p-type TFT were integrated to fabricate a CMOS inverter, which showed useful voltage transfer characteristics.

Accordingly, the present application includes a thin film transistor comprising:
  a source electrode, a drain electrode and a gate electrode;
  a semiconducting channel comprising a network of carbon nanotubes, the carbon nanotubes electrically coupled to the source electrode and drain electrode and electrically insulated from, but capacitively coupled to, the gate electrode; and a polymeric layer encapsulating the carbon nanotubes, the polymeric layer comprising a first monomeric unit and optionally a second monomeric unit, wherein the first monomeric unit, the second monomeric unit and the relative amounts thereof are selected to provide at least one target electrical property of the thin film transistor.

FIG. 1 is a schematic of an exemplary thin film transistor 10 according to an embodiment of the present application. Referring to FIG. 1, the thin film transistor 10 comprises a source electrode and a drain electrode 12, a gate electrode 14, a semiconducting channel comprising a network of carbon nanotubes 16 (that are electrically coupled to the source electrode and drain electrode 12 and electrically insulated from, but capacitively coupled to, the gate electrode 14 by a layer 18) and a polymeric layer 20 that encapsulates the carbon nanotubes.

In some embodiments, the first monomeric unit is 2-vinylpyridine, acrylic acid or a glucopyranose in which at least a portion of the hydrogens of the hydroxyl groups are replaced with —$CH_2C(O)ONa$. In some embodiments, the first monomeric unit is acrylic acid. In some embodiments, the first monomeric unit is a glucopyranose in which at least a portion of the hydrogens of the hydroxyl groups are replaced with —$CH_2C(O)ONa$. In some embodiments, the second monomeric unit is not present. In some embodiments, the second monomeric unit is not present and the polymeric layer comprises poly(2-vinylpyridine), poly(acrylic acid) or sodium carboxymethyl cellulose. In some embodiments, the second monomeric unit is not present and the polymeric layer comprises poly(acrylic acid). In some embodiments, the second monomeric unit is not present and the polymeric layer comprises sodium carboxymethyl cellulose.

In some embodiments, the first monomeric unit is 2-vinylpyridine.

Accordingly, the present application also includes a thin film transistor comprising:
  a source electrode, a drain electrode and a gate electrode;
  a semiconducting channel comprising a network of carbon nanotubes, the carbon nanotubes electrically coupled to the source electrode and drain electrode and electrically insulated from, but capacitively coupled to, the gate electrode; and
  a polymeric layer encapsulating the carbon nanotubes, the polymeric layer comprising a first monomeric unit that is 2-vinylpyridine and optionally a second monomeric unit,
  wherein when the second monomeric unit is present, the second monomeric unit and the relative amounts of the first monomeric unit and the second monomeric unit are optionally selected to provide at least one target electrical property of the thin film transistor.

In some embodiments, the second monomeric unit is not present. In another embodiment of the present application, the second monomeric unit is not present and the polymeric layer comprises poly(2-vinylpyridine).

In alternative embodiments, the second monomeric unit is present. In embodiments wherein the second monomeric unit is present, the first monomeric unit and the second monomeric unit may be present as blend of a first homopolymer of the first monomeric unit and a second homopolymer of the second monomeric unit, in the form of a copolymer of the first monomeric unit and the second monomeric unit or combinations thereof. Accordingly, in an embodiment, the polymeric layer comprises a blend of a first homopolymer of the first monomeric unit and a second homopolymer of the second monomeric unit. In another embodiment, the polymeric layer comprises a copolymer of the first monomeric unit and the second monomeric unit.

In some embodiments, the second monomeric unit is styrene. Accordingly, the present application also includes a thin film transistor comprising:
  a source electrode, a drain electrode and a gate electrode;
  a semiconducting channel comprising a network of carbon nanotubes, the carbon nanotubes electrically coupled to the source electrode and drain electrode and electrically insulated from, but capacitively coupled to, the gate electrode; and
  a polymeric layer encapsulating the carbon nanotubes, the polymeric layer comprising a first monomeric unit that is 2-vinylpyridine and a second monomeric unit that is styrene,
  wherein the relative amounts of the first monomeric unit and the second monomeric unit are optionally selected to provide at least one target electrical property of the thin film transistor.

In an embodiment, the polymeric layer comprises a blend of poly(2-vinylpyridine) and polystyrene. In another embodiment, the blend of poly(2-vinylpyridine) and polystyrene comprises from about 10 wt % to about 90 wt %, about 15 wt % to about 85 wt %, about 15 wt %, about 30 wt %, about 50 wt % about 70 wt % or about 85 wt % poly(2-vinylpyridine). In an embodiment, the polymeric layer comprises a copolymer of 2-vinylpyridine and styrene. In another embodiment, the copolymer of 2-vinylpyridine and styrene comprises from about 5 mol % to about 75 mol %, about 11.5 mol % to about 70 mol %, about 11.5 mol %, about 25 mol %, about 44 mol % or about 70 mol % 2-vinylpyridine.

In some embodiments, the first monomeric unit is vinyl acetate. In some embodiments, the second monomeric unit is methyl methacrylate. In some embodiments, the first monomeric unit is vinyl acetate and the second monomeric unit is methyl methacrylate. Accordingly, the present application also includes a thin film transistor comprising:
  a source electrode, a drain electrode and a gate electrode;
  a semiconducting channel comprising a network of carbon nanotubes, the carbon nanotubes electrically coupled to the source electrode and drain electrode and electrically insulated from, but capacitively coupled to, the gate electrode; and
  a polymeric layer encapsulating the carbon nanotubes, the polymeric layer comprising a first monomeric unit that is vinyl acetate and a second monomeric unit that is methyl methacrylate,
  wherein the relative amounts of the first monomeric unit and the second monomeric unit are optionally selected to provide at least one target electrical property of the thin film transistor.

In an embodiment, the polymer layer comprises a blend of poly(vinyl acetate) and poly(methyl methacrylate). In another embodiment, the blend of poly(vinyl acetate) and poly(methyl methacrylate) comprises from about 20 wt % to about 80 wt %, about 25 wt % to about 75 wt %, about 25 wt %, about 50 wt % or about 75 wt % poly(vinyl acetate). In another embodiment, the polymer layer comprises a copolymer of vinyl acetate and methyl methacrylate.

In some embodiments, the first monomeric unit is vinyl alcohol. In some embodiments, the second monomeric unit is ethylenimine. In some embodiments, the first monomeric unit is vinyl alcohol and the second monomeric unit is ethylenimine. Accordingly, the present application also includes a thin film transistor comprising:
  a source electrode, a drain electrode and a gate electrode;

a semiconducting channel comprising a network of carbon nanotubes, the carbon nanotubes electrically coupled to the source electrode and drain electrode and electrically insulated from, but capacitively coupled to, the gate electrode; and a polymeric layer encapsulating the carbon nanotubes, the polymeric layer comprising a first monomeric unit that is vinyl alcohol and a second monomeric unit that is ethylenimine, wherein the relative amounts of the first monomeric unit and the second monomeric unit are optionally selected to provide at least one target electrical property of the thin film transistor.

In an embodiment, the polymer layer comprises a blend of poly(vinyl alcohol) and polyethylenimine. In another embodiment, the blend of poly(vinyl alcohol) and polyethyleneimine comprises at least about 0.05 wt % polyethyleneimine, for example, from about 0.06 wt % to about 20 wt %, about 0.06 wt % to about 5 wt %, about 0.06 wt % to about 1.1 wt %, about 0.06 wt %, about 0.31 wt % or about 1.1 wt % polyethyleneimine. In another embodiment, the polymer layer comprises a copolymer of vinyl alcohol and ethylenimine.

In some embodiments, the first monomeric unit is acrylic acid. In some embodiments, the second monomeric unit is vinyl alcohol. In some embodiments, the first monomeric unit is acrylic acid and the second monomeric unit is vinyl alcohol. Accordingly, the present application also includes a thin film transistor comprising:

a source electrode, a drain electrode and a gate electrode;

a semiconducting channel comprising a network of carbon nanotubes, the carbon nanotubes electrically coupled to the source electrode and drain electrode and electrically insulated from, but capacitively coupled to, the gate electrode; and a polymeric layer encapsulating the carbon nanotubes, the polymeric layer comprising a first monomeric unit that is acrylic acid and a second monomeric unit that is vinyl alcohol, wherein the relative amounts of the first monomeric unit and the second monomeric unit are optionally selected to provide at least one target electrical property of the thin film transistor.

In an embodiment, the polymer layer comprises a blend of poly(acrylic acid) and poly(vinyl alcohol). In another embodiment, the blend of poly(acrylic acid) and poly(vinyl alcohol) comprises at least about 0.05 wt % poly(vinyl alcohol), for example, from about 0.06 wt % to about 30 wt %, about 0.06 wt % to about 25 wt %, about 0.1 wt % to about 20 wt %, about 0.1 wt %, about 0.5 wt %, about 6 wt % or about 20 wt % poly(vinyl alcohol). In another embodiment, the polymer layer comprises a copolymer of acrylic acid and vinyl alcohol.

In the examples described hereinbelow, it was found that annealing thin film transistors having a coating of a polyethylenimine/poly(vinyl alcohol) blend resulted in a threshold voltage change in a negative direction as the annealing temperature increased. Accordingly, in some embodiments, the thin film transistor has been heated at a temperature to anneal the polymeric layer. In another embodiment, the temperature is from about 50° C. to about 140° C. In another embodiment, the temperature is about 50° C. In a further embodiment, the temperature is about 80° C. In another embodiment, the temperature is about 105° C. In a further embodiment, the temperature is about 140° C.

In the examples described hereinbelow, encapsulated devices were prepared which protected the n-type dopant 4-(2,3-dihydro-1,3-dimethyl-1H-benzimidazol-2-yl)-N,N-dimethylbenzenamine (N-DMBI) from air oxidation. Accordingly, in some embodiments, the polymeric layer and/or the semiconducting channel further comprises an n-type dopant. In another embodiment, the polymeric layer further comprises an n-type dopant. In a further embodiment, the semiconducting channel further comprises an n-type dopant. The n-type dopant can be any suitable n-type dopant, the selection of which can be made by a person skilled in the art. In an embodiment, the n-type dopant is 4-(2,3-dihydro-1,3-dimethyl-1H-benzimidazol-2-yl)-N,N-dimethylbenzenamine (N-DMBI).

In another embodiment of the present application, the thin film transistor has a bottom gate configuration.

The gate electrode is formed of any suitable material, the selection of which can be made by a person skilled in the art. In an embodiment, the gate electrode comprises a metal (such as but not limited to $Au^0$, $Al^0$ or $Pd^0$), a conductive oxide (such as but not limited to indium tin oxide (ITO) or ZnO), a conductive polymer (such as not but limited to poly(3,4-ethylenedioxythiophene) polystyrene sulfonate (PEDOT:PSS)), a conductive nanomaterial (such as but not limited to metallic CNTs, graphene or a blend of graphene and graphite flakes) or a conductive doped semiconductor (such as but not limited to doped silicon or doped germanium). In another embodiment, the gate electrode comprises, consists essentially of or consists of doped silicon.

The carbon nanotubes are electrically insulated from, but capacitively coupled to, the gate electrode by a layer comprising any suitable dielectric, the selection of which can be made by a person skilled in the art. In another embodiment, the carbon nanotubes are electrically insulated from, but capacitively coupled to, the gate electrode by a layer comprising an inorganic dielectric (such as but not limited to $SiO_2$, $HfO_2$, $SiN_x$ e.g. $SiN_4$ or $Al_2O_3$), a polymeric dielectric (such as but not limited to poly(methyl methacrylate (PMMA), polyvinylidene difluoride (PVdF), a benzocyclobutene (BCB)-based polymer, a fluoroplastic resin e.g. Teflon™ AF or Merck Lisicon™ D139 or a poly(4-vinylphenol)-poly(methyl silsesquioxane) (PVPh-pMSS) such as Xerox xdi-dcs™) or a combination of an inorganic dielectric and a polymeric dielectric (such as but not limited to a combination of $BaTiO_3$ and PMMA). In another embodiment, the carbon nanotubes are electrically insulated from, but capacitively coupled to, the gate electrode by a layer comprising silicon dioxide.

The carbon nanotubes are any suitable carbon nanotubes, the selection of which can be made by a person skilled in the art. In an embodiment, the carbon nanotubes are single-walled carbon nanotubes. In an embodiment, the single-walled carbon nanotubes are enriched in semiconducting single-walled carbon nanotubes. Carbon nanotubes enriched in semiconducting single-walled carbon nanotubes can be prepared, for example, by a process disclosed in U.S. Pat. No. 10,046,970. Accordingly, in some embodiments, the carbon nanotubes are complexed with a conjugated polymer. The conjugated polymer can be any suitable conjugated polymer that will selectively fractionate semiconducting single-walled carbon nanotubes from a mixture of semiconducting and non-semiconducting single-walled carbon nanotubes, the selection of which can be made by a person skilled in the art. For example, the skilled person would readily appreciate that complexing polymers for semiconducting nanotube enrichment are conjugated and comprise, for example, thiophene, fluorene and/or pyridine moieties in homopolymers or copolymers and that side chains are useful for solubility. Accordingly, in an embodiment, the conjugated polymer is a polyfluorene, polythiophene or polyphenylenevinylene homopolymer, or a copolymer thereof with one or more co-monomer units (such as but not limited to bithiophene, phenylene, bipyridine, anthracene, naphthalene or benzothiadiazole) or combinations thereof. In another embodiment, the conjugated polymer comprises a polyfluorene derivative, for example a 9,9-dialkyl-substituted polyfluorene. In another embodiment, the alkyl groups of the 9,9-dialkyl-substituted polyfluorene are $C_{10-36}$alkyl or $C_{10-18}$alkyl. In an embodiment, the alkyl groups are linear alkyl groups. In another embodiment, the conjugated polymer is poly(9,9-di-n-dodecylfluorene); i.e. the carbon nanotubes are complexed with poly(9,9-di-n-dodecylfluorene). In an embodiment, the conjugated polymer has a number average molecular weight ($M_n$) greater than about 10,000 Da, for example from about 10,000 Da to about 500,000 Da or from about 10,000 Da to about 30,000 Da.

The source and drain electrodes can be formed of any suitable material, the selection of which can be made by a person skilled in the art. In an embodiment, the source and drain electrodes comprise a conductive nanomaterial (such as but not limited to metallic CNTs, graphene or a blend of graphene and graphite flakes) or a metal (such as but not limited to $Au^0$, $Al^0$ or $Pd^0$, etc.). In another embodiment, the source and drain electrodes comprise metallic gold.

In an embodiment, at least one target electrical property is threshold voltage, charge carrier type, the ON current, the OFF current, the ON/OFF current ratio, the subthreshold swing/slope, the charge carrier mobility, the hysteresis, the contact and channel resistance and the capacitance of the thin film transistor. In another embodiment, the at least one target electrical property is the threshold voltage of the thin film transistor. In a further embodiment, the at least one target electrical property is the charge carrier type of the thin film transistor. In an embodiment, the charge carrier type is n-type. In another embodiment of the present application, the charge carrier type is p-type. In a further embodiment, the charge carrier type is ambipolar.

In an embodiment, the polymeric layer has a thickness of greater than about 2 μm.

The present application also includes a use of a thin film transistor of the present application in a logic circuit, a detector, an electroluminescent device in the near-infrared or as a backplane/driver for an organic light-emitting diode (OLED) or electrophoretic display. The present application also includes a use of a thin film transistor of the present application in a p-n junction diode, an inverter made by serially connecting a p and an n transistor, a logic circuit, a detector, an electroluminescent device in the near-infrared or as a backplane/driver for an organic light-emitting diode (OLED) or electrophoretic display.

III. Methods

In contrast to the in situ polymerization of poly(4-vinyl pyridine) that was reported by Hartmann et al., the encapsulation technique used in the present Examples did not create structural defects in the carbon nanotube material. Blends of polymers or co-polymers were used to adjust the transistor electrical properties (such as the threshold voltage) to obtain behaviours ranging from complete p-type to ambipolar and largely n-type. Knowledge of the charge accumulated at the interface directly translated into a threshold voltage according to a "master" relationship, for numerous homopolymers, copolymers and polymer blends. Accordingly, it may be possible to control the density and nature of these dipoles and traps by appropriately selecting the dielectric based on their chemical groups and electronegativity. Coating a thin layer of a blend of PVA/PEI on the channel of SWCNT network based bottom gated TFTs was also shown to effectively turn the original p-type devices to n-type with precisely controlled threshold voltage. With the same method, matching p-type TFTs were also realized by coating a polyacrylic acid host layer containing a low percentage of polyvinyl alcohol. The doping mechanism was investigated by surface charge density measurement. Finally, an n-type TFT and a p-type TFT were integrated to fabricate a CMOS inverter, which showed useful voltage transfer characteristics.

Accordingly, the present application also includes a method of selecting a polymeric layer to provide a desired threshold voltage for a thin film transistor, the thin film transistor comprising:

a source electrode, a drain electrode and a gate electrode;

a semiconducting channel comprising a network of carbon nanotubes, the carbon nanotubes electrically coupled to the source electrode and drain electrode and electrically insulated from, but capacitively coupled to, the gate electrode; and the polymeric layer coupled to the carbon nanotubes, the method comprising:

selecting a homopolymer, blend or copolymer for the polymeric layer based on a master curve of threshold voltage as a function of charge density (measured after charging at the threshold voltage) for a plurality of homopolymers, copolymers and/or blends according to the desired threshold voltage of the thin film transistor.

In an embodiment, the method further comprises:

measuring threshold voltage as a function of charge density (measured after charging at the threshold voltage) for a plurality of homopolymers, blends and/or copolymers; and preparing the master curve from the measurements.

The polymeric layer is coupled to the nanotubes in any suitable manner, the selection of which can be made by a person skilled in the art. For example, the skilled person would appreciate that the manner of coupling may depend, for example, on the configuration and/or end use of the thin film transistor. In some embodiments, for example, where the thin film transistor has a top gate configuration, the polymeric layer is a substrate or underlayer. In other embodiments, for example, where stability in air is desired or advantageous, the polymeric layer encapsulates the carbon nanotubes.

It will be appreciated by a person skilled in the art that embodiments relating to the thin film transistor and the encapsulation thereof in the methods of selecting a polymeric layer of the present application can be varied, as appropriate, as described herein for the corresponding embodiments of the thin film transistors and the methods for manufacturing thereof of the present application.

The present application also includes a method for manufacturing a thin film transistor, the method comprising:

assembling a source electrode, a drain electrode, a gate electrode and a semiconducting channel comprising a network of carbon nanotubes, such that the carbon nanotubes are electrically coupled to the source electrode and drain electrode and electrically insulated from, but capacitively coupled to, the gate electrode; and encapsulating the carbon nanotubes with a polymeric layer, the polymeric layer comprising a first monomeric unit and optionally a second monomeric unit, wherein the first monomeric unit, the second monomeric unit and the relative amounts thereof are selected to provide at least one target electrical property of the thin film transistor.

In an embodiment, the carbon nanotubes are encapsulated with the polymeric layer by a method comprising spin coating, drop casting or printing a solution comprising the first monomeric unit and optionally the second monomeric unit over the network of carbon nanotubes. In another embodiment, the carbon nanotubes are encapsulated with the polymeric layer by a method comprising spin coating a solution comprising the first monomeric unit and optionally the second monomeric unit over the network of carbon nanotubes. In a further embodiment, the carbon nanotubes are encapsulated with the polymeric layer by a method comprising drop casting a solution comprising the first monomeric unit and optionally the second monomeric unit over the network of carbon nanotubes. In another embodiment, the carbon nanotubes are encapsulated with the polymeric layer by a method comprising printing a solution comprising the first monomeric unit and optionally the second monomeric unit over the network of carbon nanotubes.

In an embodiment, at least one target electrical property is threshold voltage, charge carrier type, the ON current, the OFF current, the ON/OFF current ratio, the subthreshold swing/slope, the charge carrier mobility, the hysteresis, the contact and channel resistance and the capacitance of the thin film transistor. In another embodiment, the at least one target electrical property is the threshold voltage of the thin film transistor. In a further embodiment, the at least one target electrical property is the charge carrier type of the thin film transistor. In an embodiment, the charge carrier type is n-type. In another embodiment, the charge carrier type is p-type. In another embodiment of the present application, the charge carrier type is p-type. In a further embodiment, the charge carrier type is ambipolar.

In an embodiment, the first monomeric unit and, if present, the second monomeric unit and the relative amounts thereof are selected based on a method of selecting a polymeric layer to provide a desired threshold voltage for a thin film transistor of the present application.

In another embodiment, the first monomeric unit and, if present, the second monomeric unit and the relative amounts thereof are selected based on a method comprising preparing a master curve of surface charge density measurements for a plurality of homopolymers, copolymers and/or blends.

It will be appreciated by a person skilled in the art that embodiments of the methods for manufacturing a thin film transistor of the present application can be varied as described herein for the corresponding embodiments of the thin film transistors of the present application.

In some embodiments, the first monomeric unit is 2-vinylpyridine, acrylic acid or a glucopyranose in which at least a portion of the hydrogens of the hydroxyl groups are replaced with —CH$_2$C(O)ONa. In some embodiments, the first monomeric unit is acrylic acid. In some embodiments, the first monomeric unit is a glucopyranose in which at least a portion of the hydrogens of the hydroxyl groups are replaced with —CH$_2$C(O)ONa. In some embodiments, the second monomeric unit is not present. In some embodiments, the second monomeric unit is not present and the polymeric layer comprises poly(2-vinylpyridine), poly(acrylic acid) or sodium carboxymethyl cellulose. In some embodiments, the second monomeric unit is not present and the polymeric layer comprises poly(acrylic acid). In some embodiments, the second monomeric unit is not present and the polymeric layer comprises sodium carboxymethyl cellulose.

In some embodiments, the first monomeric unit is 2-vinylpyridine.

Accordingly, the present application also includes a method for manufacturing a thin film transistor, the method comprising:
assembling a source electrode, a drain electrode, a gate electrode and a semiconducting channel comprising a network of carbon nanotubes, such that the carbon nanotubes are electrically coupled to the source electrode and drain electrode and electrically insulated from, but capacitively coupled to, the gate electrode; and
encapsulating the carbon nanotubes with a polymeric layer, the polymeric layer comprising a first monomeric unit that is 2-vinylpyridine and optionally a second monomeric unit,
wherein when the second monomeric unit is present, the second monomeric unit and the relative amounts of the first monomeric unit and the second monomeric unit are optionally selected to provide at least one target electrical property of the thin film transistor.

In some embodiments, the second monomeric unit is not present. In another embodiment of the present application, the second monomeric unit is not present and the polymeric layer comprises poly(2-vinylpyridine).

In alternative embodiments, the second monomeric unit is present. In embodiments wherein the second monomeric unit is present, the first monomeric unit and the second monomeric unit may be present as blend of a first homopolymer of the first monomeric unit and a second homopolymer of the second monomeric unit, in the form of a copolymer of the first monomeric unit and the second monomeric unit or combinations thereof. Accordingly, in an embodiment, the polymeric layer comprises a blend of a first homopolymer of the first monomeric unit and a second homopolymer of the second monomeric unit. In another embodiment, the polymeric layer comprises a copolymer of the first monomeric unit and the second monomeric unit.

In some embodiments, the second monomeric unit is styrene. Accordingly, the present application also includes a method for manufacturing a thin film transistor, the method comprising:
assembling a source electrode, a drain electrode, a gate electrode and a semiconducting channel comprising a network of carbon nanotubes, such that the carbon nanotubes are electrically coupled to the source electrode and drain electrode and electrically insulated from, but capacitively coupled to, the gate electrode; and
encapsulating the carbon nanotubes with a polymeric layer, the polymeric layer comprising a first monomeric unit that is 2-vinylpyridine and a second monomeric unit that is styrene,
wherein the relative amounts of the first monomeric unit and the second monomeric unit are optionally selected to provide at least one target electrical property of the thin film transistor.

In an embodiment, the polymeric layer comprises a blend of poly(2-vinylpyridine) and polystyrene. In another embodiment, the blend of poly(2-vinylpyridine) and polystyrene comprises from about 10 wt % to about 90 wt %, about 15 wt % to about 85 wt %, about 15 wt %, about 30 wt %, about 50 wt % about 70 wt % or about 85 wt % poly(2-vinylpyridine). In another embodiment, the polymeric layer comprises a copolymer of 2-vinylpyridine and styrene. In another embodiment, the copolymer of 2-vinylpyridine and styrene comprises from about 5 mol % to about 75 mol %, about 11.5 mol % to about 70 mol %, about 11.5 mol %, about 25 mol %, about 44 mol % or about 70 mol % 2-vinylpyridine.

In some embodiments, the first monomeric unit is vinyl acetate. In some embodiments, the second monomeric unit is methyl methacrylate. In some embodiments, the first monomeric unit is vinyl acetate and the second monomeric unit is methyl methacrylate. Accordingly, the present application also includes a method for manufacturing a thin film transistor, the method comprising:
- assembling a source electrode, a drain electrode, a gate electrode and a semiconducting channel comprising a network of carbon nanotubes, such that the carbon nanotubes are electrically coupled to the source electrode and drain electrode and electrically insulated from, but capacitively coupled to, the gate electrode; and
- encapsulating the carbon nanotubes with a polymeric layer, the polymeric layer comprising a first monomeric unit that is vinyl acetate and a second monomeric unit that is methyl methacrylate,
- wherein the relative amounts of the first monomeric unit and the second monomeric unit are optionally selected to provide at least one target electrical property of the thin film transistor.

In an embodiment, the polymer layer comprises a blend of poly(vinyl acetate) and poly(methyl methacrylate). In another embodiment, the blend of poly(vinyl acetate) and poly(methyl methacrylate) comprises from about 20 wt % to about 80 wt %, about 25 wt % to about 75 wt %, about 25 wt %, about 50 wt % or about 75 wt % poly(vinyl acetate). In another embodiment, the polymer layer comprises a copolymer of vinyl acetate and methyl methacrylate.

In some embodiments, the first monomeric unit is vinyl alcohol. In some embodiments, the second monomeric unit is ethylenimine. In some embodiments, the first monomeric unit is vinyl alcohol and the second monomeric unit is ethylenimine. Accordingly, the present application also includes a method for manufacturing a thin film transistor, the method comprising:
- assembling a source electrode, a drain electrode, a gate electrode and a semiconducting channel comprising a network of carbon nanotubes, such that the carbon nanotubes are electrically coupled to the source electrode and drain electrode and electrically insulated from, but capacitively coupled to, the gate electrode; and
- encapsulating the carbon nanotubes with a polymeric layer, the polymeric layer comprising a first monomeric unit that is vinyl alcohol and a second monomeric unit that is ethylenimine,
- wherein the relative amounts of the first monomeric unit and the second monomeric unit are optionally selected to provide at least one target electrical property of the thin film transistor.

In an embodiment, the polymer layer comprises a blend of poly(vinyl alcohol) and polyethylenimine. In another embodiment, the blend of poly(vinyl alcohol) and polyethyleneimine comprises at least about 0.05 wt % polyethyleneimine, for example, from about 0.06 wt % to about 20 wt %, about 0.06 wt % to about 5 wt %, about 0.06 wt % to about 1.1 wt %, about 0.06 wt %, about 0.31 wt % or about 1.1 wt % polyethyleneimine. In another embodiment, the polymer layer comprises a copolymer of vinyl alcohol and ethylenimine.

In some embodiments, the first monomeric unit is acrylic acid. In some embodiments, the second monomeric unit is vinyl alcohol. In some embodiments, the first monomeric unit is acrylic acid and the second monomeric unit is vinyl alcohol. Accordingly, the present application also includes a method for manufacturing a thin film transistor, the method comprising:
- assembling a source electrode, a drain electrode, a gate electrode and a semiconducting channel comprising a network of carbon nanotubes, such that the carbon nanotubes are electrically coupled to the source electrode and drain electrode and electrically insulated from, but capacitively coupled to, the gate electrode; and
- encapsulating the carbon nanotubes with a polymeric layer, the polymeric layer comprising a first monomeric unit that is acrylic acid and a second monomeric unit that is vinyl alcohol,
- wherein the relative amounts of the first monomeric unit and the second monomeric unit are optionally selected to provide at least one target electrical property of the thin film transistor.

In an embodiment, the polymer layer comprises a blend of poly(acrylic acid) and poly(vinyl alcohol). In another embodiment, the blend of poly(acrylic acid) and poly(vinyl alcohol) comprises at least about 0.05 wt % poly(vinyl alcohol), for example, from about 0.06 wt % to about 30 wt %, about 0.06 wt % to about 25 wt %, about 0.1 wt % to about 20 wt %, about 0.1 wt %, about 0.5 wt %, about 6 wt % or about 20 wt % poly(vinyl alcohol). In another embodiment, the polymer layer comprises a copolymer of acrylic acid and vinyl alcohol.

In the examples described hereinbelow, it was found that annealing thin film transistors having a coating of a polyethylenimine/poly(vinyl alcohol) blend resulted in a threshold voltage change in a negative direction as the annealing temperature increased. Accordingly, in some embodiments, the method further comprises, after encapsulation, heating the thin film transistor at a temperature to anneal the polymeric layer. In another embodiment, the temperature is from about 50° C. to about 140° C. In another embodiment, the temperature is about 50° C. In a further embodiment, the temperature is about 80° C. In another embodiment, the temperature is about 105° C. In a further embodiment, the temperature is about 140° C.

In the examples described hereinbelow, encapsulated devices were prepared which protected the n-type dopant 4-(2,3-dihydro-1,3-dimethyl-1H-benzimidazol-2-yl)-N,N-dimethylbenzenamine (N-DMBI) from air oxidation. Accordingly, in some embodiments, the solution further comprises an n-type dopant. In another embodiment of the present application, the method further comprises depositing a solution comprising an n-type dopant on the semiconducting channel prior to encapsulation. The n-type dopant can be any suitable n-type dopant, the selection of which can be made by a person skilled in the art. In an embodiment, the n-type dopant is 4-(2,3-dihydro-1,3-dimethyl-1H-benzimidazol-2-yl)-N, N-dimethylbenzenamine (N-DMBI). In another embodiment, the method further comprises, after encapsulation, heating the thin film transistor under conditions to activate the n-type dopant (for example, the N-DMBI).

In an embodiment, the thin film transistor is assembled into a bottom gate configuration.

The gate electrode is formed of any suitable material, the selection of which can be made by a person skilled in the art. In an embodiment, the gate electrode comprises a metal (such as but not limited to $Au^0$, $Al^0$ or $Pd^0$), a conductive oxide (such as but not limited to indium tin oxide (ITO) or ZnO), a conductive polymer (such as but not limited to poly(3,4-ethylenedioxythiophene) polystyrene sulfonate (PEDOT:PSS)), a conductive nanomaterial (such as but not limited to metallic CNTs, graphene or a blend of graphene and graphite flakes) or a conductive doped semiconductor (such as but not limited to doped silicon or doped germanium). In another embodiment, the gate electrode comprises, consists essentially of or consists of doped silicon. Methods for assembling gate electrodes formed of such materials into a thin film transistor are known and can be readily selected by a person skilled in the art.

The carbon nanotubes are electrically insulated from, but capacitively coupled to, the gate electrode by a layer comprising any suitable dielectric, the selection of which can be made by a person skilled in the art. In another embodiment, the carbon nanotubes are electrically insulated from, but capacitively coupled to, the gate electrode by a layer comprising an inorganic dielectric (such as but not limited to $SiO_2$, $HfO_2$, $SiN_x$ e.g. $SiN_4$ or $Al_2O_3$), a polymeric dielectric (such as but not limited to poly(methyl methacrylate) (PMMA), polyvinylidene difluoride (PVdF), a benzocyclobutene (BCB)-based polymer, a fluoroplastic resin e.g. Teflon™ AF or Merck Lisicon™ D139 or a poly(4-vinylphenol)-poly(methyl silsesquioxane) (PVPh-pMSS) such as Xerox xdi-dcs™) or a combination of an inorganic dielectric and a polymeric dielectric (such as but not limited to a combination of $BaTiO_3$ and PMMA). In another embodiment, the carbon nanotubes are electrically insulated from, but capacitively coupled to, the gate electrode by a layer comprising silicon dioxide. Methods for assembling such layers to electrically insulate/capacitively couple the carbon nanotubes from/to the gate electrode formed of such materials into a thin film transistor are known and can be readily selected by a person skilled in the art.

Methods for assembling a semiconducting channel comprising a network of carbon nanotubes into a thin film transistor are known and can be readily selected by a person skilled in the art. The carbon nanotubes are any suitable carbon nanotubes, the selection of which can be made by a person skilled in the art. In an embodiment, the carbon nanotubes are single-walled carbon nanotubes. In an embodiment, the single-walled carbon nanotubes are enriched in semiconducting single-walled carbon nanotubes. Carbon nanotubes enriched in semiconducting single-walled carbon nanotubes can be prepared, for example, by a process disclosed in U.S. Pat. No. 10,046,970. Accordingly, in some embodiments, prior to assembly, the carbon nanotubes are complexed with a conjugated polymer. The conjugated polymer can be any suitable conjugated polymer that will selectively fractionate semiconducting single-walled carbon nanotubes from a mixture of semiconducting and non-semiconducting single-walled carbon nanotubes, the selection of which can be made by a person skilled in the art. For example, the skilled person would readily appreciate that complexing polymers for semiconducting nanotube enrichment are conjugated and comprise, for example, thiophene, fluorene and/or pyridine moieties in homopolymers or copolymers and that side chains are useful for solubility. Accordingly, in an embodiment, the conjugated polymers is a polyfluorene, polythiophene or polyphenylenevinylene homopolymer, or a copolymer thereof with one or more co-monomer units (such as but not limited to bithiophene, phenylene, bipyridine, anthracene, naphthalene or benzothiadiazole) or combinations thereof. In another embodiment of the present application, the conjugated polymer comprises a polyfluorene derivative, for example a 9,9-dialkyl-substituted polyfluorene. In another embodiment, the alkyl groups of the 9,9-dialkyl-substituted polyfluorene are $C_{10\text{-}36}$alkyl or $C_{10\text{-}18}$alkyl. In an embodiment, the alkyl groups are linear alkyl groups. In another embodiment, the conjugated polymer is poly(9,9-di-n-dodecylfluorene); i.e. prior to assembly, the carbon nanotubes are complexed with poly(9,9-di-n-dodecylfluorene). In an embodiment, the conjugated polymer has a number average molecular weight ($M_n$) greater than about 10,000 Da, for example from about 10,000 Da to about 500,000 Da or from about 10,000 Da to about 30,000 Da.

The source and drain electrodes can be formed of any suitable material, the selection of which can be made by a person skilled in the art. In an embodiment, the source and drain electrodes comprise a conductive nanomaterial (such as but not limited to metallic CNTs, graphene or a blend of graphene and graphite flakes) or a metal (such as but not limited to $Au^0$, $Al^0$ or $Pd^0$, etc.). In another embodiment, the source and drain electrodes comprise metallic gold. Methods of assembling such source and drain electrodes into a thin film transistor are known and can be readily selected by a person skilled in the art.

In an embodiment, the polymeric layer has a thickness of greater than about 2 μm.

The present application also includes a thin film transistor manufactured by a method for manufacturing a thin film transistor of the present application. In an embodiment, the thin film transistor is a p-type thin film transistor. In another embodiment of the present application, the thin film transistor is an n-type thin film transistor. In a further embodiment, the thin film transistor is an ambipolar thin film transistor. A person skilled in the art could readily determine whether a particular transistor is a p-type thin film transistor, an n-type thin film transistor or an ambipolar thin film transistor in light of their common general knowledge and with reference to the teachings of the present application.

The present application also includes a p-n junction diode comprising a thin film transistor that is a p-type thin film transistor of the present application coupled to a thin film transistor that is an n-type thin film transistor of the present application. Suitable means for coupling thin film transistors to each other to obtain a p-n junction diode can be selected by the person skilled in the art.

The following non-limiting examples are illustrative of the present application:

EXAMPLES

Example 1: Fabrication and Testing of Polymer Encapsulated Carbon Nanotube Network Thin Film Transistors I. Materials and Methods Unless noted otherwise, all materials were used as purchased. The following polymers were acquired: poly(methyl methacrylate) (medium MM, Aldrich, cat. no 18, 224-9), polystyrene ($M_N$=45k, Aldrich, cat. no 33, 165-1), poly(vinylidene difluoride) (Aldrich, cat. no 18, 270-2), nylon 6-6 (Aldrich, cat. no 18, 112-9), cellulose acetate (39.8 wt % acetyl content, avg. $M_N$=30k (GPC), Aldrich), poly(2-vinyl pyridine) (MW 40k, cat. no 21382-10), Teflon AF (Dupont, grade 400S2-100-1), poly(vinylidene chloride-co-methyl acrylate) (MW ~90k, Aldrich, cat. no 430404), poly(vinyl acetate) (MW ~100k, Aldrich, cat. no 189480), cellulose nitrate (collodion solution, Aldrich, cat. no 09986). The poly(styrene-co-2-vinyl pyridine) copolymers were purchased from Polymer Source Inc. with various molar fractions of styrene to 2-vinyl styrene monomers and had the following characteristics: 11.5 mol % 2VP, cat. no P7612-S2VPran, $M_N$=34.5k, $M_W$=46.5k; 25 mol % 2VP, cat. no P7610-S2VPran, $M_N$=28k, $M_W$=38.5k; 25 mol % 2VP, cat. no P7611-S2VPran, $M_N$=36.5k, $M_W$=47.5k; 77 mol % 2VP, cat. no P7616-S2VPran, $M_N$=28.5k, $M_W$=44.8k). Blends were obtained by mixing two homopolymers (P2VP/PS) at the given weight fractions in a common solvent.

CNN-TFT Fabrication: The carbon nanotube network thin film transistors (CNN-TFT), specifically CNN-FETs, were fabricated using the following procedure: The substrates, complete with pre-existing source-drain electrodes, were purchased from the Fraunhofer Institute (Dresden). They are made up of degenerately doped silicon wafers with 90 or 230 nm of thermal grown silicon dioxide with interdigitated gold electrodes deposited on top of the dielectric. The channel width was 2 mm with available channel lengths of 2.5, 5, 10 and 20 μm. Alternatively, substrates with 1000 nm thermal oxide were used. Those substrates had electrodes deposited by electron beam evaporation (Ti/Au), forming a rectangular channel 40 μm long and 1000 μm wide. Substrates were cleaned first by ultrasonication in acetone for 5 minutes, followed by 5 minutes of ultrasound in isopropyl alcohol (IPA). Substrates were blown dry using a stream of $N_2$, then immediately placed in an ultra-violet (UV)/ozone cleaner for 30 minutes. Substrates were used within 20 minutes for the SWCNT deposition step. A solution of enriched semiconducting poly(9,9-di-n-dodecylfluorene) (PFDD)-wrapped carbon nanotubes[26] was prepared at an approximate concentration of 2 μg/mL in toluene from dilution of a 480 μg/mL mother solution. The diluted solution was subjected to ultrasound for 90 minutes prior to SWCNT deposition. For SWCNT deposition, the soaking method was used. Specifically, substrates were placed in a Petri dish, and then covered with the 2 μg/mL SWCNT solution. The Petri dish was covered for 16 minutes to avoid evaporation of the solvent. After this time, the substrates were rinsed for 5 minutes in toluene, then 5 minutes in IPA, then finally dried by a jet of $N_2$. The samples were baked on a hot plate at 150° C. for 5 minutes. To complete the CNN-TFT fabrication, the edges of the substrate were gently wiped using a clean room grade swab dipped in methanol. The substrate back side was scratched using a diamond scribe and the gate electrical contact was established using copper tape (temporary) or silver lacquer (permanent).

Polymer Encapsulation: Polymer encapsulation was performed using the following procedure: CNN-TFT samples were annealed at 200° C. overnight under rough vacuum and were kept on a hot plate at 150° C. prior to encapsulation. The annealing step reduces the amount of water at the $CNT/SiO_2$ interface, and consequently lessens the p doping effect of the $O_2/H_2O$ redox couple[12] and improves n type conduction after encapsulation. A smaller quantity of oxidative species at the interface is likely to promote n doping stability. Dedoping of the CNTs by annealing typically decreases the current density of the p branch and improves the hysteresis and off-state current.

Polymer solutions were prepared in advance in an appropriate solvent and concentration. Conditions are listed for each polymer in Table 1. The encapsulation step was carried out using spin coating, where the CNN-TFT sample was briefly cooled down, set on a vacuum chuck, then covered with the polymer solution. Spin coating proceeded in two stages, at speeds and times listed in Table 2. A bake, sometimes in two steps, was done afterwards to remove the residual solvent. Finally, the electrode pads were opened up using a blade manipulated under a stereomicroscope. Blends were obtained by mixing two homopolymers (P2VP/PS, PVAc/PMMA) at the given weight fractions in a common solvent. Copolymers were purchased from Polymer Source Inc with various molar fractions of styrene to 2-vinyl styrene monomers.

Generation of the 'Master' Relationship: A modified measurement technique was implemented that tracks the threshold voltage of a device in order to obtain the transfer characteristics with constant gate-induced charge density limits of −650 to +650 μC/m² for all encapsulated devices, regardless of the relative dielectric permittivity of the capping polymer. First, the effective relative dielectric permittivity of the assembly of the underlying silicon dioxide ($\varepsilon_r^{sub}$~3.9) and the capping dielectric (variable $\varepsilon_r^{cap}$, Table 3) were evaluated according to the relation $\varepsilon_r^{eff}=(\varepsilon_r^{sub}+\varepsilon_r^{cap})/2$. The capacitance per surface area in a parallel plate approximation was thus estimated as $C^{eff}=\varepsilon_0\varepsilon_r^{eff}/d$, where d is the gate dielectric thickness. The gate-induced charge density $Q_{ind}$ is the product of the effective surface capacitance and the overdrive voltage ($V_G-V_T$): $Q_{ind}=C_{eff}(V_G-V_T)$. Then, transfer characteristics were obtained using gate potentials that are equivalent to $Q_{ind}$ bounded by the limits −650 and +650 μC/m². The range of gate potentials thus becomes dependent on the threshold voltage $V_T$ of the device. First, 3 full transfer characteristics were acquired with $V_T$ arbitrarily set to 0 V, before evaluating $V_T$ on the fly and adjusting the $V_G$ limits accordingly. For every subsequent sweep, $V_T$ was reevaluated and the $V_G$ limits were readjusted to correspond to −650 and +650 μC/m². Because the measurement imposes a gate bias stress to the dielectric, the $V_T$ value will monotonously drift and tend to an equilibrium value. Therefore, a total number of 16 sweeps was acquired for each device, and the last quasi equilibrium value of $V_T$ was kept for the 'master' relationship. Knowing the $V_T$ value for the encapsulated device, the measurement of the charge density at $V_T$ was then obtained. The setup was made up of a capacitive brass probe with a 2.38 mm (3/32 in) circular cross-section held 500 μm above the sample, which was laid on a large brass plate connected to the back gate electrode. The sample was first discharged: a grounded probe tip was connected to the drain electrode with the gate electrode also grounded and the sample was discharged for 60 seconds, at which point the grounded tip was disconnected. The probe tip was then connected to the sample's drain electrode while biased at a potential equal to $V_T$ for 60 seconds, at which point the probe tip was disconnected while still being biased. The sample charge density was measured by moving the sample underneath the capacitive probe, while measuring the induced voltage using an electrometer, with the grounded brass plate used as a reference. The charge density was evaluated as the difference between the voltage at the grounded brass plate reference and the voltage above the encapsulated sample. This charging state corresponds to a state where the gate-induced charge density $Q_{ind}$ is minimal because $V_G$~$V_T$, and where the measured charge density corresponds mainly to the charges at the CNTs-polymer interface due to the chemical nature of the polymer that maintains a built-in potential influencing $V_T$. Repeating this cycle of measuring the $V_T$ using the on-the-fly tracking technique followed by a measurement of the charge density at $V_T$ for every encapsulating homopolymers, a 'master' relationship can be generated reflecting the built-in potential at the interface and thus yielding a predictive power to select a polymer for a desired electrical property, for instance the threshold voltage.

N-type Doping: A solution of 4-(2,3-dihydro-1,3-dimethyl-1H-benzimidazol-2-yl)-N,N-dimethylbenzenamine (N-DMBI, Sigma-Aldrich) was prepared in ethanol at a concentration of 10 mg/mL. CNN-TFT samples were prepared the day before using the above procedure and kept at 200° C. under rough vacuum until doping. Doping was performed by spin coating of the N-DMBI solution at 1000 rpm for 1 minute. A further encapsulation step was performed on one of the samples. A solution of 10 mg/mL N-DMBI in P2VP 15% w/V was prepared in chloroform. Capping was carried out using spin coating of this solution (stage 1: 9 sec at 800 rpm, stage 2: 30 sec at 3000 rpm). The n-type dopant was activated by baking at 80° C. overnight under rough vacuum.

For diode fabrication a solution of 0.2% w/w N-DMBI was prepared in 1-hexanol. P2VP was added to a 20% w/w concentration and stirred for 3 hours. The p-n junction was made by covering approximately half of the channel with a stripe from this solution, using a poly(ethylene terephthalate) blade attached to a three-axis translation stage for fine control. Balancing of the doping of the p and n regions is necessary in the fabrication of a p-n junction because this is how the built-in field is established. We thus adjusted the N-DMBI concentration such that the p-n junction's maximal drain-source current would be reached close to $V_G=0$ V and found 0.2% w/w to work.

II. Results (a) Encapsulation with PS-P2VP Copolymers and Blends

Figure 2:
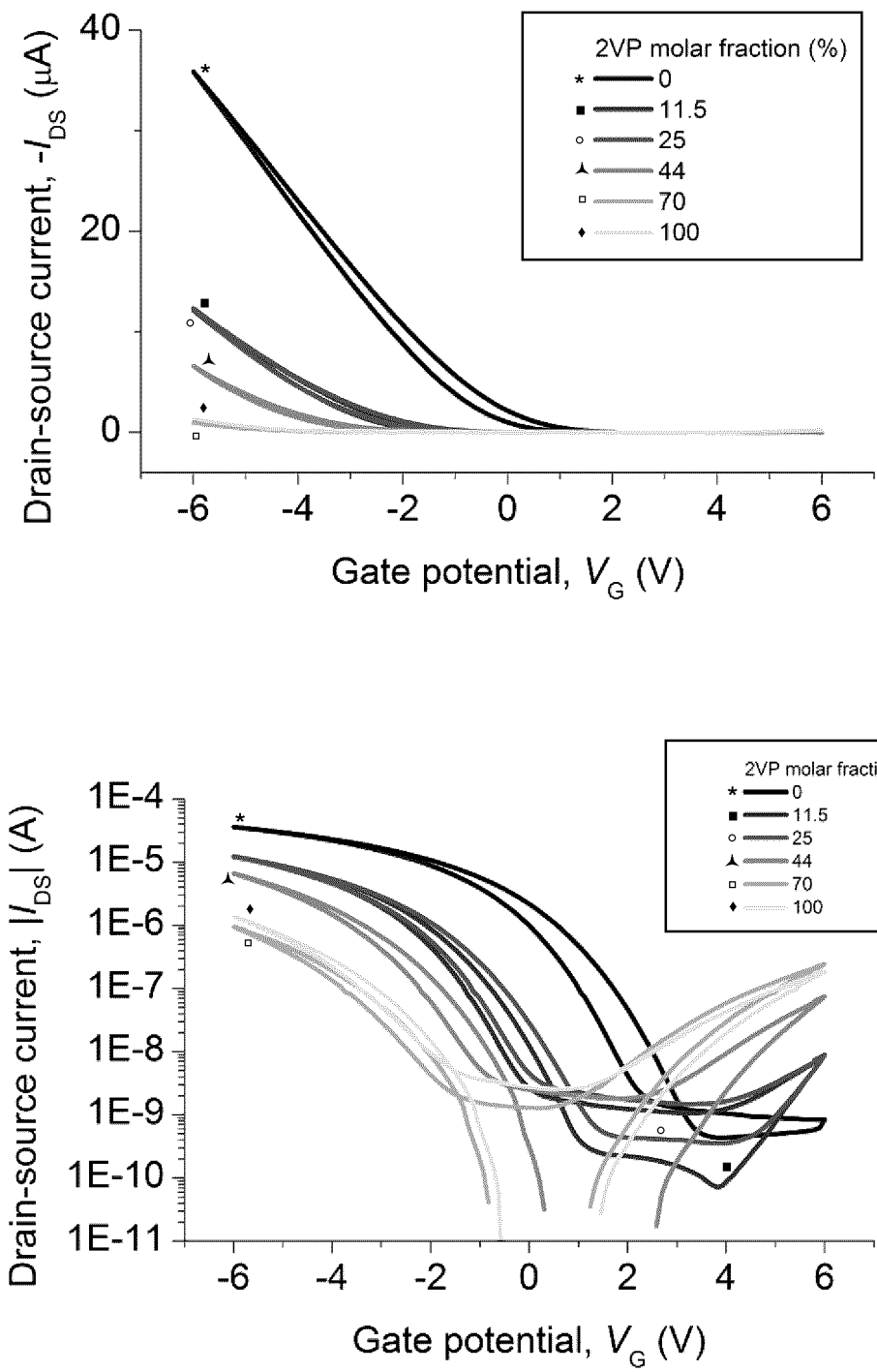
FIG. 2 shows plots of the transfer characteristics of CNN-TFTs encapsulated with statistical copolymers having various molar fractions of 2-vinylpyridine (2VP) monomer according to embodiments of the present application compared to homopolymeric poly(2-vinylpyridine) (P2VP) and polystyrene (PS) showing the displacement of threshold voltage $V_T$ along with a decrease of the drain-source current $I_{DS}$: Linear y scale (upper); Logarithmic y scale (lower).
Figure 3:
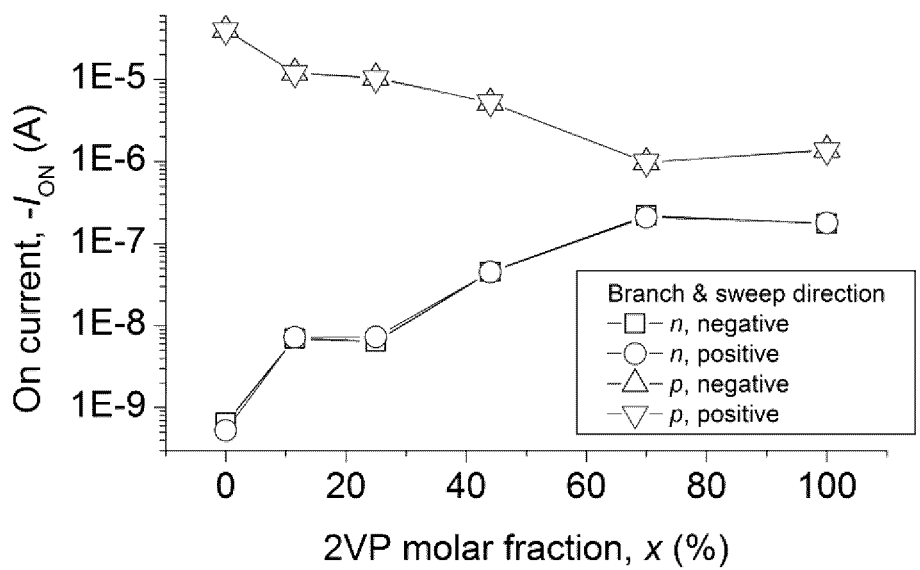
FIG. 3 is a plot showing the extracted ON current $-I_{ON}$ of CNN-TFTs encapsulated with statistical copolymers having various molar fractions of 2VP monomer according to embodiments of the present application compared to homopolymeric P2VP and PS.
Figure 4:
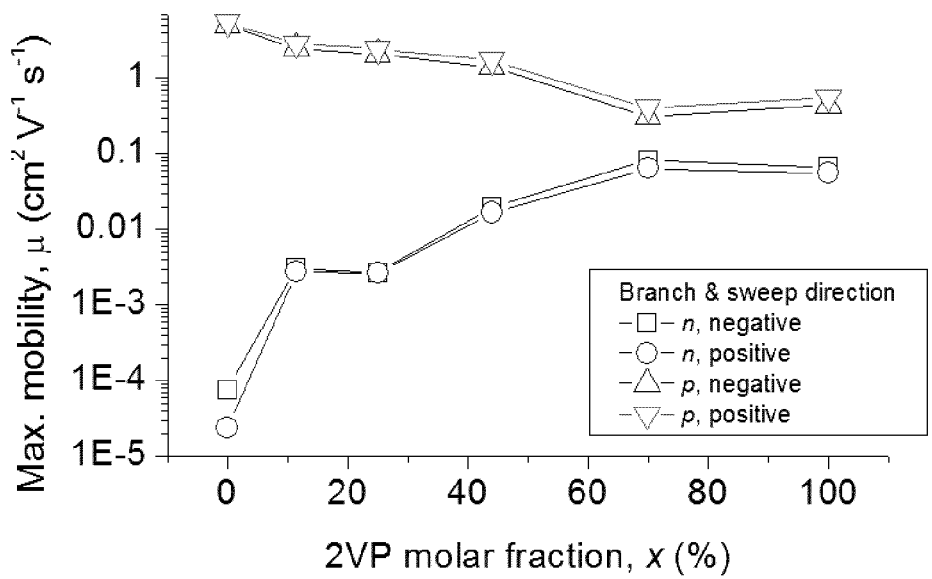
FIG. 4 is a plot showing the extracted mobility u of CNN-TFTs encapsulated with statistical copolymers having various molar fractions of 2VP monomer according to embodiments of the present application compared to homopolymeric P2VP and PS.
Figure 5:
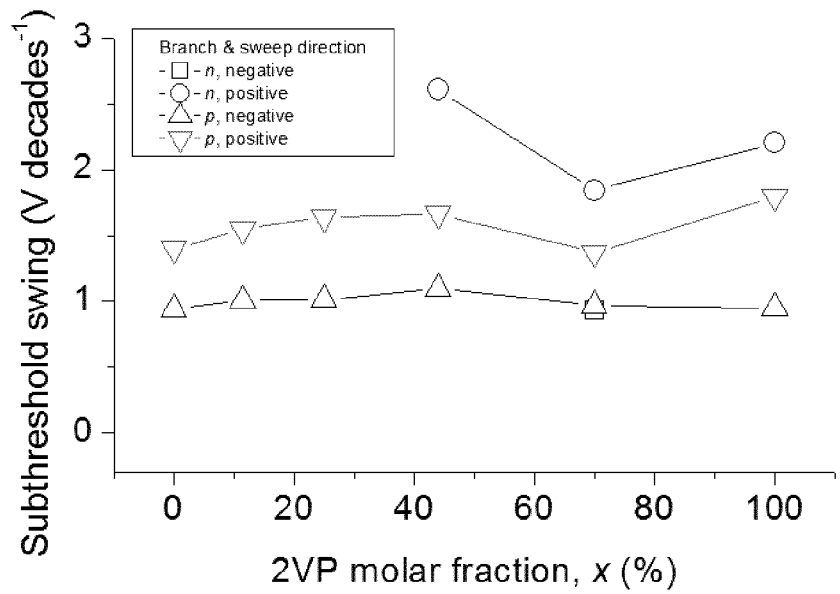
FIG. 5 is a plot showing the extracted subthreshold swing of CNN-TFTs encapsulated with statistical copolymers having various molar fractions of 2VP monomer according to embodiments of the present application compared to homopolymeric P2VP and PS.
Figure 6:
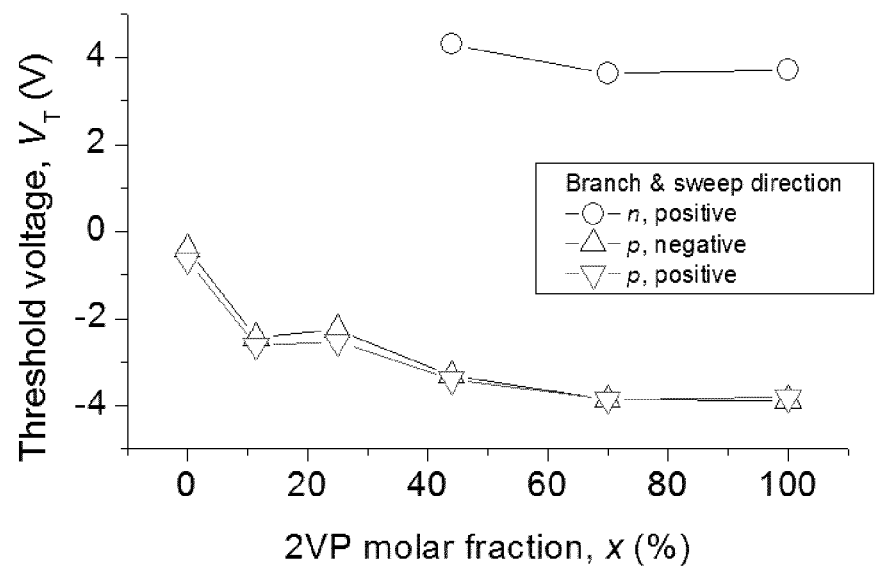
FIG. 6 is a plot showing the extracted threshold voltage $V_T$ of CNN-TFTs encapsulated with statistical copolymers having various molar fractions of 2VP monomer according to embodiments of the present application compared to homopolymeric P2VP and PS.
Figure 7:
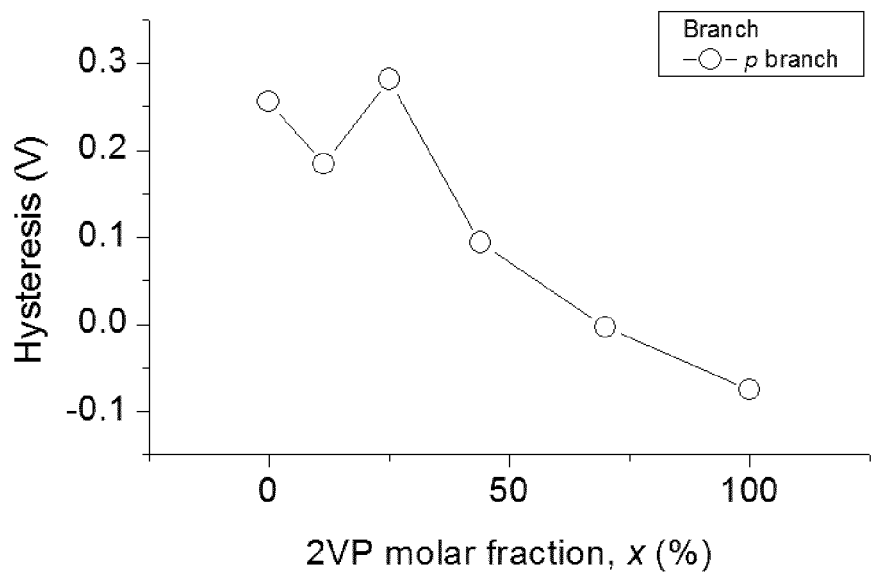
FIG. 7 is a plot of the extracted hysteresis of CNN-TFTs encapsulated with statistical copolymers having various molar fractions of 2VP monomer according to embodiments of the present application compared to homopolymeric P2VP and PS.

FIG. 2 shows plots of the transfer characteristics of CNN-FETs (Fraunhofer chips, Gen 5, 230 nm oxide, channel dimensions: 20×2000 μm) encapsulated with statistical poly(styrene-co-2-vinylpyridine) copolymers having various molar fractions of 2VP monomer (11.5, 25, 44 and 70%) compared to homopolymers of P2VP and PS showing the displacement of threshold voltage $V_T$ along with a general decrease of the drain-source current $I_{DS}$ with increasing molar fraction of 2VP. Notably, CNN-FETs encapsulated with pure P2VP (100%) yields balanced ambipolar transport in ambient. Other 2VP-rich (for example: 40, 70 2VP mol %) copolymer encapsulating layers also modify the CNN-FET transfer characteristics to display an important n branch. FIG. 3 shows the extracted ON current $-I_{ON}$ of the CNN-TFTs encapsulated with statistical poly(styrene-co-2-vinylpyridine) copolymers having various molar fractions of 2VP monomer (11.5, 25, 44 and 70%) compared to homopolymers of P2VP and PS. The absolute value of the ON current $|I_{ON}|$ of the p branch is seen to decrease with the 2VP molar fraction, while the absolute value of the ON current $|I_{ON}|$ of the n branch increases. FIG. 4 shows the extracted mobility u of CNN-TFTs encapsulated with statistical poly (styrene-co-2-vinylpyridine) copolymers having various molar fractions (11.5, 25, 44 and 70%) of 2VP monomer compared to homopolymers of P2VP and PS. Following the trends of the ON currents, the calculated mobilities of the p and n branches show an inverse and a direct dependency on the 2VP molar fraction, respectively. FIG. 5 shows the extracted subthreshold swing of CNN-TFTs encapsulated with statistical poly(styrene-co-2-vinylpyridine) copolymers having various molar fractions (11.5, 25, 44 and 70%) of 2VP monomer compared to homopolymers of P2VP and PS. Here, the subthreshold swing exhibits only minor variations with the blend composition. FIG. 6 shows the extracted threshold voltage $V_T$ of CNN-TFTs encapsulated with statistical poly(styrene-co-2-vinylpyridine) copolymers having various molar fractions (11.5, 25, 44 and 70%) of 2VP monomer compared to homopolymers of P2VP and PS. The threshold voltages determined for the p and n branches were observed to smoothly shift towards lower values with increasing 2VP content. This is an indication of the ability to tune the threshold voltage of CNN-TFTs by controlling the composition of the copolymer. FIG. 7 shows the extracted hysteresis of CNN-TFTs encapsulated with statistical poly(styrene-co-2-vinylpyridine) copolymers having various molar fractions (11.5, 25, 44 and 70%) of 2VP monomer compared to homopolymers of P2VP and PS. In similarity with the trend observed for the threshold voltage, hysteresis is also affected by the 2VP molar fraction. The trend shows that hysteresis is generally reduced by a larger content of 2VP in the copolymer.

Figure 8:
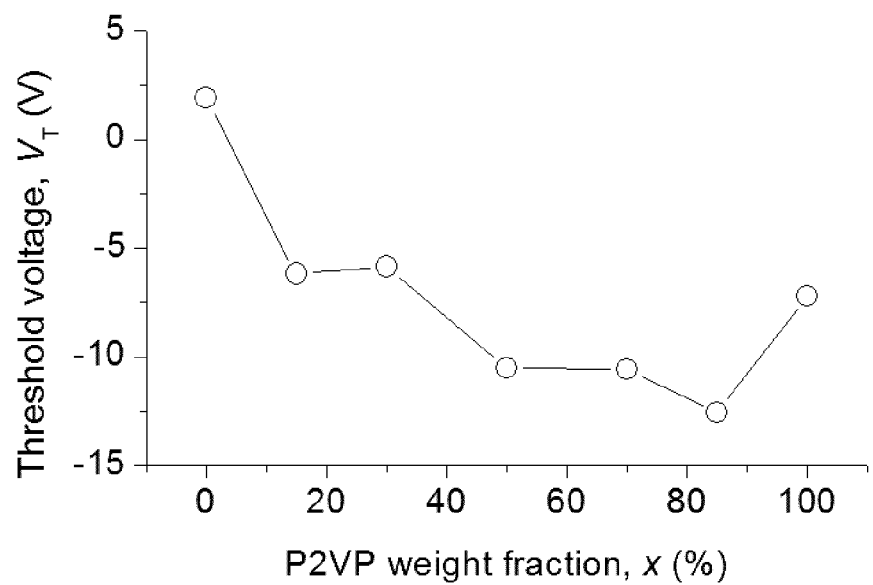
FIG. 8 is a plot of the extracted threshold voltage $V_T$ of CNN-TFTs encapsulated with blends of P2VP/PS having various weight fractions of P2VP according to embodiments of the present application compared to neat P2VP and PS.

FIG. 8 shows the extracted threshold voltage $V_T$ of CNN-TFTs encapsulated with blends of P2VP/PS having various weight fractions (15, 30, 50, 70 and 85%) of P2VP compared to neat P2VP and PS. In accordance with the observations on statistical poly(styrene-co-2-vinylpyridine) copolymers encapsulations, the threshold voltage of CNN-TFTs encapsulated with binary polymer blends is also shifted according to the composition of the blend, where more negative values of the threshold voltage were observed for higher weight fractions of P2VP. While not wishing to be limited by theory, other factors can affect the threshold voltage, such as CNT coverage on the substrate, which might explain the discrepancy of the 100% P2VP point with the general trend.

(b) Encapsulation with PVAc-PMMA Blends

Figure 9:
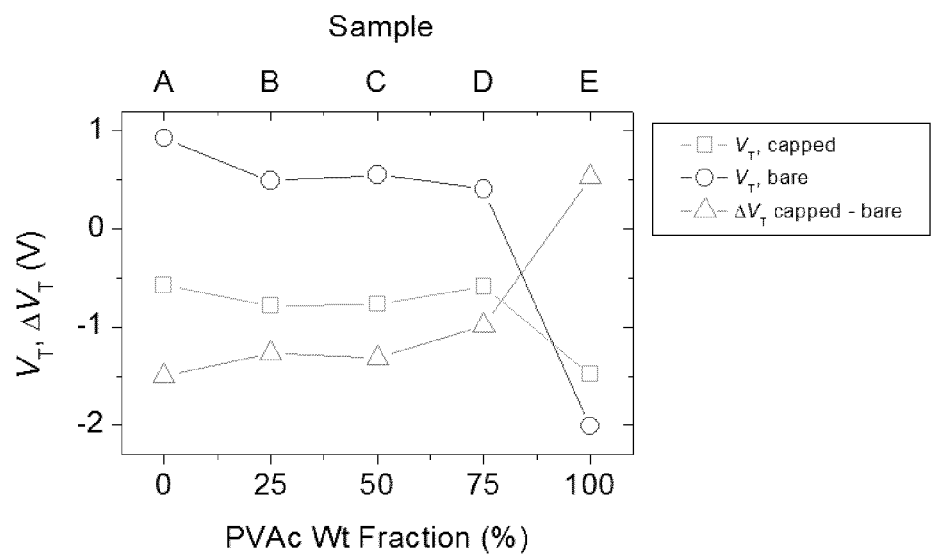
FIG. 9 is a plot of the extracted threshold voltage $V_T$ of CNN-TFTs encapsulated with blends of poly(vinyl acetate)/poly(methyl methacrylate) (PVAc/PMMA) having various weight fractions of PVAc according to embodiments of the present application compared to neat PVAc and PMMA.

FIG. 9 shows the extracted threshold voltage $V_T$ of CNN-TFTs, FETs (Fraunhofer chips, Gen 5, 230 nm oxide, channel dimensions: 20×2000 μm), encapsulated with blends of PVAc/PMMA having various weight fractions (25, 50 and 75%) of PVAc compared to neat PVAc and PMMA. Comparing the extracted threshold voltages of the devices before and after encapsulation, the difference between the threshold voltages before and after encapsulation demonstrates that the threshold voltage is continuously displaced by a value that is dependent on the PVAc weight fraction in the blend.

(c) Master Relationship of p-Branch Threshold Voltage

Figure 10:
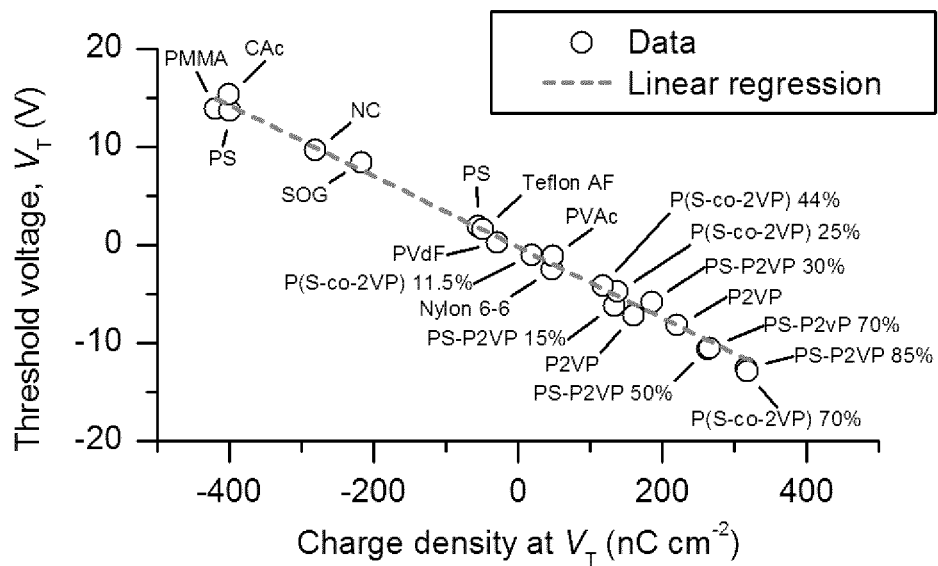
FIG. 10 is a plot showing the relationship of the p branch threshold voltage to the charge density with a capacitive probe for various homopolymers, blends and copolymers. Adj. $R^2$: 0.967, intercept: (−0.2±0.2) V, slope: (−0.036±0.001) V cm$^2$/μC, capacitance per area: about 28 nF/cm$^2$.

FIG. 10 shows a 'master' relationship of the p branch threshold voltage (CNN-TFTs, Fraunhofer chips, Gen 5, 230 nm oxide, channel dimensions: 20×2000 μm) as a function of the charge density obtained as described hereinabove in the Materials and Methods section of Example 1 for the homopolymers, blends and copolymers listed in Table 3. It will be appreciated that the threshold voltage may be sensitive to factors such as the total SWCNT coverage, the thermal history and/or exposition to oxidizing or reducing species. However, such a plot can be used, for example, to select a polymer, blend or copolymer to use to encapsulate a CNN-TFT that will provide a desired threshold voltage for the device.

(d) Devices Doped with N-DMBI

Figure 11:
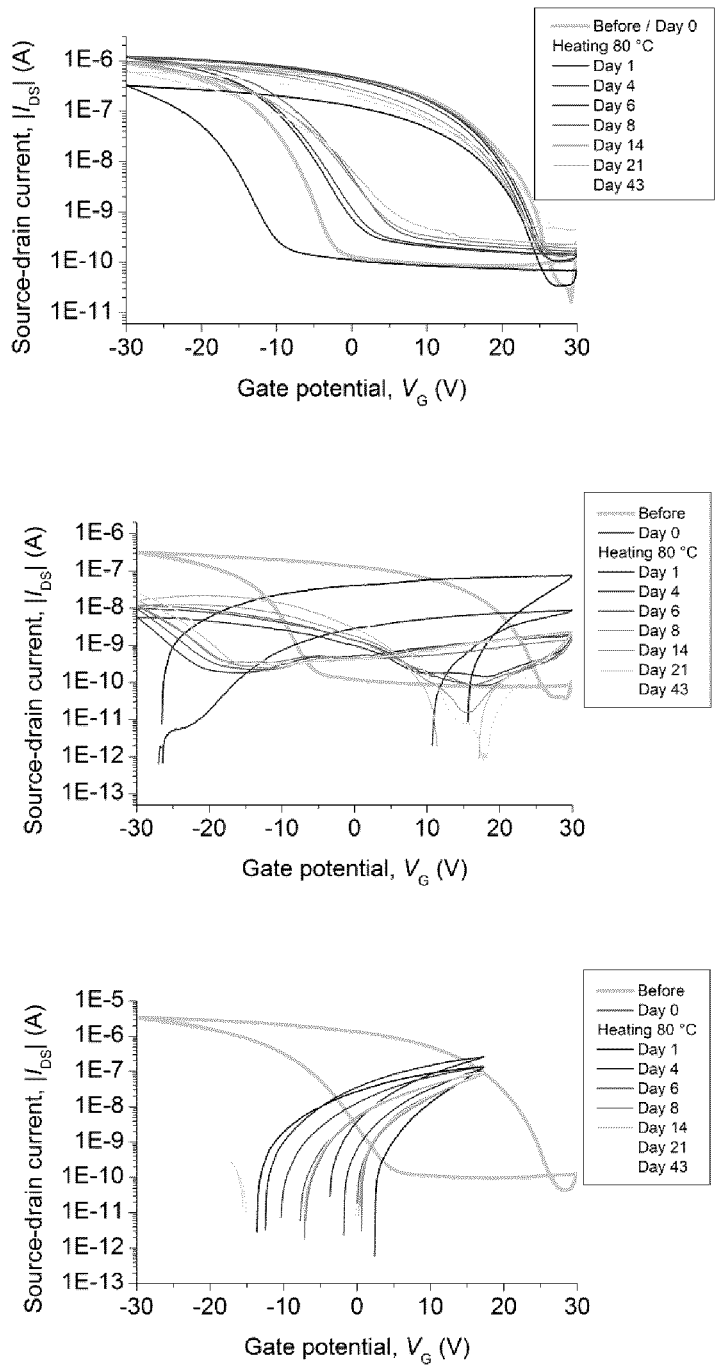
FIG. 11 shows plots of the evolution of transfer characteristics of CNN-TFTs over 43 days. Channel dimensions: 40×1000 μm, gate oxide thickness: 1000 nm, $V_{DS}$=−1 V, gate swept between ±650 μC m$^{-2}$: Control (top); Doped with 1,3-dimethyl-2-phenyl-2,3-dihydro-1H-benzoimidazole (N-DMBI), unprotected (middle); Doped with N-DMBI and encapsulated with P2VP (bottom).

FIG. 11 shows the evolution of transfer characteristics of CNN-TFTs (channel dimensions: 40×1000 μm, 1000 nm oxide) over a period of 43 days for an uncoated, un-doped CNN-TFT control (upper plot) in comparison to an uncoated CNN-TFT doped with N-DMBI (middle) and a CNN-TFT doped with N-DMBI and encapsulated with P2VP also containing N-DMBI (bottom). The gate potential limits in the bottom plot were adjusted to compensate for the change in gate capacitance due to encapsulation. A CNN-TFT treated with the n-dopant (middle) shows at first a complete change in its characteristics going from p type to n type.

Figure 12:
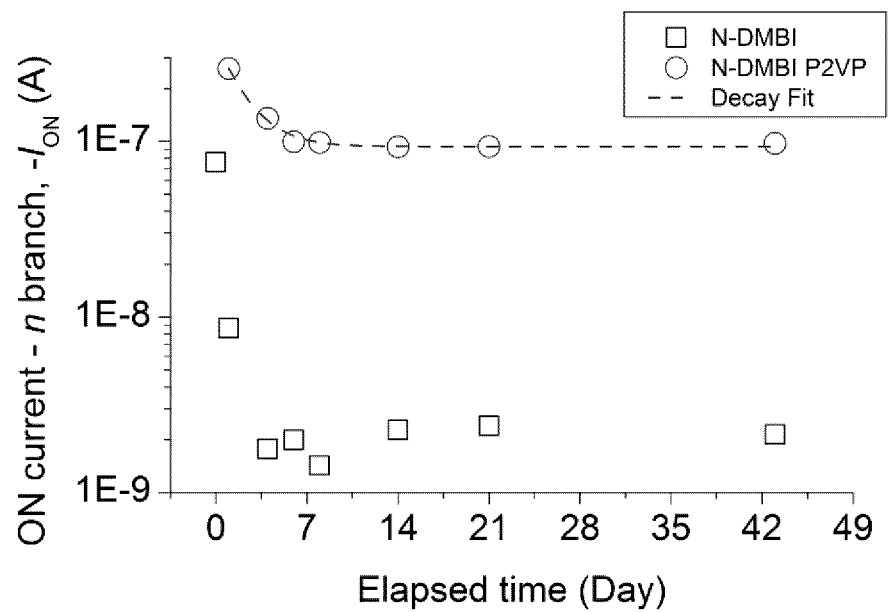
FIG. 12 is a plot showing the evolution of ON current evaluated for the n branch of CNN-TFTs doped with N-DMBI and protected by encapsulation (○) or not (□) with P2VP.

However, this effect is lost in less than a week due to the action of the $O_2/H_2O$ redox couple in air. In comparison, a CNN-TFT treated with N-DMBI and encapsulated with P2VP containing N-DMBI also exhibits a complete change to n type behaviour, but also retains its n type characteristics for up to 43 days, therefore demonstrating good stability against oxidation by the $O_2/H_2O$ redox couple. FIG. 12 shows the evolution of ON current evaluated for the n branch of CNN-TFTs doped with N-DMBI and protected by encapsulation or not with P2VP. A fit of an exponential decay over the data for the protected device yields a characteristic time of approximately 2 days, which implies that the characteristics of the device have stabilized after this brief period. In contrast, the unprotected device shows a decrease of the n branch ON current by 2 orders of magnitude.

(e) Diode Fabrication and Testing

Figure 24:
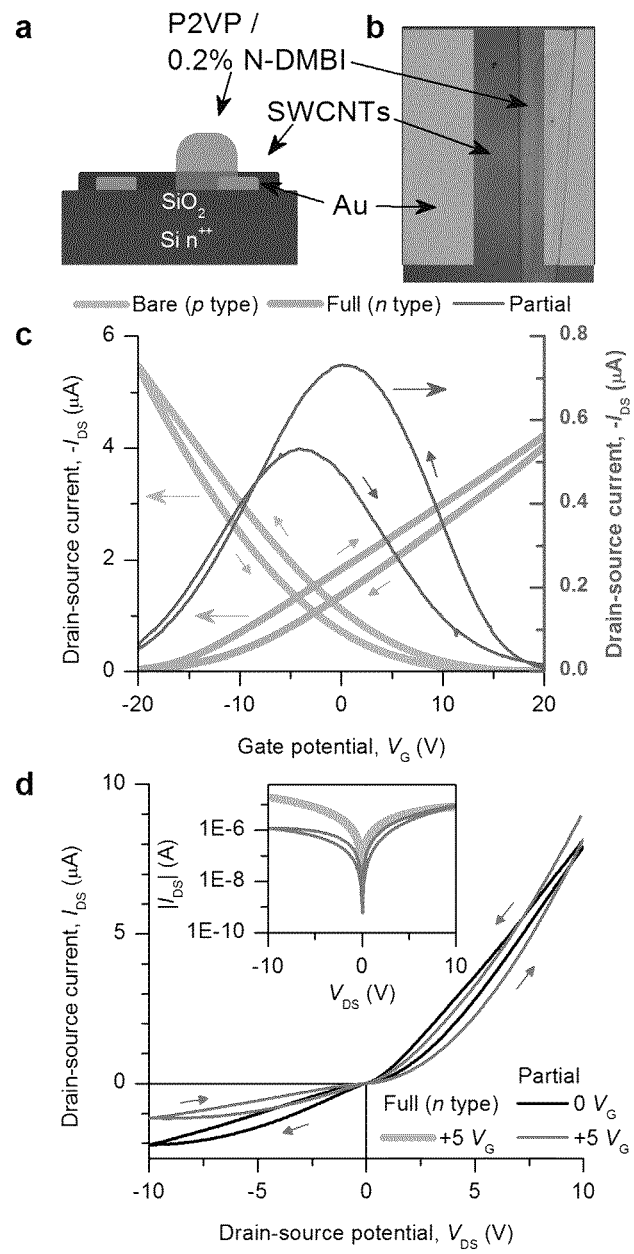
FIG. 24 (a) Schematics of the diode. (b) Picture of the diode showing the partially encapsulated channel. (c) Transfer characteristics of the device prior (bare, red) and after partial encapsulation of the channel (partial, violet), and of a fully encapsulated CNN-FET (blue) for comparison. (d) Output characteristics of the partially covered diode showing rectification. Inset: Comparison to a fully covered device on a log scale.

Stable n type CNN-FETs based on the N-DMBI and P2VP combination have been tested in the simplest of device, a diode working on the principle of a p-n junction.[36] Using fairly large channels, 650×2000 µm, a p-n junction was created by covering half of the channel with 0.2% w/w N-DMBI and 20% w/w P2VP [FIGS. 24(*a*) and (*b*)]. The stripe of P2VP containing N-DMBI forms the n region of the diode while the p region forms naturally from air exposure. Balancing of the doping of the p and n regions is crucial in the fabrication of a p-n junction because this is how the built-in field is established. We thus adjusted the N-DMBI concentration such that the p-n junction's maximal drain-source current would be reached close to $V_G$=0 V and found 0.2% w/w to be optimal. FIG. 24(*c*) shows the transfer characteristics of the device before encapsulation where a unipolar p type device is obtained with 5.5 µA on-state current, 5500 on/off ratio and 29.7 $cm^2/V$ s maximum mobility. A similar device fully encapsulated with N-DMBI/P2VP displays a unipolar n type characteristic 4.2 µA on-state current, 125 on/off ratio and 11.5 $cm^2/V$ s maximum mobility. The two transistor types are fairly symmetric and good diode properties may be expected around $V_G$=0 V. As shown in FIG. 24(*c*), the transfer characteristic of the p-n device follows the expected dumbbell shape output for p and n polarity transistors connected in series. The maximum current of 730 nA (negative-going sweep) close to $V_G$~0 V is also consistent with this picture. Since the device in not fully encapsulated, a hysteresis is still present and may be more significant than for unipolar p-type transistor. Current-voltage characteristics reveal a modest level of rectification 4:1 at $V_G$=0 V [FIG. 24(*d*)]. The rectification ratio improves to 8:1 when the gate potential is raised to +5 V. Breakdown is not observed within the $V_{DS}$ range. In comparison, the output characteristics of a fully encapsulated n type device [FIG. 24(*d*), inset] at $V_G$=+5 V shows approximate ohmic behavior. While the performance of p-n diodes can be improved with further optimization, this work highlights the ease of fabrication of complementary electronic elements with materials and process relevant to printing.

III. Discussion

In contrast to the in situ polymerization of poly(4-vinyl pyridine) that was reported by Hartmann et al., the encapsulation technique used in the present Example did not create structural defects in the carbon nanotube material. The layer can be prepared through other mild techniques compatible with printed and/or flexible electronics in addition to the spin coating used herein, e.g. drop casting and printing, and the processing can be under ambient conditions.

Blends of polymers or co-polymers were used to adjust the transistor electrical properties (such as the threshold voltage) to obtain behaviours ranging from complete p-type to ambipolar and largely n-type. While not wishing to be limited by theory, this effect is thought to arise from dipoles and charge traps at the interface between the carbon nanotubes and the dielectric polymer blends and co-polymers, and charges within the dielectric bulk, that affect the electrostatics felt by the carbon nanotubes. The electrical properties of carbon nanotube transistors can be continuously adjusted by using combinations of polymers, the polymers being selected according to their respective transistor performance (preferably but not exclusively p- and n-type). Knowledge of the charge accumulated at the interface directly translated into a threshold voltage according to a "master" relationship, for numerous homopolymers, copolymers and polymer blends. For example, while not wishing to be limited by theory the results in FIG. 10, show that it may be possible to control the density and nature of these dipoles and traps by appropriately selecting the dielectric based on their chemical groups and electronegativity. The devices can be prepared without special cares, e.g., in ambient. The encapsulated devices have been shown to have significant stability in ambient air over a timescale of months.

Figure 25:
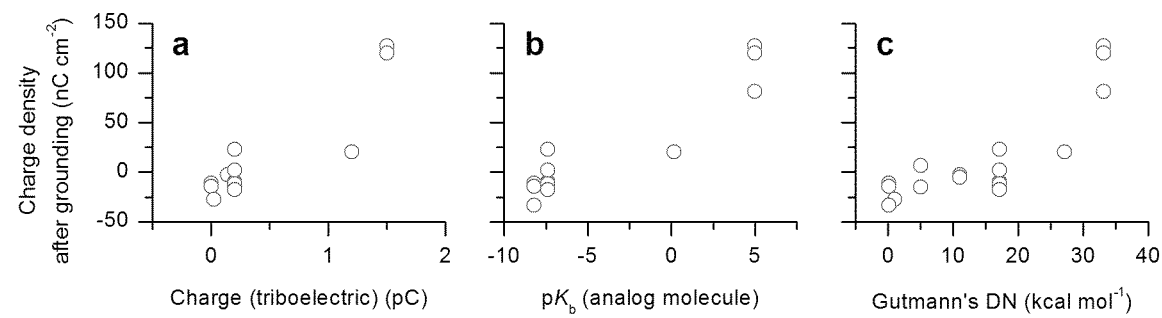
FIG. 25 shows the charge density measured after grounding the samples for various encapsulation dielectrics. (a) Versus the charge uptake after triboelectric contact.[36]; (b) Versus the p$K_b$ of an analog molecule to the polymer[37]; (c) Versus the Gutmann's donor number of an analog molecule to the polymer.[38]

Reports have correlated the charge uptake to the $pK_b$ (basicity index) of an analogue to the polymer.[37] Following the same route, we were only able to verify qualitatively this observation with our system (see FIG. 25). Our observations indeed show a weak correlation of the measured charge density in this work with the triboelectric charge from Diaz et al.[37] Similarly, a weak dependency could be observed with respect to the $pK_b$ and the Gutmann's donor number of analog molecules. Therefore, the ability of the surface to act as a base in the Lewis sense is a factor to consider when choosing an encapsulating material for SWCNT devices. Our results are in agreement with the model put forth by Fowkes et al.[39] relating the acid-base properties of a surface to its position on the triboelectric series.[39]

Additionally, the results for 2VP suggest that hydrophobic dielectrics that effectively set the p-branch threshold voltage to negative values relative to the natural threshold can also be an effective encapsulating layer to protect n-type dopants such as 4-(2,3-dihydro-1,3-dimethyl-1H-benzimidazol-2-yl)-N, N-dimethylbenzenamine (N-DMBI) from air oxidation. Thus, air-stable operation of such devices over long times (e.g. weeks, months) is possible.

In summary there is a simple linear relationship between $V_T$ and the charge accumulated at the immediate carbon nanotube interface. With a better handle on the electrostatic environment and associated charge trap density, reduced day-to-day and device-to-device variations can be expected. Poly(2-vinylpyridine) (P2VP) was found to produce the most negative threshold voltage for hole transport while polystyrene (PS) had amongst the most positive. A combination of the two polymers in a blend or as copolymers allows a continuous tuning of transistor parameters. Moreover, the addition of an electron-donating molecule, 4-(2,3-dihydro-1,3-dimethyl-1H-benzimidazol-2-yl)-N, N-dimethylbenzenamine (N-DMBI), to P2VP converts an ambipolar transistor to an air stable unipolar n type one. This simple materials combination is a concrete solution to the complementary p and n type transistors required to implement logic gates in printable electronics, in analogy to CMOS devices. This work is readily transferrable to printing in ambient as a low temperature process for low-cost and flexible electronics.

Example 2: Coating the Channel of SWCNT Network Based Bottom Gated TFTs with Thin Layers of Water Soluble Polymers of Varying Compositions I. Experimental Section SWCNT network and TFT device fabrication: High purity PFDD/sc-SWCNT solution was prepared as described in Ding et al.[27] with a polymer/tube ratio of 4.0 and tube concentration at 30 mg/L. The TFT devices, complete with pre-existing source-drain electrodes, were purchased from the Fraunhofer Institute (Dresden). They are made up of degenerately doped silicon wafers with 230 nm of thermal grown silicon dioxide with interdigitated gold electrodes deposited on top of the dielectric. The channel width was 2 mm with channel lengths of 5, 10 and 20 µm. A channel length of 2.5 µm is also available. The chips were soaked in a 5% Hellmanex solution for 20 min at 60° C. before being rinsed with water and isopropanol, then blow-dried with nitrogen. The polymer/tube dispersion (0.1 mL) was then dropped on the chip surface and the chip was soaked for 10 min under toluene vapor. The chip was then rinsed with toluene (5 mL) and blow dried with nitrogen before being annealed at 200° C. for 10 min in air. TFTs without a coating (control), and with various coatings as described in greater detail below on the channel were prepared and tested.

Water soluble polymer coating: Polyvinyl alcohol (98% hydrolyzed) from Matheson Coleman & Bell, polyvinylpyrrolidone ($M_W$ about 40k) from Alfa Aesar, polyacrylamide (high $M_W$, slightly cationic) from Cyanamid Superflac, poly(acrylic acid) solution (35 wt %, average $M_W$ about 250,000), branched polyethylenimine ($M_W$ about 25k) carboxymethyl cellulose, sodium salt ($M_W$ about 700k), poly(ethylene glycol) (or polyethylene oxide, My about 100k) from Sigma Aldrich were used in this study. These polymers were dissolved in water (heated if necessary to suitably dissolve) at 5-20 wt %. The clear solution was then drop coated on top of the SWCNT TFT channel with a small paint brush before being annealed at elevated temperature.

TFT device characterization: Current-voltage characteristic (I-V) curves were collected on a probe station under ambient conditions and the mobility was calculated from the source-drain current (ISD)-gate voltage ($V_G$) transfer curve in the linear regime based on a parallel plate model. Due to high channel width/length ratio (≥100), the contribution arising from tubes outside the defined channel area can be ignored.

Instruments: TFT transfer and output curves were collected with a Keysight Technologies B2902A Source/measure unit. The gate potentials were swept between -50 and 50 V and source-drain potential was 1.0 V. The gate sweep rate was 34 V/s. For both p-type and n-type TFTs, only turn-on sweep transfer curves were shown for clarity. The surface charge density was measured by induction using a capacitive probe.[28] A circular brass probe with a diameter of 3/32 inches (about 2.4 mm) was maintained at 500 µm over the sample. The probe was shielded with a grounded casing. The sample was supported on a large brass plate connected to ground. The probe potential $V_{pg}$ was measured with a high impedance electrometer (Keithley 6517A) with a 10 pF capacitor in the preamplifier feedback loop. The probe scanned through a bare silicon wafer, polymer coated wafer, and bare silicon wafer again, to measure the difference in the potential profile, which is dependent on the surface charge density $\sigma_s$. Calibration was done by applying a known potential to the brass plate and measuring the voltage at the probe, which yielded a sensitivity factor S, such as $\sigma_s = S V_{pg}$, of approximately 2.55 µF cm$^{-2}$ for 230 nm oxide.

II. Results and Discussion

High purity polymer wrapped sc-SWCNT toluene solution samples were used that were enriched by a conjugated polymer extraction approach.[27] High density SWCNT networks were then prepared by a soaking and rinsing step on a freshly cleaned silicon wafer with pre-patterned Au electrodes.[29] The TFTs were then characterized under ambient conditions, which showed a standard p-type behavior with mobility of about 40 cm$^2$/Vsec and a good on/off ratio.[27] Then, a series of common water soluble polymer solutions, including polyethylenimine (PEI), polyvinyl alcohol (PVA), polyacrylic acid (PAA), polyvinyl pyrrolidone (PVP), polyacrylamide (PAM), poly(ethylene glycol) (PEG), and sodium carboxymethyl cellulose (SCMC), were drop-casted on the channel with a paint brush. The chips were then annealed at 140° C. and the transfer curves were characterized. The polymer structures are shown in Scheme 1.

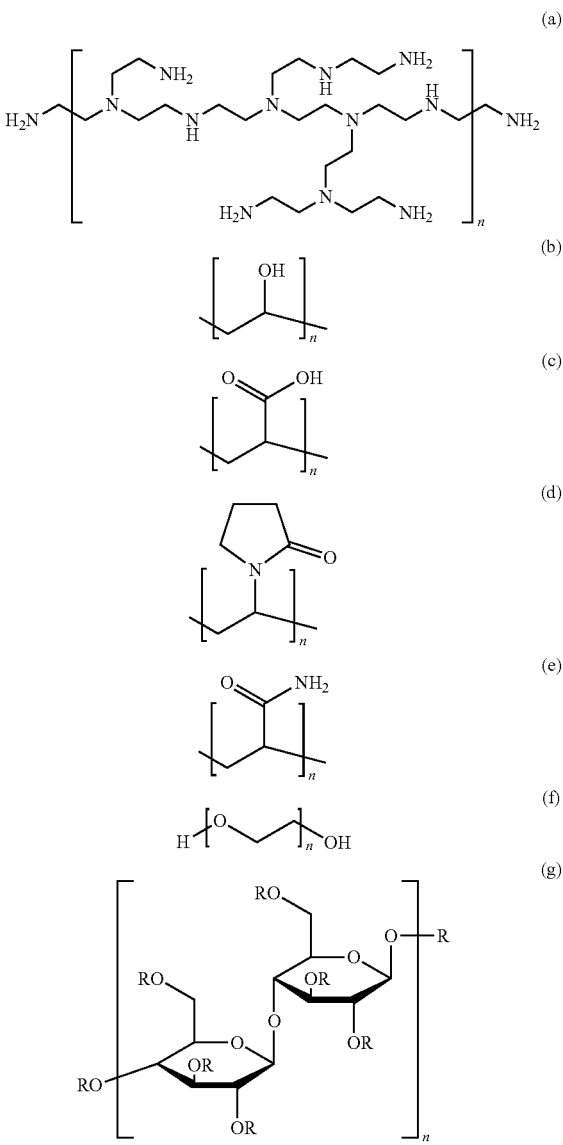

Scheme 1: Exemplary schematic structures of the water soluble polymers used in this Example: (a) PEI; (b) PVA; (c)

PAA; (d) PVP; (e) PAM; (f) PEG; (g) SCMC, wherein each n independently represents the number of repeating units in the polymers and each R independently represents H or —CH$_2$C(O)ONa.

Figure 13:
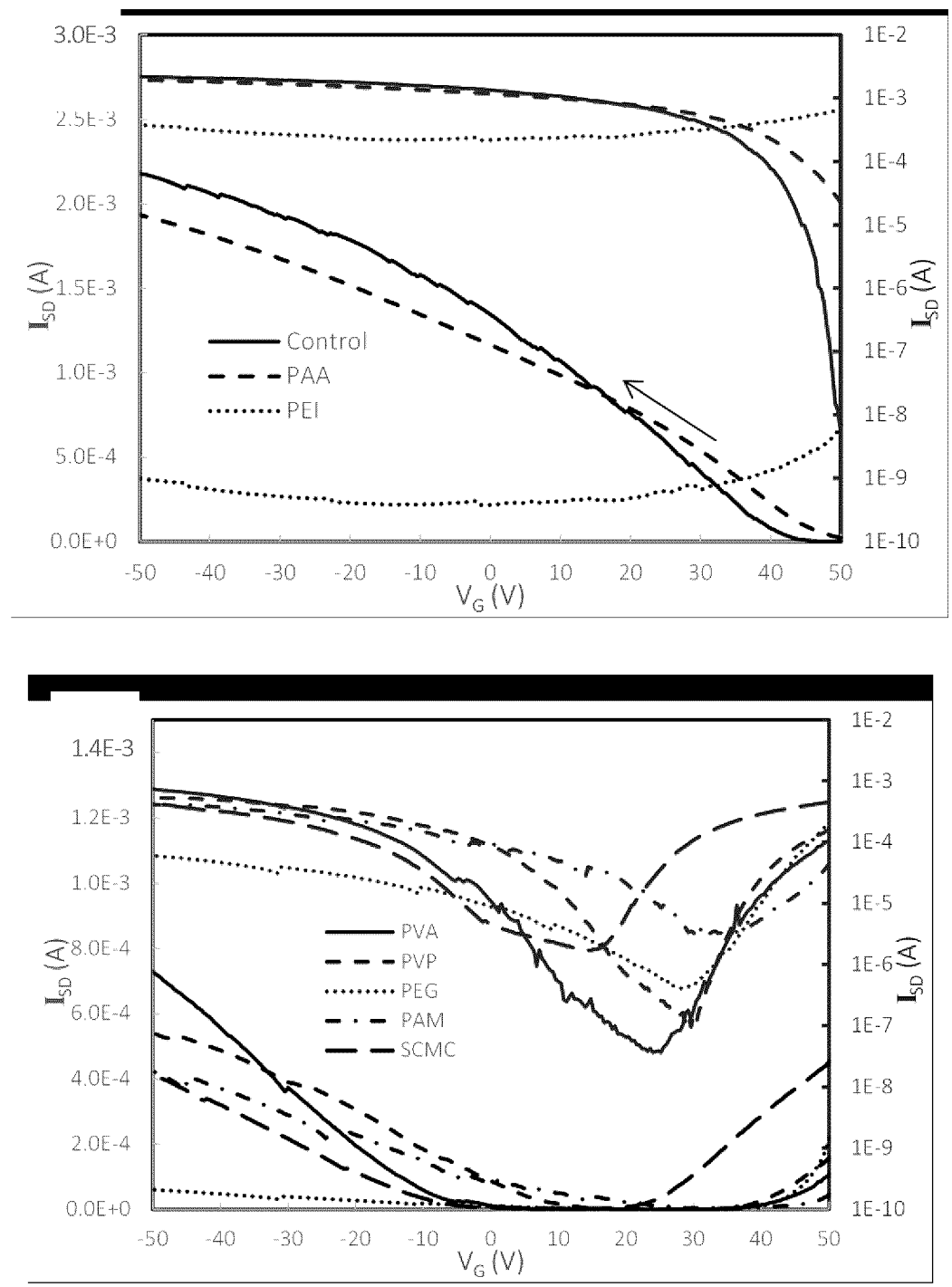
FIG. 13 shows exemplary transfer characteristics of bottom-gated SWCNT TFTs before (control) and after deposition of polymer coating layers of polyacrylic acid (PAA) and polyethylenimine (PEI) (upper plot) or polymer coating layers of polyvinyl alcohol (PVA), polyvinyl pyrrolidone (PVP), poly(ethylene glycol) (PEG), polyacrylamide (PAM) and sodium carboxymethyl cellulose (SCMC) (lower plot). The channel length and width were 20 and 2,000 μm, respectively.

The behavior of the polymer coated SWCNT TFTs could be divided into three groups: strong n-type (PEI), ambipolar (PVA, PVP, PEG, PAM, SCMC) and p-type (PAA) as shown in FIG. 13. It should be noted that both n/p-type transfer curves show poor on/off ratio without a well-defined threshold voltage ($V_T$). A few examples have appeared where a PEI or PVA coating layer has been used for n-doping in SWCNT based TFTs, but the doping levels are difficult to control, which limit their implementation in real applications.[30]

Figure 14:
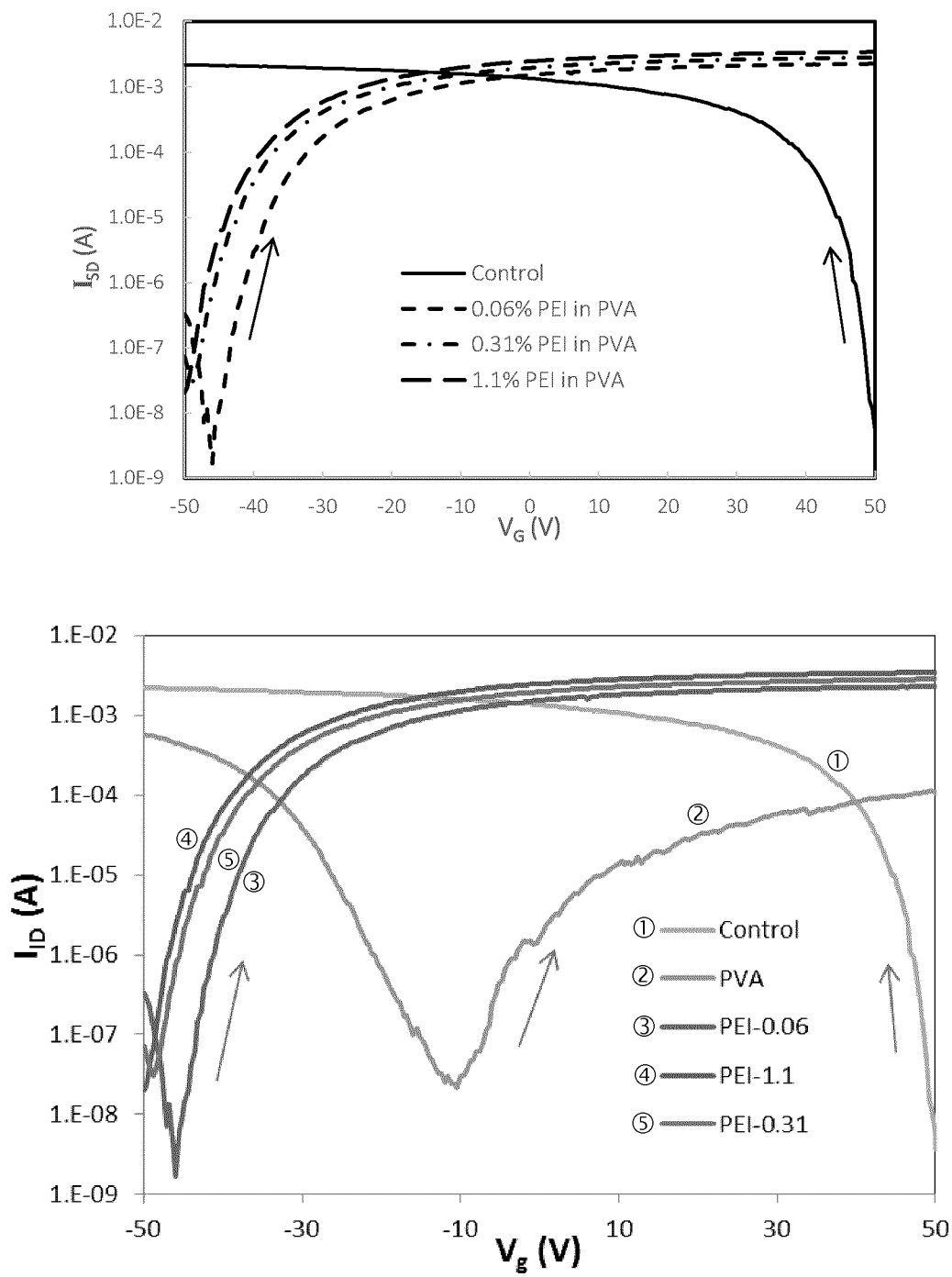
FIG. 14 shows exemplary transfer characteristics of bottom-gated SWCNT TFTs before (control) and after deposition of PEI/PVA coating layers having PEI in PVA ratios of 0.06%, 0.31% and 1.1%, annealed at 140° C. according to embodiments of the present application (upper plot) as well as the transfer curve of CNN-TFTs without (control, curve labelled ①) and with a coating of pure PVA (curve labelled ②) on the channel according to comparative examples of the present application, in comparison to TFTs with a coating of various ratios of PEI/PVA (0.06%, curve labelled ③; 0.31% curve labelled ④; 1.1% curve labelled ⑤) on the channel according to embodiments of the present application (lower plot).
Figure 15:
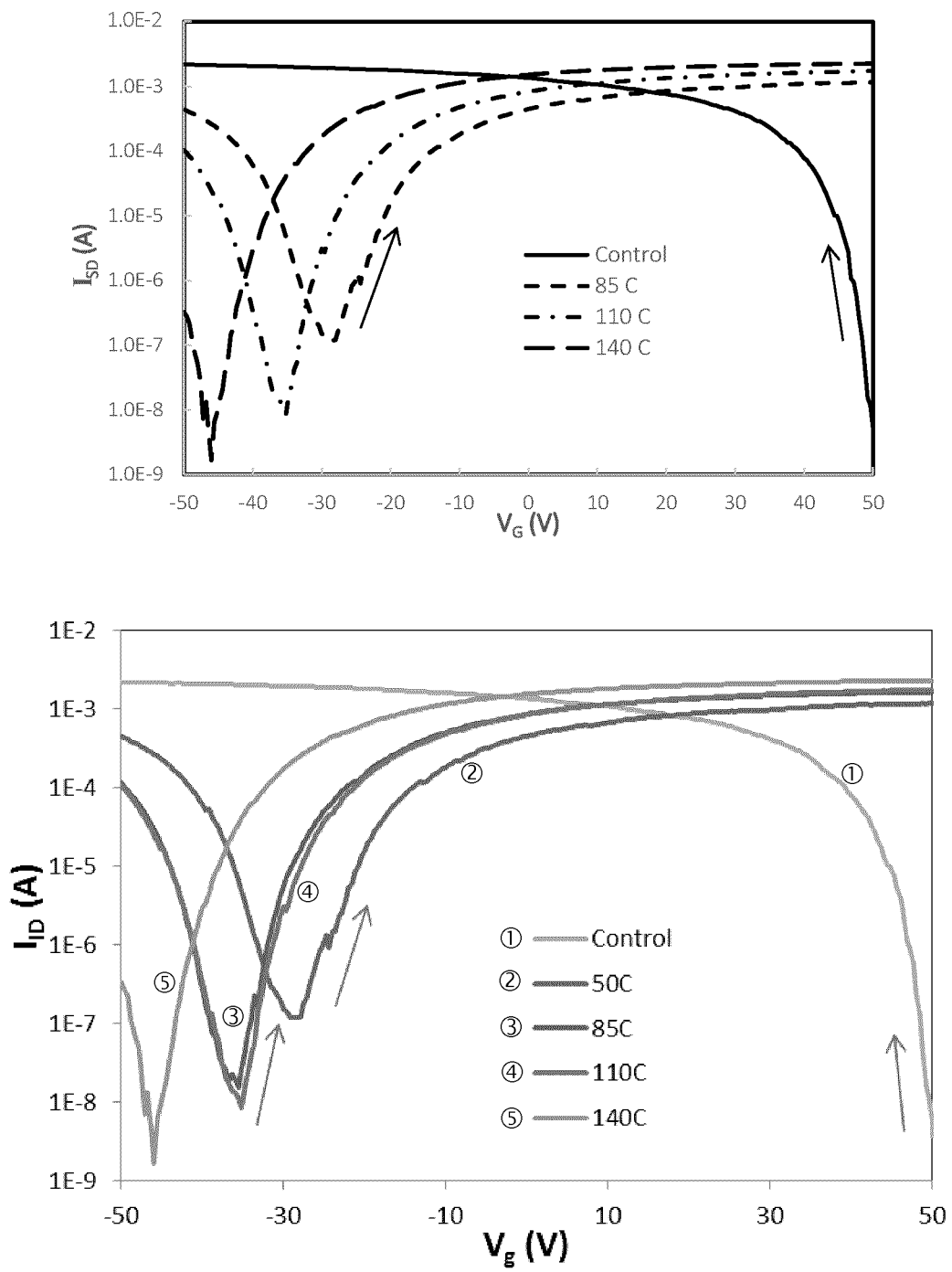
FIG. 15 shows exemplary transfer characteristics of bottom-gated SWCNT TFTs before (control), annealed at temperatures of 85° C., 110° C. and 140° C. according to embodiments of the present application (upper plot) as well as the transfer curve of CNN-TFTs with a coating of PEI/PVA (0.06% PEI in PVA) annealed at temperatures of 50° C. (curve labelled ②), 85° C. (curve labelled ③), 110° C. (curve labelled ④) and 140° C. (curve labelled ⑤), for 10 minutes according to embodiments of the present application in comparison to a control TFT without a coating (curve labelled ①) (lower plot).

Surprisingly, it was found that a mixed polymer coating layer with a low percentage of PEI in a PVA host gave a well-defined n-type transfer curve. FIGS. 14 and 15 show the transfer curves of SWCNT TFTs before and after deposition of PEI/PVA coating at different ratios and/or annealing temperatures. In particular, FIG. 14 shows a transfer curve of TFTs without a coating and with coatings of various ratios of PEI/PVA (0.06%, 0.31% or 1.1% PEI) on the channel, wherein the channel length and width were 20 µm and 2 mm respectively (upper plot) as well as a transfer curve that also includes pure PVA (lower plot). In FIG. 14, the as prepared control TFT shows standard p-type behaviour (in lower plot; curve labelled ①) whereas a thin layer of pure PVA increased the n-doping and decreased the p-doping level of SWCNTs, thus the TFTs show ambipolar behaviour (in lower plot; curve labelled ②). Only a few percentages of PEI in the PVA changed the TFT to n-type (in lower plot; curves labelled ③ to ⑤). FIG. 15 shows the transfer curve of TFTs with a coating of PEI/PVA (0.06% PEI in PVA) annealed at temperatures of 85° C., 110° C. and 140° C. for 10 minutes (upper plot) as well as a transfer curve that also included annealing at a temperature of 50° C. (lower plot). The channel length and width in the SWCNT TFTs were 20 µm and 2 mm (2,000 µm) respectively. The threshold voltage changed to a negative direction as the annealing temperature increased.

Figure 16:
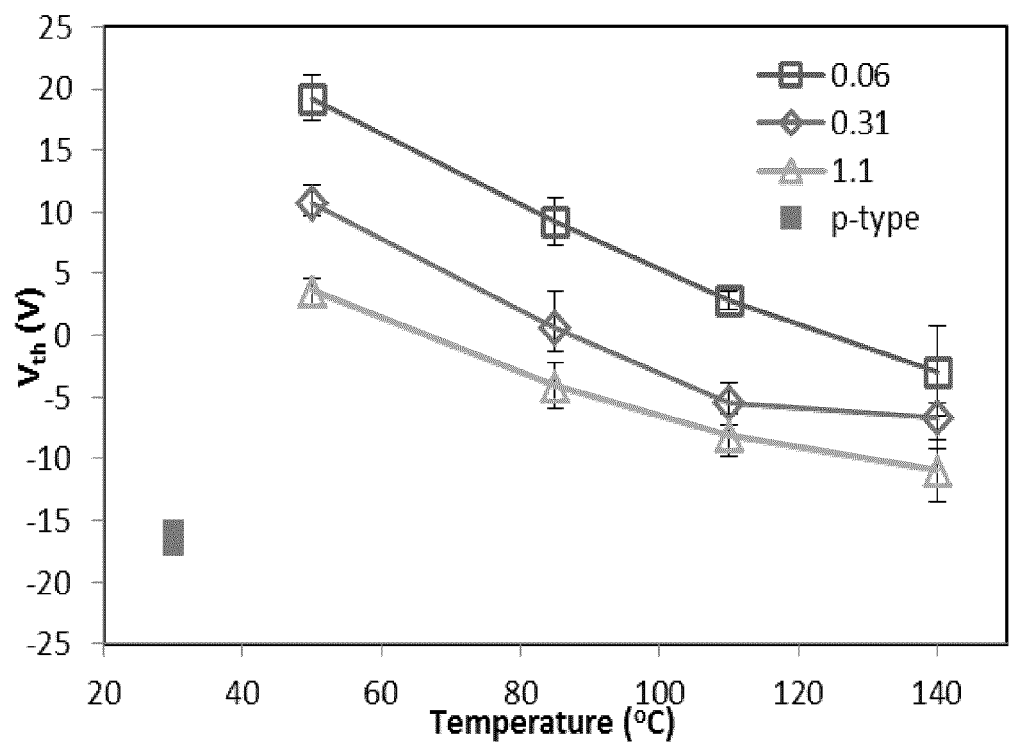
FIG. 16 shows the relationship of the threshold voltage of the n-type CNN-TFTs to the PEI content (0.06, 0.31 and 1.1%) and annealing temperature (50, 85, 110 and 140° C.) according to embodiments of the present application. The channel length and width are 20 and 2,000 μm, respectively.
Figure 17:
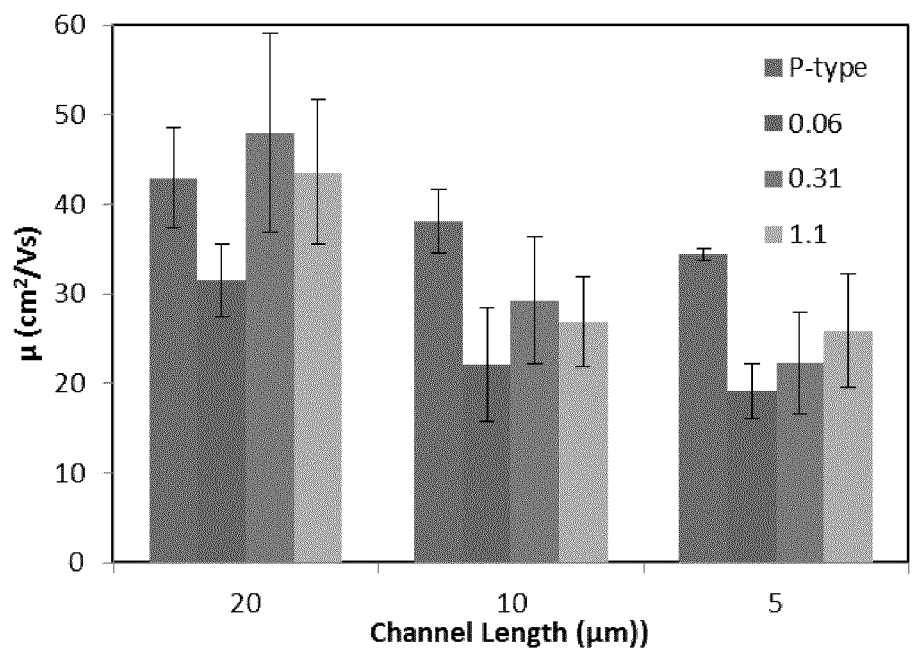
FIG. 17 shows the mobility (upper plot) and on/off ratio (lower plot) of CNN-TFTs with different PEI/PVA ratios (in each cluster, from left to right: (p-type uncoated control), 0.06, 0.31 and 1.1% PEI) and channel lengths (from left to right: 20, 10 and 5 μm) according to embodiments of the present application. The channel width was 2,000 μm for both plots.
Figure 17:
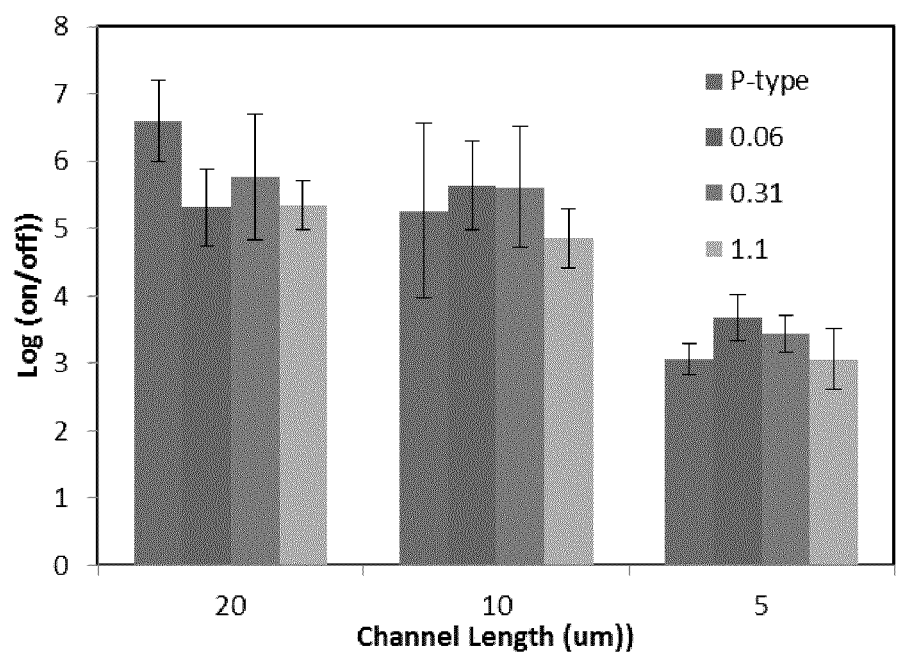

The $V_T$, mobility and on/off ratio at various annealing temperature and/or channel length are extracted and summarized in FIGS. 16 and 17. FIG. 16 shows the relationship of threshold voltage of the n-type TFTs to the PEI content (%) and annealing temperature. From FIG. 16 it can be clearly seen that the threshold voltage of the TFTs can be easily controlled by both PEI/PVA ratio and annealing temperature. FIG. 17 shows the mobility (upper plot) and on/off ratio (lower plots) of TFTs with different PEI/PVA ratio and channel length in comparison to p-type controls. Good on/off ratios (>10$^3$) were obtained even for 5 µm channel length TFTs. The n-type TFTs showed quite similar mobility values and on/off ratios compared with its p-type counterparts, and both values are not very sensitive to PEI/PVA ratio. This indicates that the device performance is still mainly controlled by the intrinsic properties of the SWCNT network. Such symmetric p/n-type TFTs are highly desired, for example, for CMOS circuits. Clearly, the n-doping level of these SWCNT TFTs can be well controlled by PEI/PVA polymer ratio and annealing temperature.

Figure 18:
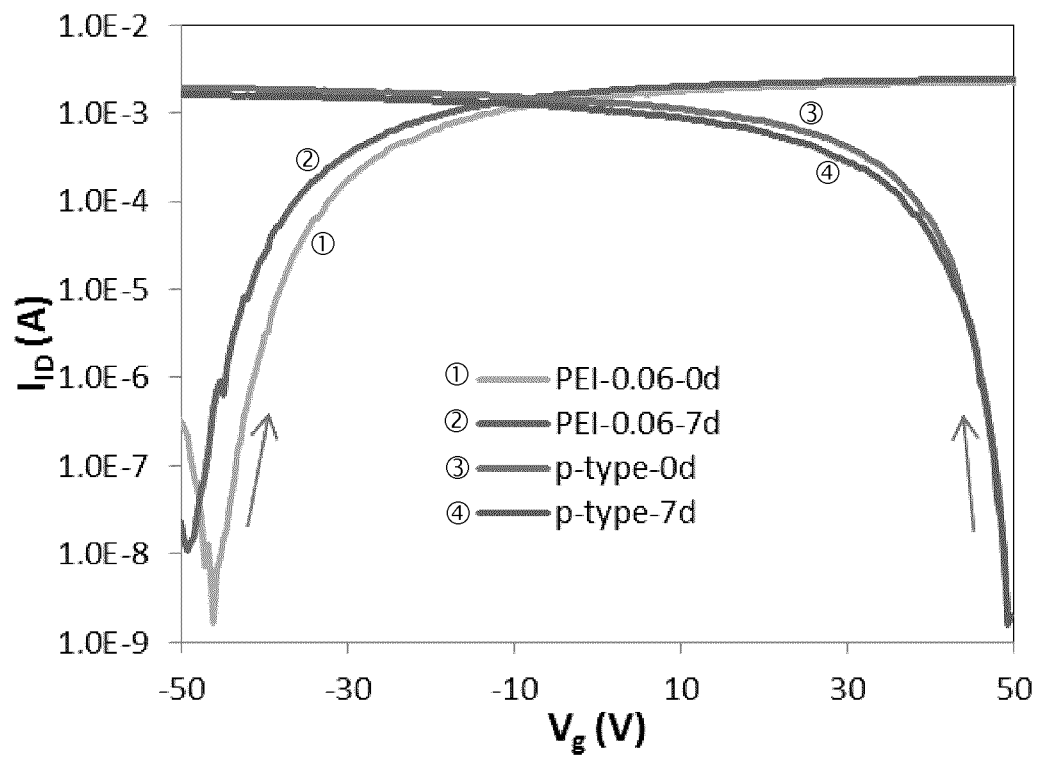
FIG. 18 shows the transfer curve of CNN-TFTs without (p-type) according to a comparative example of the present application before (curve labelled ③) and after (curve labelled ④) 7 days in ambient air and with a coating of PEI/PVA (0.06% PEI in PVA) according to an embodiment of the present application before (curve labelled ①)) and after (curve labelled ②) 7 days in ambient air.

FIG. 18 shows transfer curves of TFTs without (p-type) and with a coating of PEI/PVA (0.06% PEI in PVA) before and after 7 days in ambient air. The n-type TFT showed slightly improved n-doping due to further reaction of PEI with SWCNTs, but still a stable n-type curve and a suitable on/off ratio.

Figure 19:
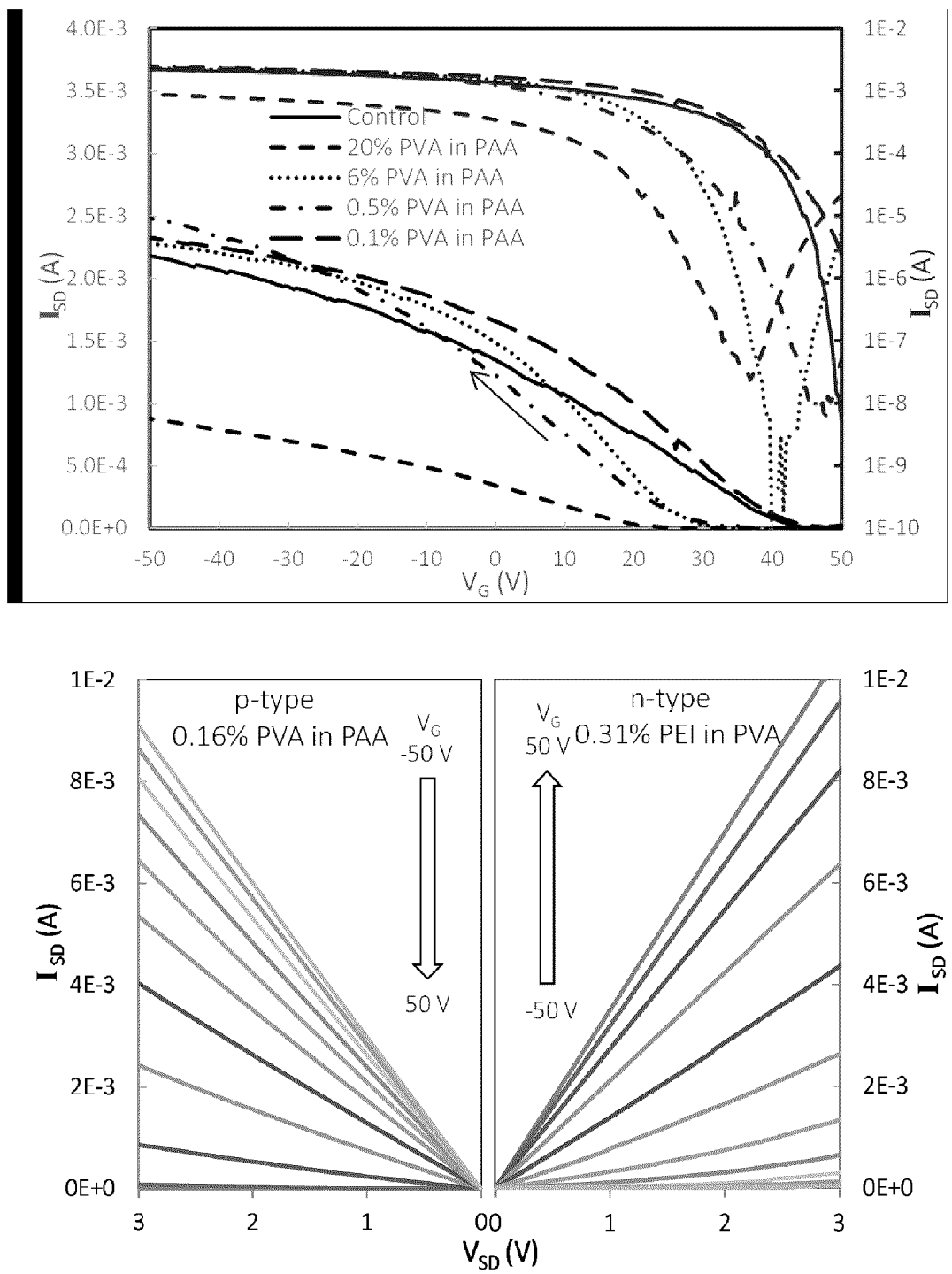
FIG. 19 shows exemplary transfer characteristics of bottom-gated SWCNT TFTs before (control) and after deposition of PVA/PAA coating layers with 0.1%, 0.5%, 6% and 20% PVA, annealed at 140° C. according to embodiments of the present application (upper plot); and output characteristics of p/n-type SWCNT TFTs with 0.16% PVA in PAA (lower left plot) and 0.31% PEI in PVA (lower right plot) according to embodiments of the present application, the steps for $V_G$ are 10 V. The channel length and width were 20 μm and 2,000 μm.

The p-doping of pristine SWCNT TFTs comes from oxygen/moisture, which is sensitive to ambient conditions or adsorbed small molecules.[31] In addition, for industry applications, encapsulation is desirable to maintain a stable environment, which can further disturb their p-doping level. Therefore, to obtain a controllable and stable p-type doping of SWCNT TFTs is also desirable as their n-doping counterpart. Compared with n-type doping of SWCNT TFTs, p-type coatings are still less studied. Following the same approach described above, it was found that a polymer mixture coating of PAA with a low percentage of PVA can provide well controlled p-type doping. FIG. 19 (upper plot) shows the transfer curve of SWCNT TFTs coated with various ratios of PVA/PAA, indicating that the p-doping level, $V_T$ and on/off ratio can be fine-tuned. At a PVA ratio of 0.5% in PAA, a mobility of 43.6 cm$^2$/Vs, $V_T$ at −9.0 V and on/off ratio of 5.0×10$^6$ was extracted, compared with the control device from pristine SWCNT TFTs at 42.3 cm$^2$/Vs, −13.8 V and 6.0×10$^5$ respectively. This was useful, for example, because a similar p-type performance can be obtained as that from atmospheric dopants. However, the coated devices are advantageously expected to be more stable as it may block the influence from ambient conditions and/or other small molecule impurities, which also should be more tolerant to the future encapsulation process. FIG. 19 (lower plot) shows the output characteristics of SWCNT TFTs from p-type by PVA/PAA coating (left) and n-type by PEI/PVA coating (right), and they demonstrated quite symmetric source-drain current pattern at $V_{SD}$ from 0 to 3 V when $V_G$ changed between ±50 V at 10 V steps.

The performance of both n/p-type polymer coated SWCNT TFTs were then tested at various thickness by adjusting the polymer solution concentration. It was found that stable n/p-doping was obtained when the coating layer was thicker than 2 µm, whereas a thinner film led to a deleterious shift of the transfer curve due to insufficient coverage and/or pinholes. To test the stability of these TFTs, their transfer curve was monitored at various relative humidity (RH) levels in a humidity chamber. It was found that the transfer curve began to shift if the RH was over 60%, however these shifts were totally reversible if the chip was annealed again at 140° C. As these water soluble polymers are intrinsically hydroscopic, crosslinking and/or encapsulation may still be advantageous for longer term stability. On the other hand, the hydrogen bonding interaction between the two polymers will stabilize the uniform morphology structure in the coating layer, which should not phase segregate due to the formation of a hydrogen bonded interpenetrated network.[32]

Figure 20:
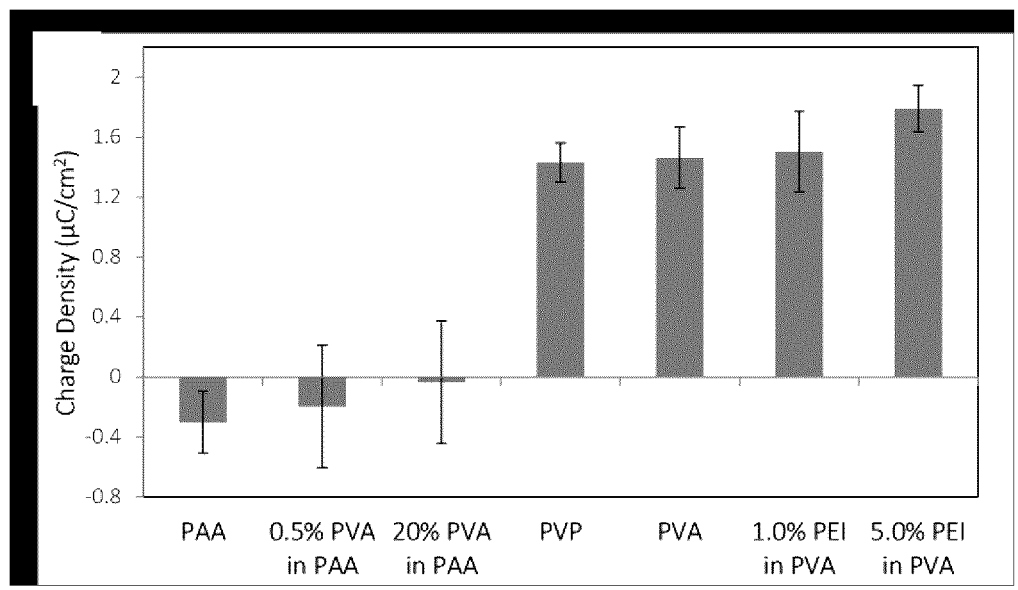
FIG. 20 is a plot of surface charge density of various polymer coating layers (from left to right: PAA, 0.5% PVA in PAA, 20% PVA in PAA, PVP, PVA, 1.0% PEI in PVA and 5.0% PEI in PVA) compared with silicon wafer.

To further investigate the n/p-type doping mechanism of different polymer coating layers, the surface charge density of several representative mixed polymer films on silicon wafer were measured and the data are summarized in FIG. 20. These data only show the difference of surface charge density between polymer coatings and the silicon substrate. An ambipolar coating, such as PVP or PVA has similar medium positive charge on their surface, which will decrease the electron-withdrawing ability of atmospheric dopants on the silicon substrate. So the coated SWCNT TFTs demonstrate typical ambipolar behavior. Addition of PEI into PVA made the bulk coating more electron rich, and introduced more positive charge on its surface, which shifted the doping level of SWCNTs to n-type. On the contrary, PAA has a pure negative charge on its surface, which can be balanced with a few percent PVA to reach ambient air p-doping level for SWCNT TFTs. These surface charge density measurements may, for example, provide a general guide on the choice of polymers to use for a desired behavior. The polarity and density of bulk charge within the mixed polymer coating is highly dependent on polymer type and/or water content, which can be fine-tuned by polymer ratio and annealing temperature.

Figure 21:
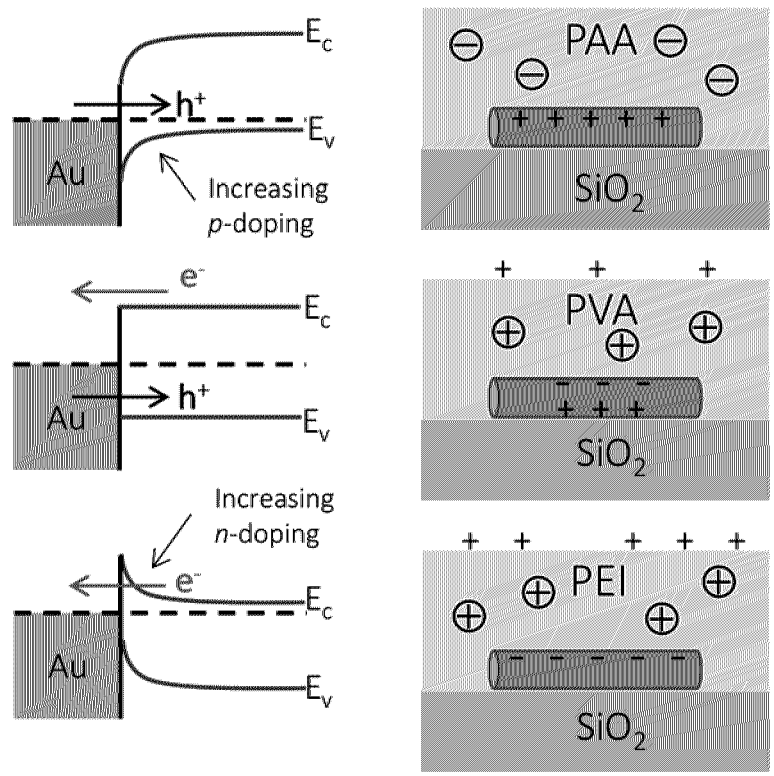
FIG. 21 shows schematic energy band diagrams showing the shift of energy level after different polymer layer deposition (left) and corresponding schematic diagrams showing the surface and bulk charge of the polymer coating layer, and possible mobile charge within the carbon nanotube (right; from top to bottom: PAA, PVA and PEI coatings on $SiO_2$).

FIG. 21 shows the schematic energy band shift of SWCNTs under different polymer coating layers. The bulk of PAA/PEI coating contains positive/negative charges, which will dope SWCNTs. So only holes/electrons can be transported, thus the resulted TFTs demonstrate dominate p/n-type behavior. In this case, addition of PVA efficiently adjusts the doping level and shifts the $V_T$ to a desired position. Interestingly, a pure PVA coating leads to ambipolar behavior, which is quite similar to the performance of SWCNT TFTs in a vacuum or glove box. But the mechanism behind the performance under these two conditions is different. In the present case, the PVA coating causes a balanced positive/negative charge concentration while vacuum annealing only removes atmospheric dopants on the SWCNT surfaces. This is supported, for example, by the magnitude higher mobilities in this case compared with those measured in vacuum, which are directly related to the mobile charge concentrations.[33]

Figure 22:
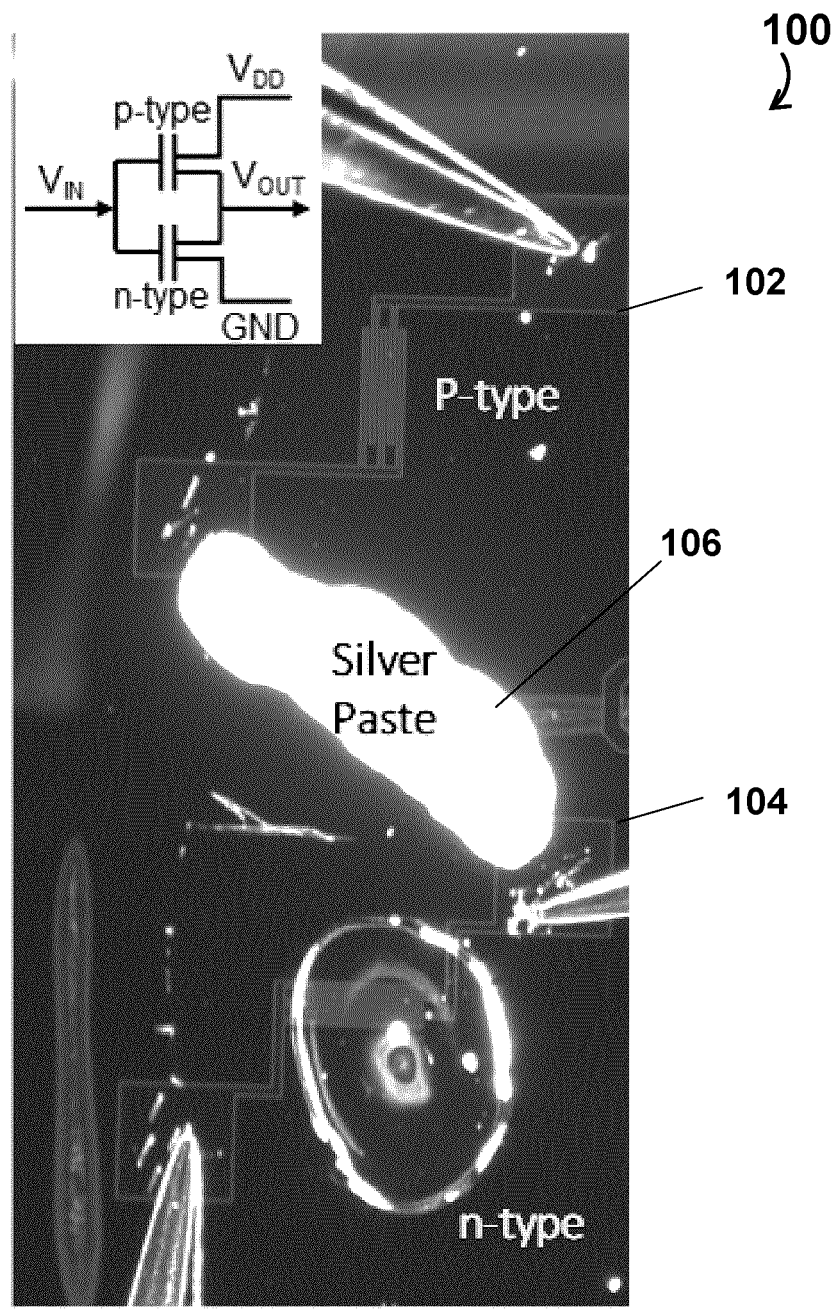
FIG. 22 shows an exemplary microscopy image of a SWCNT CMOS inverter with a schematic diagram showing on the upper left corner how the p-type and n-type TFTs were connected with silver paste. The channel length and width of each TFT are 20 μm and 2,000 μm, respectively.
Figure 23:
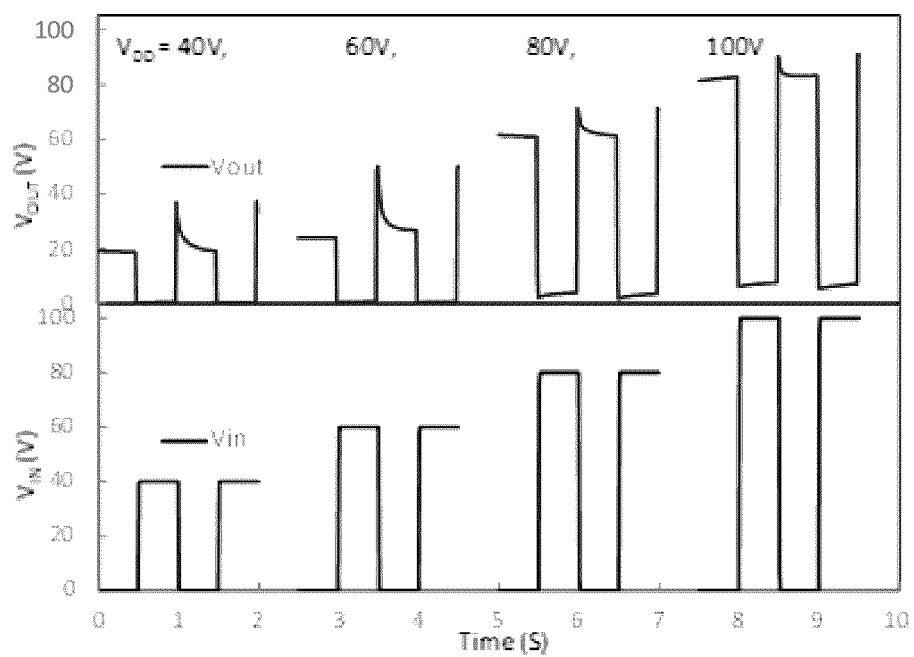
FIG. 23 shows voltage transfer characteristics with time (upper plot) or under sweeping (lower plot) for the SWCNT CMOS inverter of FIG. 22.
Figure 23:
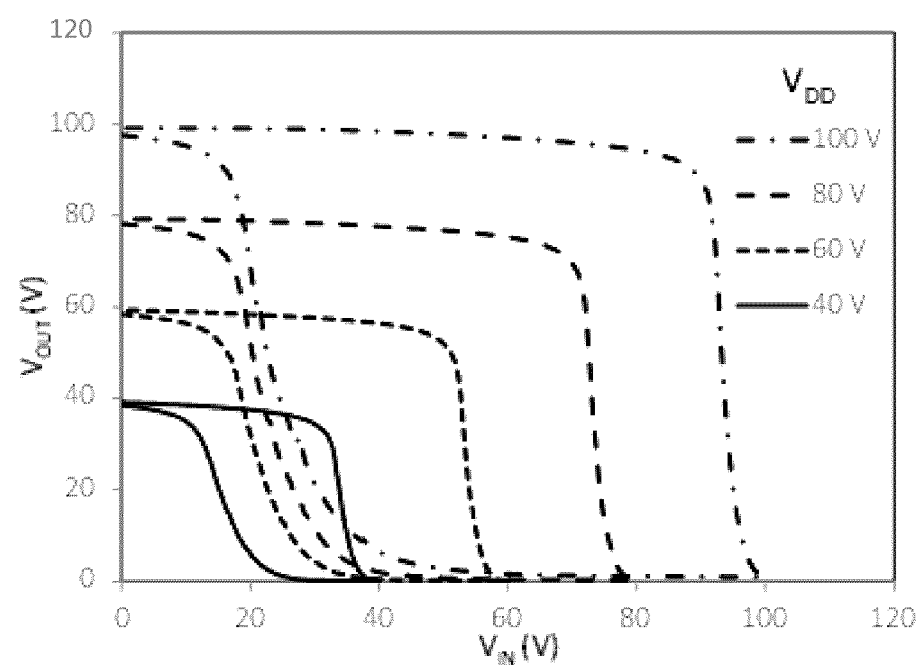

To further demonstrate the application of these n/p-type SWCNT TFTs, a CMOS inverter 100 was built by connecting two TFTs with different polarity (p-type TFT 102 and an n-type TFT 104) using silver paste 106 as shown in the main image of FIG. 22 (inset shows a schematic diagram).[34] Representative voltage transfer was characterized with time (FIG. 23; upper plot) or under sweeping (FIG. 23; lower plot). As $V_{DD}$ increased from 40 to 100 V, the output voltage ($V_{OUT}$) changed from 20/0 to 84/7 V at input voltage (VIN) of 0/40 to 0/100 V. While not wishing to be limited by theory, a more symmetric voltage transfer curve may, for example, be obtained under higher $V_{DD}$. A 230 nm $SiO_2$ dielectric was used on silicon wafer as substrate and all the tests were carried out in ambient conditions. These TFTs usually show a large hysteresis up to about 40 V if $V_G$ is swept between −50/50 V, which will severely limit the performance of built inverters. This can be overcome using hysteresis free dielectrics layers.[35]

III. Summary

The application of water soluble polymer coating layers on existing SWCNT network based TFTs efficiently controlled both charge carrier type and density. For example, coating a thin layer of a blend of PVA/PEI on the channel of SWCNT network based bottom gated TFTs can effectively turn the original p-type devices to n-type with precisely controlled threshold voltage.

Addition of a very small amount of PEI (usually less than 1%) in PVA can effectively change the charge carrier in sc-SWCNT based TFTs. The effect of n-doping and threshold voltage can be controlled by the PEI/PVA ratio and/or the annealing temperature. The obtained n-type TFTs demonstrate similar mobility and on/off ratio compared to its p-type precedent. A low percentage of PVA in PAA will give matching p-type TFTs. All the main parameters for the TFTs, such as mobility, threshold voltage and on/off ratio can be fine-tuned by adjusting polymer ratio or annealing temperature. The doping mechanism was investigated by surface charge density measurement of these coating layers. Additionally, an n-type TFT and a p-type TFT were connected to form a CMOS inverter which showed useful voltage transfer characteristics.

The polymer coating layer is transparent and flexible, compatible with other components used in flexible electronics. The materials are very cheap and commercially available, and can be easily applied on the channel by conventional printing methods. Accordingly, this may, for example, provide a simple, cost effective and/or environmental friendly method to control the doping of TFTs, for example, for emerging SWCNT based printable electronics.

While the present application has been described with reference to what are presently considered to be the preferred examples, it is to be understood that the application is not limited to the disclosed examples. To the contrary, the present application is intended to cover various modifications and equivalent arrangements included within the spirit and scope of the appended claims.

All publications, patents and patent applications are herein incorporated by reference in their entirety to the same extent as if each individual publication, patent or patent application was specifically and individually indicated to be incorporated by reference in its entirety. Where a term in the present application is found to be defined differently in a document incorporated herein by reference, the definition provided herein is to serve as the definition for the term.

FULL CITATIONS FOR DOCUMENTS REFERRED TO IN THE DESCRIPTION

[1] (a) Avouris, P. Molecular Electronics with Carbon Nanotubes. Acc. Chem. Res. 2002, 35, 1026; (b) Cao, Q. Rogers, J. A. Ultrathin Films of Single-Walled Carbon Nanotubes for Electronics and Sensors: A Review of Fundamental and Applied Aspects. Adv. Mater. 2009, 21, 29; (c) Hu, L. Hecht, D. S. Grüner, G. Carbon Nanotube Thin Films: Fabrication, Properties, and Applications. Chem. Rev. 2010, 110, 5790; (d) Noorden, R. V. The Trials of New Carbon. Nature 2011, 469, 14; (e) Wang, C. Takei, K. Takahashi, T. Javey, A. Carbon Nanotube Electronics—Moving Forward. Chem. Soc. Rev. 2013, 42, 2592; (f) De Volder, M. F. L. Tawfick, S. H. Baughman, R. H. Hart, A. J. Carbon Nanotubes: Present and Future Commercial Applications. Science 2013, 339, 535; (g) Zhang, Q. Huang, J.-Q. Qian, W.-Z. Zhang, Y.-Y. Wei, F. The Road for Nanomaterials Industry: A Review of Carbon Nanotube Production, Post-Treatment, and Bulk Applications for Composites and Energy Storage. Small 2013, 9, 1237; (h) Peng, L.-M. Zhang, Z. Wang, S. Carbon Nanotube Electronics: Recent Advances. Mater. Today, 2014, 17, 434.

[2] (a) Zhang, H. Wu, B. Hu, W. Liu, Y. Separation and/or Selective Enrichment of Single-Walled Carbon Nanotubes Based on Their Electronic Properties. Chem. Soc. Rev., 2011, 40, 1324; (b) Lu, F. Meziani, M. J. Cao, L. Sun, Y.-P. Separated Metallic and Semiconducting Single-Walled Carbon Nanotubes: Opportunities in Transparent Electrodes and Beyond. Langmuir 2011, 27, 4339; (c) Fujigaya, T. Nakashima, N. Non-convalent Polymer Wrapping of Carbon Nanotubes and the Role of Wrapped Polymers as Functional Dispersants. Sci. Technol. Adv. Mater. 2015, 16, 024802; (d) Wang, H, Bao, Z. Conjugated Polymer Sorting of Semiconducting Carbon Nanotubes and Their Electronic Applications. Nano Today, 2015, 10, 737; (e) Lefebvre, J. Ding, J. Li, Z. Finnie, P. Lopinski, G. Malenfant, P. R. L. High-Purity Semiconducting Single-Walled Carbon Nanotubes: A Key Enable Material in Emerging Electronics. Acc. Chem. Res. 2017, 50, 2479.

[3] (a) Tulevski, G. S. Franklin, A. D. Frank, D. Lobez, J. M. Cao, Q. Park, H. Afzali, Han, A. S.-J. Hannon, J. B. Haensch, W. Toward High-Performance Digital Logic Technology with Carbon Nanotubes. ACS Nano, 2014, 8, 8730; (b) Shulaker, M. M. Hills, G. Patil, N. Wei, H. Chen, H.-Y. Wong, H.-S. P. Mitra, S. Carbon Nanotube Computer. Nature 2013, 501, 526.

[4] (a) Sun, D.-M. Liu, C. Ren, W.-C. Cheng, H.-M. A Review of Carbon Nanotube- and Graphene-Based Flexible Thin-Film Transistors. Small 2013, 9, 1188; (b) Qiu, S. Wu, K. Gao, B. Li, L. Jin, H. Li, Q. Solution-Processing of High-Purity Semiconducting Single-Walled Carbon Nanotubes for Electronic Devices. Adv. Mater. 2018, 1800750.

[5] Zaumseil, J. Semiconducting Single-Walled Carbon Nanotubes or Very Rigid Conjugated Polymers: A Comparison. Adv. Electron. Mater. 2018, 1800514.

[6] (a) Cao, Y. Cong, S. Cao, X. Wu, F. Liu, Q. Amer, M. R. Zhou, C. Review of Electronics Based on Single-Walled Carbon Nanotubes. Top. Curr. Chem (Z), 2017, 375, 75; (b) Zaumseil, J. Single-Walled Carbon Nanotube Networks for Flexible and Printed Electronics. Semicond. Sci. Technol. 2015, 30, 074001.

[7] (a) Jianfu Ding, Zhao Li, Jacques Lefebvre, Fuyong Cheng, Girjesh Dubey, Shan Zou, Paul Finnie, Amy Hrdina, Ludmila Scoles, Gregory P. Lopinski, Christopher T. Kingston, Benoit Simard, Patrick R. L. Malenfant, "Enrichment of large-diameter semiconducting SWCNTs by polyfluorene extraction for high network density thin film transistors", Nanoscale, 2014, 6, 2328-2339; (b) Jianfu Ding, Zhao Li, Fuyong Cheng, Benoit Simard, Patrick R. L. Malenfant, "Process for purifying semiconducting single-walled carbon nanotubes", U.S. Pat. No. 10,046,970 and references therein; (c) Jianfu Ding, Zhao Li, Jacques Lefebvre, Fuyong Cheng, Jeffrey L. Dunford, Patrick R. L. Malenfant, Jefford Humes, Jens Kroeger, "A hybrid enrichment process combining conjugated polymer extraction and silica gel adsorption for high purity semiconducting single-walled carbon nanotubes (SWCNT)", Nanoscale, 2015, 7, 15741; (d) Jacques Lefebvre, Jianfu Ding, Zhao Li, Paul Finnie, Gregory Lopinski, and Patrick R. L. Malenfant, "High-Purity Semiconducting Single-Walled Carbon Nanotubes: A Key Enabling Material in Emerging Electronics", Acc. Chem. Res. 2017, 50, 2479-2486.

[8] Jianfu Ding, Zhao Li, and Patrick R. L. Malenfant, "Hydrophylic semiconducting single-walled carbon nanotube inks" PCT Patent Application Publication No. 2017/117646A1.

[9] (a) Kim, K. Kim, S. M. Lee, Y. H. Chemically Conjugated Carbon Nanotubes and Graphene for Carrier Modulation. Acc. Chem. Res. 2016, 49, 390; (b) Kim, W. Javey, A. Vermesh, O. Wang, Q. Li, Y. Dai, H. Hysteresis Caused by Water Molecules in Carbon Nanotube Field-Effect Transistors. Nano letters, 2003, 3, 2, 193.

[10] Heinze, S. et al. Carbon Nanotubes as Schottky Barrier Transistors. Phys. Rev. Lett. 89, 106801 (2002).

[11] Moriyama, N., Ohno, Y., Kitamura, T., Kishimoto, S. & Mizutani, T. Change in carrier type in high-k gate carbon nanotube field-effect transistors by interface fixed charges. Nanotechnology 21, 165201 (2010).

[12] Aguirre, C. M. et al. The Role of the Oxygen/Water Redox Couple in Suppressing Electron Conduction in Field-Effect Transistors. Adv. Mater. 21, 3087-3091 (2009).

[13] Ha, T.-J. et al. Highly Uniform and Stable n-Type Carbon Nanotube Transistors by Using Positively Charged Silicon Nitride Thin Films. Nano Lett. 15, 392-397 (2015).

[14] Kobayashi, S. et al. Control of carrier density by self-assembled monolayers in organic field-effect transistors. Nat. Mater. 3, 317-322 (2004).

[15] Lefebvre, J. et al. Hysteresis free carbon nanotube thin film transistors comprising hydrophobic dielectrics. Appl. Phys. Lett. 107, 243301 (2015).

[16] (a) Lee, S.-H. et al. Effect of Polymer Gate Dielectrics on Charge Transport in Carbon Nanotube Network Transistors: Low-k Insulator for Favorable Active Interface. ACS Appl. Mater. Interfaces 8, 32421-32431 (2016); (b) Ha, T. J., Kiriya, D., Chen, K. & Javey, A. Highly stable hysteresis-free carbon nanotube thin-film transistors by fluorocarbon polymer encapsulation. ACS Appl. Mater. Interfaces 6, 8441-8446 (2014); (c) Selvarasah, S., Li, X., Busnaina, A. & Dokmeci, M. R. Parylene-C passivated carbon nanotube flexible transistors. Appl. Phys. Lett. 97, 15-18 (2010); (d) Zhou, Y. et al. p-Channel, n-channel thin film transistors and p-n diodes based on single wall carbon nanotube networks. Nano Lett. 4, 2031-2035 (2004); (e) Shim, M., Javey, A., Kam, N. W. S. & Dai, H. Polymer functionalization for air-stable n-type carbon nanotube field-effect transistors. J. Am. Chem. Soc. 123, 11512-11513 (2001); (f) Carbon dioxide nanoelectronic sensor, US 2005/0129573 A1; (g) Hartmann, M. et al. Polymer-based doping control for performance enhancement of wet-processed short-channel CNTFETs. Nanotechnology 2018 Jan. 19; 29(3):035203.

[17] (a) Ha, T.-J. et al. Highly Uniform and Stable n-Type Carbon Nanotube Transistors by Using Positively Charged Silicon Nitride Thin Films. Nano Lett. 15, 392-397 (2015); (b) Lee, S. W., Suh, D., Lee, S. Y. & Lee, Y. H. Passivation effect on gate-bias stress instability of carbon nanotube thin film transistors. Appl. Phys. Lett. 104, (2014); (c) Zhang, J., Wang, C., Fu, Y., Che, Y. & Zhou, C. Air-stable conversion of separated carbon nanotube thin-film transistors from p-type to n-type using atomic layer deposition of high-K oxide and its application in CMOS logic circuits. ACS Nano 5, 3284-3292 (2011).

[18] Aguirre, C. M. et al. The Role of the Oxygen/Water Redox Couple in Suppressing Electron Conduction in Field-Effect Transistors. Adv. Mater. 21, 3087-3091 (2009).

[19] (a) Zhou, Y. et al. p-Channel, n-channel thin film transistors and p-n diodes based on single wall carbon nanotube networks. Nano Lett. 4, 2031-2035 (2004); (b) Shim, M., Javey, A., Kam, N. W. S. & Dai, H. Polymer functionalization for air-stable n-type carbon nanotube field-effect transistors. J. Am. Chem. Soc. 123, 11512-11513 (2001); (c) Carbon dioxide nanoelectronic sensor, US 2005/0129573 A1.

[20] Ha, T.-J. et al. Highly Uniform and Stable n-Type Carbon Nanotube Transistors by Using Positively Charged Silicon Nitride Thin Films. Nano Lett. 15, 392-397 (2015).

[21] (a) Yudan Zhao, Qunqing Li, Xiaoyang Xiao, Guanhong Li, Yuanhao Jin, Kaili Jiang, Jiaping Wang, and Shoushan Fan, "Three-Dimensional Flexible Complementary Metal-Oxide-Semiconductor Logic Circuits Based On Two-Layer Stacks of Single-Walled Carbon Nanotube Networks", ACS Nano, 2016, 10, 2193-2202; (b) Tae-Jun Ha, Kevin Chen, Steven Chuang, Kin Man Yu, Daisuke Kiriya, and Ali Javey, "Highly Uniform and Stable n-Type Carbon Nanotube Transistors by Using Positively Charged Silicon Nitride Thin Films", Nano Lett. 2015, 15, 392-397; (c) Jianshi Tang, Qing Cao, George Tulevski, Keith A. Jenkins, Luca Nela, Damon B. Farmer and Shu-Jen Han, "Flexible CMOS integrated circuits based on carbon nanotubes with sub-10 ns stage delays", Nat. Electro. 2018, 1, 191-196; (d) Guanhong Li, Qunqing Li, Yuanhao Jin, Yudan Zhao, Xiaoyang Xiao, Kaili Jiang, Jiaping Wang and Shoushan Fan, "Fabrication of air-stable n-type carbon nanotube thin-film transistors on flexible substrates using bilayer dielectrics", Nanoscale, 2015, 7, 17693; (e) Jialu Zhang, Chuan Wang, Yue Fu, Yuchi Che, and Chongwu Zhou, "Air-Stable Conversion of Separated Carbon Nanotube Thin-Film Transistors from p-Type to n-Type Using Atomic Layer Deposition of High-K Oxide and Its Application in CMOS Logic Circuits", ACS Nano, 2011, 3284-3292.

[22] (a) Soo Min Kim, Jin Ho Jang, Ki Kang Kim, Hyeon Ki Park, Jung Jun Bae, Woo Jong Yu, Il Ha Lee, Gunn Kim, Duong Dinh Loc, Un Jeong Kim, Eun-Hong Lee, Hyeon-Jin Shin, Jae-Young Choi, and Young Hee Lee, "Reduction-Controlled Viologen in Bisolvent as an Environmentally Stable n-Type Dopant for Carbon Nanotubes", J. Am. Chem. Soc., 2009, 131, 327-331; (b) Si Young Lee, Sang Won Lee, Soo Min Kim, Woo Jong Yu, Young Woo Jo, and Young Hee Lee, "Scalable Complementary Logic Gates with Chemically Doped Semiconducting Carbon Nanotube Transistors", ACS Nano, 2011, 5, 2369-2375; (c) Huiliang Wang, Peng Wei, Yaoxuan Li, Jeff Han, Hye Ryoung Lee, Benjamin D. Naab, Nan Liu, Chenggong Wang, Eric Adijanto, Benjamin C.-K. Tee, Satoshi Morishitab, Qiaochu Li, Yongli Gao, Yi Cui, and Zhenan Bao, "Tuning the threshold voltage of carbon nanotube transistors by n-type molecular doping for robust and flexible complementary circuits", PNAS, 2014, 111, 4776-4781; (d) Michael L. Geier, Julian J. McMorrow, Weichao Xu, Jian Zhu, Chris H. Kim, Tobin J. Marks and Mark C. Hersam, "Solution-processed carbon nanotube thin-film complementary static random access memory", Nat. Nanotech. 2015, 10, 944-949; (e) Schneider, S. Brohmann, M. Lorenz, R. Hofstetter, Y. J. Rother, M. Sauter, E. Zharnikov, M. Vaynzof, Y. Himmel, H.-J. Zaumseil, J. Efficient n-Doping and Hole Blocking in Single-Walled Carbon Nanotube Transistors with 1,2,4,5-Tetrakis(tetramethylguanidino)benzene. ACS Nano 2018, 12, 5895.

[23] (a) Michael L. Geier, Karttikay Moudgil, Stephen Barlow, Seth R. Marder, and Mark C. Hersam, "Controlled n-Type Doping of Carbon Nanotube Transistors by an Organorhodium Dimer", Nano Lett. 2016, 16, 4329-4334; (b) Qiqi Xu, Jianwen Zhao, Vincenzo Pecunia, Wenya Xu, Chunshan Zhou, Junyan Dou, Weibing Gu, Jian Lin, Lixin Mo, Yanfei Zhao, and Zheng Cui, "Selective Conversion from p-Type to n-Type of Printed Bottom-Gate Carbon Nanotube Thin-Film Transistors and Application in Complementary Metal-Oxide-Semiconductor Inverters", ACS Appl. Mater. Interfaces 2017, 9, 12750-12758; (c) Jian-Long Xu, Rui-Xuan Dai, Yan Xin, Yi-Lin Sun, Xian Li, Yang-Xin Yu, Lan Xiang, Dan Xie, Sui-Dong Wang & Tian-Ling Ren, "Efficient and Reversible Electron Doping of Semiconductor-Enriched Single-Walled Carbon Nanotubes by Using Decamethylcobaltocene", Sci, Rep. 2017, 7, 6751.

[24] (a) Yangxin Zhou, Anshu Gaur, Seung-Hyun Hur, Coskun Kocabas, Matthew A. Meitl, Moonsub Shim, and John A. Rogers, "p-Channel, n-Channel Thin Film Transistors and p-n Diodes Based on Single Wall Carbon Nanotube Networks", Nano Lett. 2004, 4, 2031-2035; (b) Tomohiro Yasunishi, Shigeru Kishimoto, Esko I. Kauppinen, and Yutaka Ohno, "Fabrication of high-mobility n-type carbon nanotube thin-film transistors on plastic film", Phys. Status Solidi C, 2013, 1-4; (c) Tomohiro Yasunishi, Shigeru Kishimoto, and Yutaka Ohno, "Effect of ambient air on n-type carbon nanotube thin-film transistors chemically doped with poly(ethylene imine)", Jpn. J. Appl. Phys. 2014, 53, 05FD01; (d) Giles P. Siddons, David Merchin, Ju Hee Back, Jae Kyeong Jeong, and Moonsub Shim, "Highly Efficient Gating and Doping of Carbon Nanotubes with Polymer Electrolytes", Nano Lett. 2004, 4, 927-931; (e) Chenguang Lu, Qiang Fu, Shaoming Huang, and Jie Liu, "Polymer Electrolyte-Gated Carbon Nanotube Field-Effect Transistor", Nano Lett. 2004, 4, 623-627; (f) Shim, M. Javey, A. Kam, N. W. S. Dai, H. Polymer Functionalization for Air-Stable n-Type Carbon Nanotube Field-Effect Transistors. J. Am. Chem. Soc. 2001, 123, 11512; (g) Siddons, G. P. Merchin, D. Back, J. H. Jeong, J. K. Shim, M. Highly Efficient Gating and Doping of Carbon Nanotubes with Polymer Electrolytes. Nano Lett. 2004, 4, 927; (h) Aikawa, S. Einarsson, E. Thurakitseree, T. Chiashi, S. Nishikawa, E. Maruyama, S. Deformable Transparent All-Carbon-Nanotube Transistors. Appl. Phys. Lett. 2012, 100, 063502.

[25] Hartmann, M. et al. Polymer-based doping control for performance enhancement of wet-processed short-channel CNTFETs. Nanotechnology 2018 Jan. 19; 29(3): 035203.

[26] Ding, J. et al. Enrichment of large-diameter semiconducting SWCNTs by polyfluorene extraction for high network density thin film transistors. Nanoscale 6, 2328 (2014).

[27] (a) Ding, J. Li, Z. Lefebvre, J. Cheng, F. Dubey, G. Zou, S. Finnie, P. Hrdina, A. Scoles, L. Lopinski, G. P. Kingston, C. T. Simard, B. Malenfant, P. R. L. Enrichment of Large-Diameter Semiconducting SWCNTs by Polyfluorene Extraction for High Network Density Thin Film Transistors. Nanoscale, 2014, 6, 2328; (b) Ding, J. Li, Z. Lefebvre, J. Cheng, F. Dunford, J. L. Malenfant, P. R. L. Humes, J. Kroeger, J. A Hybrid Enrichment Process Combining Conjugated Polymer Extraction and Silica Gel Adsorption for High Purity Semiconducting Single-Walled Carbon Nanotubes (SWCNT). Nanoscale, 2015, 7, 15741; (c) Li, Z. Ding, J. Lefebvre, J. Malenfant, P. R. L. Surface Effects on Network Formation of Conjugated Polymer Wrapped Semiconducting Single Walled Carbon Nanotubes and Thin Film Transistor Performance. Org. Electron. 2015, 26, 15.

[28] Davies, D. K. The Examination of the Electrical Properties of Insulators by Surface Charge Measurement. J. Sci. Instrum. 1967, 44, 521.

[29] Li, Z. Ding, J. Finnie, P. Lefebvre, J. Cheng, F. Kingston, C. T. Malenfant, P. R. L. Raman Microscopy Mapping for the Purity Assessment of Chirality Enriched Carbon Nanotube Networks in Thin-Film Transistors. Nano Res. 2015, 8, 2179.

[30] (a) Shim, M. Javey, A. Kam, N. W. S. Dai, H. Polymer Functionalization for Air-Stable n-Type Carbon Nanotube Field-Effect Transistors. J. Am. Chem. Soc. 2001, 123, 11512; (b) Zhou, Y. Gaur, A. Hur, S.-H. Kocabas, C. Meitl, M. A. Shim, M. Rogers, J. A. p-Channel, n-Channel and p-n Diodes Based on Single Wall Carbon Nanotube Networks. Nano Lett. 2004, 4, 2031; (c) Yasunishi, T. Kishimoto, S. Kauppinen, E. I. Ohno, Y. Fabrication of High-Mobility n-Type Carbon Nanotube Thin-Film Transistors on Plastic Film. Phys. Status Solidi C, 2013, 1; (d) Yasunishi, T. Kishimoto, S. Ohno, Y. Effect of Ambient Air on n-Type Carbon Nanotube Thin-Film Transistors Chemically Doped With Poly(ethylene imine). Jpn. J. Appl. Phys. 2014, 53, 05FD01; (e) Lu, C. Fu, Q. Huang, S. Liu, J. Polymer Electrolyte-Gated Carbon Nanotube Field-Effect Transistor. Nano Lett. 2004, 4, 623; (f) Siddons, G. P. Merchin, D. Back, J. H. Jeong, J. K. Shim, M. Highly Efficient Gating and Doping of Carbon Nanotubes with Polymer Electrolytes. Nano Lett. 2004, 4, 927; (g) Aikawa, S. Einarsson, E. Thurakitseree, T. Chiashi, S.

Nishikawa, E. Maruyama, S. Deformable Transparent All-Carbon-Nanotube Transistors. Appl. Phys. Lett. 2012, 100, 063502.
[31] (a) Aguirre, C. M. Levesque, P. L. Paillet, M. Lapointe, F. St-Antoine, B. C. Desjardins, P. Martel, R. The Role of the Oxygen/Water Redox Couple in Suppressing Electron Conduction in Field-Effect Transistors. Adv. Mater. 2009, 21, 3087; (b) Li, Z. Ding, J. Guo, C. Lefebvre, J. Malenfant, P. R. L. Decomposable s-Tetrazine Copolymer Enables Single-Walled Carbon Nanotube Thin Film Transistors and Sensors with Improved Sensitivity. Adv. Funct. Mater, 2018, 1705568; (c) Li, Z. Ding, J. Lefebvre, J. Malenfant, P. R. L. Dopant-Modulated Conjugated Polymer Enrichment of Semiconducting SWCNTs. ACS Omega, 2018, 3, 3413.
[32] Kadajji, V. G. Betageri, G. V. Water Soluble Polymers for Pharmaceutical Applications. Polymers, 2011, 3, 1972.
[33] Gomulya, W. Costanzo, G. D. Carvalho, E. J. F. Bisri, S. Z. Derenskyi, V. Fritsch, M. Fröhlich, N. Allard, S. Gordiichuk, P. Herrmann, A. Marrink, S. J. Santos, M. C. Scherf, U. Loi, M. A. Semiconducting Single-Walled Carbon Nanotubes on Demand by Polymer Wrapping. Adv. Mater. 2013, 25, 2948.
[34] Xu, Q. Zhao, J. Pecunia, V. Xu, W. Zhou, C. Dou, J. Gu, W. Lin, J. Mo, L. Zhao, Y. Cui, Z. Selective Conversion from p-Type to n-Type of Printed Bottom-Gate Carbon Nanotube Thin-Film Transistors and Application in Complementary Metal-Oxide-Semiconductor Inverters. ACS Appl. Mater. Interfaces 2017, 9, 12750.
[35] Lefebvre, J. Ding, J. Li, Z. Cheng, F. Du, N. Malenfant, P. R. L. Hysteresis Free Carbon Nanotube Thin Film Transistors Comprising Hydrophobic Dielectrics. Appl. Phys. Lett. 2015, 107, 243301.
[36] (a) Zhou, Y. et al. p-Channel, n-channel thin film transistors and p-n diodes based on single wall carbon nanotube networks. Nano Lett. 4, 2031-2035 (2004); (b) Biswas, C.; Lee, S. Y.; Ly, T. H.; Ghosh, A.; Dang, Q. N.; Lee, Y. H. Chemically Doped Random Network Carbon Nanotube P-n Junction Diode for Rectifier. *ACS Nano* 2011, 5 (12), 9817-9823. https://doi.org/10.1021/nn203391h.
[37] Diaz, A. F.; Felix-Navarro, R. M. A Semi-Quantitative Tribo-Electric Series for Polymeric Materials: The Influence of Chemical Structure and Properties. *J. Electrostat.* 2004, 62, 277-290.
[38] Cataldo, F. A Revision of the Gutmann Donor Numbers of a Series of Phosphoramides Including Tepa. *Eur. Chem. Bull* 2015, 4 (2), 92-97. https://doi.org/10.17628/ECB.2015.4.92.
[39] Fowkes, F. M. Quantitative Characterization of the Acid-Base Properties of Solvents, Polymers, and Inorganic Surfaces. *J. Adhes. Sci. Technol.* 1990, 4 (1), 669-691. https://doi.org/10.1163/156856190X00595.

TABLE 1

Conditions for preparation of solutions

| Polymer | Solvent | Concentration (% w/V) | Filtered 0.45 μm PTFE? |
|---|---|---|---|
| PVdF | DMF | 10 | No |
| PS | Chloroform | 15 | Yes |
| PMMA | Chloroform | 15 | Yes |
| P2VP | Chloroform | 15 | Yes |
| Teflon AF | As is | As is | No |
| Nylon 6-6 | m-Cresol | 5 | No |
| PC | Chloroform | 10 | No |
| Spin-on-glass | As is | As is | No |

TABLE 1-continued

Conditions for preparation of solutions

| Polymer | Solvent | Concentration (% w/V) | Filtered 0.45 μm PTFE? |
|---|---|---|---|
| P(VdC-co-MA) | NMP | 10 | No |
| PVAc | DMF | 15 | No |
| Cellulose acetate | DMF | 7.5 | No |
| Cellulose nitrate | Diethyl ether/ethanol | 1:2 collodion:ethanol | No |
| PS/P2VP blends | Chloroform | 15 | Yes |
| PVAc/PMMA blends | Chloroform | Varying from 15 to 5 | No |
| P(S-co-2VP) copolymers | Chloroform | 15 | No |

TABLE 2

Conditions for spin coating

| Polymer | Stage 1 Time (sec) | Stage 1 Speed (rpm) | Stage 2 Time (sec) | Stage 2 Speed (rpm) | Bake 1 | Bake 2 |
|---|---|---|---|---|---|---|
| PVdF[1] | 9 | 500 | 30 | 1000 | 180° C., 5 min | |
| PS | 9 | 800 | 30 | 3000 | 120° C., 5 min | |
| PMMA | 9 | 800 | 30 | 3000 | 158° C., 5 min | |
| P2VP | 9 | 800 | 30 | 3000 | 125° C., 5 min | |
| Teflon AF | | | 60 | 1000 | 140° C., 1 min | |
| Nylon 6-6 | 9 | 500 | 30 | 2000 | 150° C., 5 min | |
| PC | 9 | 800 | 30 | 3000 | 150° C., 5 min | |
| Spin-on-glass[2] | 10 | 500 | 30 | 1000 | Ramp up from 50 to 100° C. in 10 min | Dwell at 140° C. for 20 min |
| P(VdC-co-MA)[3] | 9 | 600 | 20 | 2400 | 60° C., 2 min | Vacuum, overnight, 60° C. |
| PVAc[3] | 9 | 600 | 30 | 700 | 150° C., 2 min | |
| Cellulose acetate | 9 | 600 | 30 | 2400 | 150° C., 2 min | |
| Cellulose nitrate | 18 | 900 | 30 | 4800 | 150° C., 2 min | |
| PS/P2VP blends | 9 | 800 | 30 | 3000 | 125° C., 5 min | |
| PVAC/PMMA blends | 9 | 800 | 30 | 3000 | 50° C., 5 min | Vacuum overnight, 40° C. |
| P(S-co-2VP) | 9 | 800 | 30 | 3000 | 125° C., 5 min | |

[1]Quenched in cold water after bake.
[2]Cooled down slowly on the hot plate.
[3]During stage 2, heat gun was applied at 180° F. with fan at Hi setting.

TABLE 3

List of dielectrics tested for the threshold voltage-charge relationship and their relative permittivity values.

| Dielectric | Abbreviation | $\varepsilon_r$ | Dielectric | Abbreviation | $\varepsilon_r$ |
|---|---|---|---|---|---|
| Poly(methyl metacrylate) | PMMA | 3.12 | Poly (vinylidene chloride- | P(VdC-co-MA) | 3.9 |

TABLE 3-continued

List of dielectrics tested for the threshold voltage-charge relationship and their relative permittivity values.

| Dielectric | Abbreviation | $\varepsilon_r$ | Dielectric | Abbreviation | $\varepsilon_r$ |
|---|---|---|---|---|---|
| Polycarbonate | PC | 2.9 | Poly(vinylidene fluoride)-co-methyl acrylate) Poly(vinylidene fluoride) | PVdF | 7.5 |
| Nylon 6-6 | — | 7.5 | Cellulose acetate | CAC | 7 |
| Cellulose nitrate | NC | 6.4 | Polystyrene | PS* | 2.6 |
| Poly(vinyl acetate) | PVAc | 3.5 | Spin-on-glass | SOG | 3.5 |
| Teflon AF | — | 1.9 | Poly(2-vinyl pyridine) | P2VP* | 4.6 |
| Polystyrene/poly(2-vinyl pyridine) blend 15% w/w | PS-P2VP 15% | 2.9 | Poly(styrene-co-2-vinyl pyridine) 11.5% 2VP mol | P(S-co-2VP) 11.5% | 2.8 |
| Polystyrene/poly(2-vinyl pyridine) blend 30% w/w | PS-P2VP 30% | 3.2 | Poly(styrene-co-2-vinyl pyridine) 25% 2VP mol | P(S-co-2VP) 25% | 3.1 |
| Polystyrene/poly(2-vinyl pyridine) blend 50% w/w | PS-P2VP 50% | 3.6 | Poly(styrene-co-2-vinyl pyridine) 44% 2VP mol | P(S-co-2VP) 44% | 4.5 |
| Polystyrene/poly(2-vinyl pyridine) blend 70% w/W | PS-P2VP 70% | 4.0 | Poly(styrene-co-2-vinyl pyridine) 70% 2VP mol | P(S-co-2VP) 70% | 4.0 |
| Polystyrene/poly(2-vinyl pyridine) blend 85% w/w | PS-P2VP 85% | 4.3 | | | |

*Two samples prepared at different times.

The invention claimed is:

1. A thin film transistor comprising:
a source electrode, a drain electrode and a gate electrode;
a semiconducting channel comprising a network of carbon nanotubes, the carbon nanotubes electrically coupled to the source electrode and drain electrode and electrically insulated from, but capacitively coupled to, the gate electrode; and
a polymeric layer encapsulating the carbon nanotubes, the polymeric layer comprising a first monomeric unit and optionally a second monomeric unit, wherein the first monomeric unit, the second monomeric unit and the relative amounts thereof are selected to provide at least one target electrical property of the thin film transistor, wherein the polymeric layer has a thickness of greater than about 2 μm.

2. The thin film transistor of claim 1, wherein the first monomeric unit is 2-vinylpyridine, acrylic acid or a glucopyranose in which at least a portion of the hydrogens of the hydroxyl groups are replaced with —CH$_2$C(O)ONa.

3. The thin film transistor of claim 2, wherein as between the first monomeric unit and the second monomeric unit only the first monomeric unit is present, and the polymeric layer comprises poly(2-vinylpyridine), poly(acrylic acid) or sodium carboxymethyl cellulose.

4. The thin film transistor of claim 1, wherein as between the first monomeric unit and the second monomeric unit, only the first monomeric unit is present, and the polymeric layer comprises poly(2-vinylpyridine).

5. The thin film transistor of claim 1, wherein the first monomeric unit is vinyl acetate, the second monomeric unit is methyl methacrylate and the polymer layer comprises a blend of poly(vinyl acetate) and poly(methyl methacrylate).

6. The thin film transistor of claim 1, wherein the first monomeric unit is vinyl alcohol, the second monomeric unit is ethylenimine and the polymeric layer comprises a blend of poly(vinyl alcohol) and polyethylenimine.

7. The thin film transistor of claim 1, wherein the polymeric layer further comprises an n-type dopant.

8. The thin film transistor of claim 1, wherein the semiconducting channel further comprises an n-type dopant.

9. The thin film transistor of claim 1, wherein the first monomeric unit is acrylic acid, the second monomeric unit is vinyl alcohol and the polymeric layer comprises a blend of poly(acrylic acid) and poly(vinyl alcohol).

10. The thin film transistor of claim 1, wherein the carbon nanotubes are complexed with a conjugated polymer.

11. The thin film transistor of claim 10, wherein the carbon nanotubes are complexed with poly(9,9-di-n-dodecylfluorene).

12. The thin film transistor of claim 1, wherein the source and drain electrodes comprise metallic gold.

13. A method for manufacturing a thin film transistor, the method comprising:
assembling a source electrode, a drain electrode, a gate electrode and a semiconducting channel comprising a network of carbon nanotubes, such that the carbon nanotubes are electrically coupled to the source electrode and drain electrode and electrically insulated from, but capacitively coupled to, the gate electrode; and
encapsulating the carbon nanotubes with a polymeric layer, the polymeric layer comprising a first monomeric unit and optionally a second monomeric unit, wherein the first monomeric unit, the second monomeric unit and relative amounts thereof are selected to provide at least one target electrical property of the thin film transistor,
wherein the polymeric layer has a thickness of greater than about 2 μm.

14. The method of claim 13, wherein the carbon nanotubes are encapsulated with the polymeric layer by a method comprising spin coating, drop casting or printing a solution comprising the first monomeric unit and optionally the second monomeric unit over the network of carbon nanotubes.

15. The method of claim 13, wherein the first monomeric unit is 2-vinylpyridine, acrylic acid or a glucopyranose in which at least a portion of the hydrogens of the hydroxyl groups are replaced with —CH$_2$C(O)ONa.

16. The method of claim 15, wherein as between the first monomeric unit and the second monomeric unit, only the first monomeric unit is present, and the polymeric layer comprises poly(2-vinylpyridine), poly(acrylic acid) or sodium carboxymethyl cellulose.

17. The method of claim 13, wherein the first monomeric unit is vinyl acetate, the second monomeric unit is methyl methacrylate and the polymer layer comprises a blend of poly(vinyl acetate) and poly(methyl methacrylate).

18. The method of claim 13, wherein the first monomeric unit is vinyl alcohol, the second monomeric unit is ethylenimine and the polymeric layer comprises a blend of poly(vinyl alcohol) and polyethylenimine.

19. The method of claim 14, wherein the solution further comprises an n-type dopant.

20. The method of claim 13, wherein the method further comprises depositing a solution comprising an n-type dopant on the semiconducting channel prior to encapsulation.

21. The method of claim 13, wherein the first monomeric unit is acrylic acid, the second monomeric unit is vinyl alcohol and the polymeric layer comprises a blend of poly(acrylic acid) and poly(vinyl alcohol).

22. The method of claim 13, wherein prior to assembly, the carbon nanotubes are complexed with a conjugated polymer.

23. The method of claim 13, wherein the source and drain electrodes comprise metallic gold.

* * * * *